(12) United States Patent
Jung et al.

(10) Patent No.: US 11,844,237 B2
(45) Date of Patent: Dec. 12, 2023

(54) DISPLAY DEVICE, MASK FRAME, AND APPARATUS AND METHOD OF MANUFACTURING THE DISPLAY DEVICE

(71) Applicant: Samsung Display Co., Ltd., Yongin-si (KR)

(72) Inventors: Eunjoung Jung, Yongin-si (KR); Sanghoon Kim, Yongin-si (KR); Jongsung Park, Yongin-si (KR); Sangshin Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 228 days.

(21) Appl. No.: 17/175,687

(22) Filed: Feb. 14, 2021

(65) Prior Publication Data

US 2021/0359025 A1     Nov. 18, 2021

(30) Foreign Application Priority Data

May 15, 2020  (KR) ......................... 10-2020-0058363

(51) Int. Cl.
*H10K 59/121* (2023.01)
*C23C 14/04* (2006.01)
(Continued)

(52) U.S. Cl.
CPC ......... *H10K 59/121* (2023.02); *C23C 14/042* (2013.01); *H10K 50/822* (2023.02);
(Continued)

(58) Field of Classification Search
None
See application file for complete search history.

(56) References Cited

U.S. PATENT DOCUMENTS 11,217,639 B2   1/2022  Baek et al.
11,450,718 B2 * 9/2022  Jo ........................ H10K 59/122
(Continued)

FOREIGN PATENT DOCUMENTS

CN     110993662    4/2020
EP     3629376      4/2020
(Continued)

OTHER PUBLICATIONS

European Search Report dated Jun. 24, 2022, issued to European Patent Application No. 21173964.4.

*Primary Examiner* — Michelle Mandala
(74) *Attorney, Agent, or Firm* — H.C. Park & Associates, PLC

(57) ABSTRACT

A display device includes: a substrate having a component area, a main display area, and a peripheral area, the peripheral area surrounding the component area and the main display area; an auxiliary pixel group disposed in the component area and including an auxiliary subpixel pixel electrode, an auxiliary subpixel intermediate layer, and an auxiliary subpixel opposite electrode; and a main pixel group disposed in the main display area and including a main subpixel pixel electrode, a main subpixel intermediate layer, and a main subpixel opposite electrode, wherein the auxiliary subpixel opposite electrode extends in the component area to have a stripe shape and is connected to the main subpixel opposite electrode in the main display area.

6 Claims, 39 Drawing Sheets

(51) Int. Cl.
  *H10K 50/822*   (2023.01)
  *H10K 59/65*    (2023.01)
  *H10K 71/00*    (2023.01)
  *H10K 71/16*    (2023.01)
  *H10K 59/12*    (2023.01)

(52) U.S. Cl.
  CPC .............. *H10K 59/65* (2023.02); *H10K 71/00* (2023.02); *H10K 71/164* (2023.02); *H10K 71/166* (2023.02); *H10K 71/621* (2023.02); *H10K 59/1201* (2023.02)

(56) References Cited

U.S. PATENT DOCUMENTS

| | | |
|---|---|---|
| 2010/0129617 A1 | 5/2010 | Corrigan |
| 2013/0208017 A1 | 8/2013 | Gu et al. |
| 2016/0312354 A1 | 10/2016 | Ko et al. |
| 2020/0035923 A1 | 1/2020 | Kawasaki et al. |
| 2020/0144530 A1 | 5/2020 | Kim et al. |

FOREIGN PATENT DOCUMENTS

| | | |
|---|---|---|
| JP | 6117881 | 4/2017 |
| KR | 10-0647663 | 11/2006 |
| KR | 10-0761133 | 9/2007 |
| KR | 10-1577221 | 12/2015 |
| KR | 10-1582175 | 1/2016 |
| KR | 10-2019-0058475 | 5/2019 |

* cited by examiner

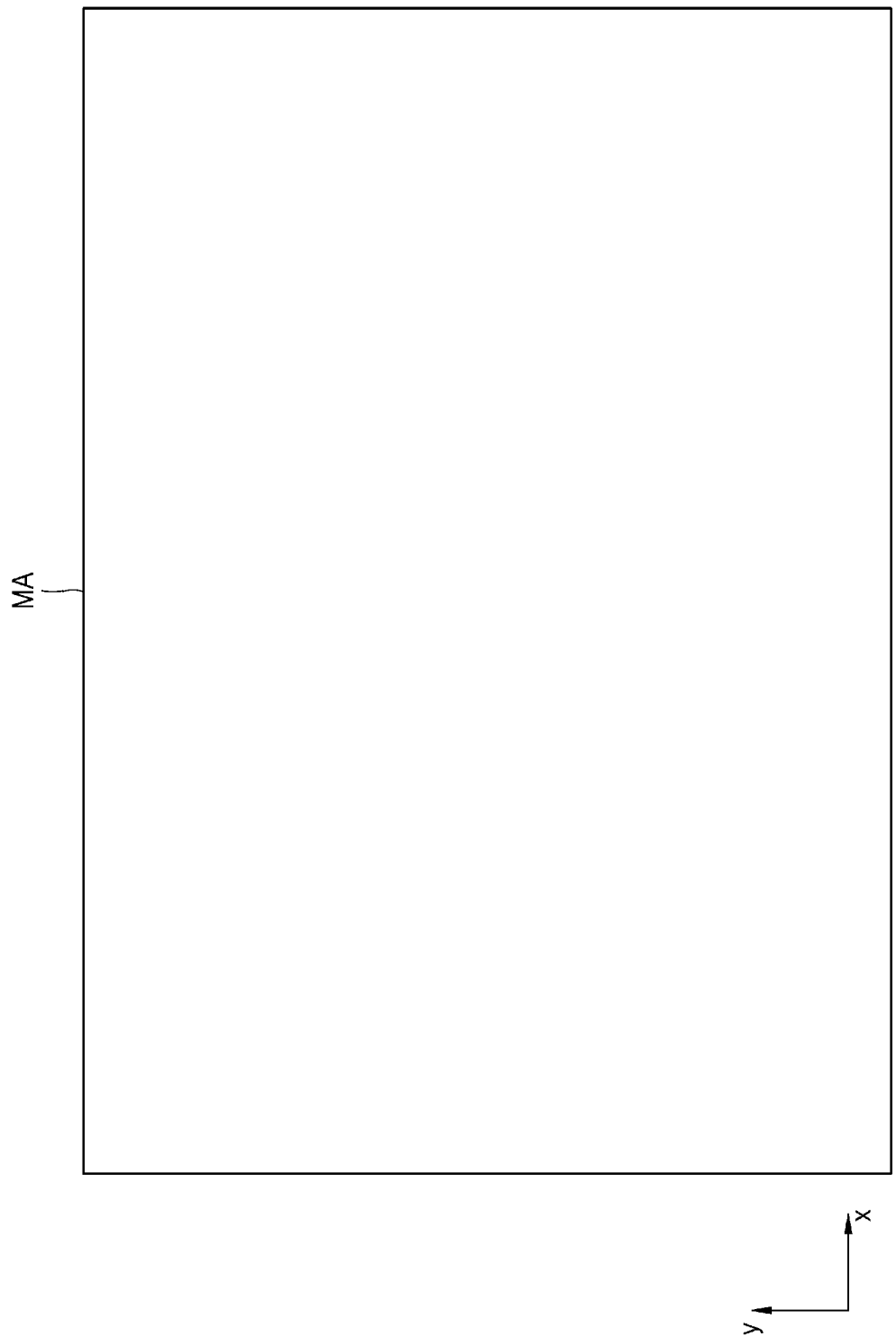

DISPLAY DEVICE, MASK FRAME, AND APPARATUS AND METHOD OF MANUFACTURING THE DISPLAY DEVICE

CROSS REFERENCE TO RELATED APPLICATION

This application claims priority from and the benefit of Korean Patent Application No. 10-2020-0058363, filed on May 15, 2020, which is hereby incorporated by reference for all purposes as if fully set forth herein.

BACKGROUND

Field

Exemplary embodiments/implementations of the invention relate generally to devices and methods, and more specifically, to a display device, a mask assembly, an apparatus for manufacturing the display device, and a method of manufacturing the display device.

Discussion of the Background

Electronic devices based on mobility have come into widespread use. Recently, tablet personal computers (PCs), in addition to small-sized electronic devices such as mobile phones, have been widely used as mobile electronic devices.

In order to support various functions, the mobile electronic devices include a display device for providing a user with visual information such as images or videos. Recently, as components for driving such display devices have been miniaturized, the proportion occupied by display devices in electronic devices is gradually increasing. Moreover, a structure that may be curved to have a preset angle from a flat state has been developed.

Such a display device may include various components arranged on a lower surface of a display panel. An area of the display panel where a component is arranged may have a different resolution from other areas of the display panel where a component is not arranged. In this case, when a transmission area is arranged in the area of display panel where the component is arranged and having the different resolution, the transmission area needs to be maximally secured so as not to impede operation of the component.

The above information disclosed in this Background section is only for understanding of the background of the inventive concepts, and, therefore, it may contain information that does not constitute prior art.

SUMMARY

Applicant has discovered that in order to increase resolution of a display device and accurately form a transmission area, some of a plurality of layers need to be formed in precise patterns during the manufacture of a display device. Further, a display device has a component area in which components are arranged, and the component area includes a transmission area for increasing light transmittance and/or sound transmittance. In this case, Applicant has discovered that an auxiliary subpixel opposite electrode of a display element of the display device in the component area may reduce the light transmittance and/or sound transmittance thereof.

Display devices constructed according to the principles and exemplary implementations of the invention have a precise pattern. For example, the display devices according to the exemplary embodiments may have the component area with high light transmittance and/or high sound transmittance by precisely patterning the auxiliary subpixel opposite electrode of the display element of the display devices.

Apparatus including a mask assembly for manufacturing the display device constructed according to the principles and exemplary implementations of the invention are capable of manufacturing the display device having a precise pattern. For example, the display device may have the component area with high light transmittance and/or high sound transmittance by precisely patterning the auxiliary subpixel opposite electrode of the display element of the display devices.

Methods of manufacturing the display device according to the principles of the invention are capable for increasing the light transmittance and/or the high sound transmittance thereof by precisely patterning the auxiliary subpixel opposite electrode of the display element of the display devices.

Additional features of the inventive concepts will be set forth in the description which follows, and in part will be apparent from the description, or may be learned by practice of the inventive concepts.

According to an aspect of the invention, a display device includes: a substrate having a component area, a main display area, and a peripheral area, the peripheral area surrounding the component area and the main display area; an auxiliary pixel group disposed in the component area and including an auxiliary subpixel pixel electrode, an auxiliary subpixel intermediate layer, and an auxiliary subpixel opposite electrode; and a main pixel group disposed in the main display area and including a main subpixel pixel electrode, a main subpixel intermediate layer, and a main subpixel opposite electrode, wherein the auxiliary subpixel opposite electrode extends in the component area to have a stripe shape and is connected to the main subpixel opposite electrode in the main display area.

The auxiliary subpixel pixel electrode may include a plurality of auxiliary subpixel opposite electrodes in the component area, and wherein the plurality of auxiliary subpixel opposite electrodes may be spaced apart from each other in a first direction and may extend in a second direction intersecting the first direction.

The auxiliary subpixel pixel electrode may include a plurality of auxiliary subpixel pixel electrodes, and the auxiliary subpixel intermediate layer may include a plurality of auxiliary subpixel intermediate layers, and wherein: the plurality of auxiliary subpixel pixel electrodes may be spaced apart from each other in a lengthwise direction of the auxiliary subpixel opposite electrode, and the plurality of auxiliary subpixel intermediate layers may be spaced apart from each other in the lengthwise direction of the auxiliary subpixel opposite electrode.

The component area may be surrounded by the main display area and the peripheral area, and the auxiliary subpixel opposite electrode may extend in a direction from the peripheral area to the main display area.

The component area includes a transmission area, and the auxiliary subpixel opposite electrode exposes the transmission area.

The auxiliary subpixel pixel electrode may include a plurality of auxiliary subpixel opposite electrodes in the component area, and a width of each of the plurality of auxiliary subpixel opposite electrodes may be greater than a gap between adjacent auxiliary subpixel opposite electrodes.

According to another aspect of the invention, a mask assembly includes: a mask frame including a frame opening; and a mask sheet disposed on the mask frame, and wherein the mask sheet includes: a sheet body portion including at least one first opening overlapping the frame opening of the mask frame; and a sheet shielding portion connected to the sheet body portion, disposed within the at least one first opening, and including a second opening having a slit shape.

The sheet shielding portion may be connected to the sheet body portion to protrude from the sheet body portion to the at least one first opening of the sheet body portion.

The mask sheet may further include a sheet connection member configured to connect the sheet body portion to the sheet shielding portion.

The second opening of the sheet shielding portion may include a plurality of second openings, and wherein: the sheet shielding portion may include a sheet shielding rib disposed between adjacent second openings, and a width of each of the second openings may be greater than a width of the sheet shielding rib.

According to another aspect of the invention, a mask assembly including: a mask frame including a frame opening; and a stick disposed on the mask frame in one of a first direction and a second direction and configured to split the frame opening into at least two openings, wherein the stick includes: a stick body portion disposed on the mask frame; and a stick shielding portion connected to the stick body portion, disposed within the frame opening of the mask frame, and including a stick opening.

The stick shielding portion may be directly connected to the stick body portion.

The stick further may include a stick connection member configured to connect the stick body portion to the stick shielding portion.

The stick opening may have a slit shape.

The stick opening may include a plurality of stick openings, and wherein: the stick shielding portion may include a stick shielding rib disposed between adjacent stick openings, and a width of each of the stick openings may be greater than a width of the stick shielding rib.

According to another aspect of the invention, an apparatus for manufacturing a display device, the apparatus including: a chamber in which a substrate is disposed; a mask assembly disposed within the chamber to face the substrate; and a deposition source disposed within the chamber to face the mask assembly and configured to provide a deposition material to the substrate, wherein the mask assembly includes: a mask frame including a frame opening; and a mask sheet disposed on the mask frame, and wherein the mask sheet includes: a sheet body portion including at least one first opening overlapping to the frame opening of the mask frame; and a sheet shielding portion connected to the sheet body portion, disposed within the at least one first opening, and including a second opening having a slit shape.

The sheet shielding portion may be connected to the sheet body portion to protrude from the sheet body portion to the at least one first opening of the sheet body portion.

The mask sheet may further include a sheet connection member configured to connect the sheet body portion to the sheet shielding portion.

The second opening may include a plurality of second openings, and wherein: the sheet shielding portion may include a sheet shielding rib disposed between adjacent second openings, and a width of each of the second openings may be greater than a width of the sheet shielding rib.

According to another aspect of the invention, an apparatus for manufacturing a display device, the apparatus including: a chamber in which a substrate is disposed; a mask assembly disposed within the chamber to face the substrate; and a deposition source disposed within the chamber to face the mask assembly and configured to provide a deposition material to the substrate, wherein the mask assembly includes: a mask frame including a frame opening; and a stick disposed on the mask frame in one of a first direction and a second direction and configured to split the frame opening into at least two openings, wherein the stick includes: a stick body portion disposed on the mask frame; and a stick shielding portion connected to the stick body portion, disposed within the frame opening, and including a stick opening.

The stick shielding portion may be directly connected to the stick body portion.

The stick further may include a stick connection member configured to connect the stick body portion to the stick shielding portion.

The stick opening may have a slit shape.

The stick opening may be a plurality of stick openings, and wherein: the stick shielding portion may include a stick shielding rib disposed between adjacent stick openings, and a width of each of the stick openings may be greater than a width of the stick shielding rib.

According to another aspect of the invention, a method of manufacturing a display device, the method including the steps of: forming an auxiliary subpixel pixel electrode in a component area of a substrate and a main subpixel pixel electrode in a main display area of the substrate; forming an auxiliary subpixel intermediate layer on the auxiliary subpixel pixel electrode of the component area and a main subpixel intermediate layer on the main subpixel pixel electrode of the main display area; and forming an auxiliary subpixel opposite electrode on the auxiliary subpixel intermediate layer and a main subpixel opposite electrode on the main subpixel intermediate layer, wherein the auxiliary subpixel opposite electrode is connected to the main subpixel opposite electrode.

The auxiliary subpixel opposite electrode may have a stripe shape and is disposed in the component area.

The substrate may include a peripheral area surrounding the component area and the main display area, and the auxiliary subpixel opposite electrode may extend to a rim of the peripheral area.

A width of the auxiliary subpixel opposite electrode may be greater than a gap between adjacent auxiliary subpixel opposite electrodes.

According to another aspect of the invention, a method of manufacturing a display device, the method including the steps of: providing a base member; forming a sheet body portion, a sheet shielding portion protruding from the sheet body portion, and at least one first opening in the sheet body portion, by partially removing the base member to remain a rim of the base member and a portion of the base member protruding from the rim of the base member; and manufacturing a mask sheet by forming a second opening in the sheet shielding portion, the second opening having the form of a stripe.

The second opening may be formed by removing a portion of the sheet shielding portion by irradiating a laser to the sheet shielding portion.

The second opening may include a plurality of second openings, and a width of each of the second openings is smaller than a width between adjacent second openings.

The method may further include the steps of: providing a mask frame including a frame opening; and stretching the mask sheet by a tensile force and disposing the stretched mask sheet to overlap the mask frame.

According to another aspect of the invention, a method of manufacturing a display device, the method including the steps of: manufacturing a stick body portion on a base member and a stick shielding portion protruding from the stick body portion; and manufacturing a stick by forming at least one stick opening by irradiating a laser to the stick body portion.

The method may further include the steps of: manufacturing a mask frame including a frame opening; disposing the stick on the mask frame such that the stick extends to cover the frame opening; and fixing the stick to the mask frame.

The stick opening may have a stripe shape.

These general and specific embodiments may be implemented by using a system, a method, a computer program, or a combination thereof.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIGS. 20A, 20B, and 20C are plan views for describing a method of manufacturing a mask sheet of FIG. 19.

DETAILED DESCRIPTION

Figure 1:
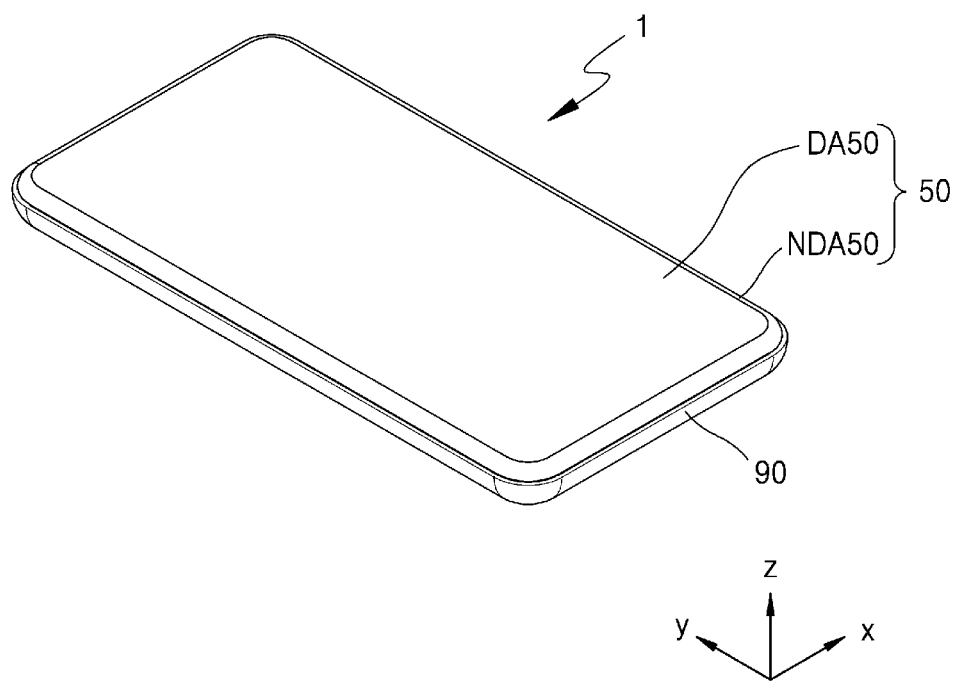
FIG. 1 is a perspective view of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the x-axis, the y-axis, and the z-axis are not limited to three axes of a rectangular coordinate system, such as the x, y, and z-axes, and may be interpreted in a broader sense. For example, the x-axis, the y-axis, and the x-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (e.g., optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
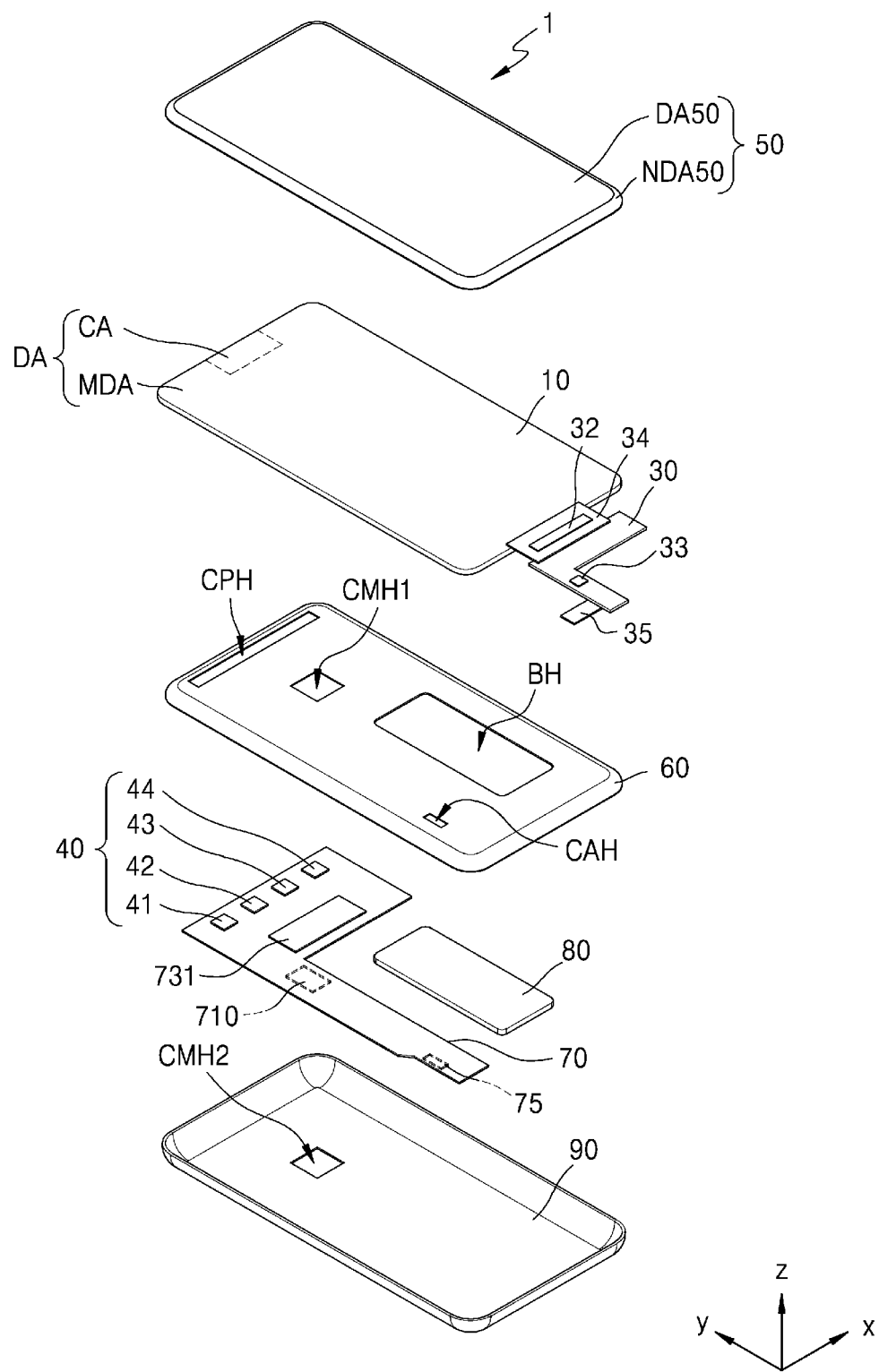
FIG. 2 is an exploded perspective view of the display device of FIG. 1.

FIG. 1 is a perspective view of an exemplary embodiment of a display device constructed according to the principles of the invention. FIG. 2 is an exploded perspective view of the display device of FIG. 1.

Referring to FIGS. 1 and 2, a display device 1 according to an exemplary embodiment displays a moving image or a still image, and thus may be used as the display screens of various products such as not only portable electronic apparatuses, such as mobile phones, smartphones, tablet personal computers (PCs), mobile communication terminals, electronic notebooks, electronic books, portable multimedia players (PMPs), navigation devices, and ultra mobile PCs (UMPCs) but also televisions, notebooks, monitors, advertisement panels, and internet of things (IoT) devices. The display device 1 according to an exemplary embodiment may also be used in wearable devices such as smart watches, watch phones, glasses-type displays, and head mounted displays (HMDs). The display device 1 according to an exemplary embodiment may also be used as dashboards of automobiles, center information displays (CIDs) of the center fasciae or dashboards of automobiles, room mirror displays that replace the side mirrors of automobiles, and displays arranged on the rear sides of front seats to serve as entertainment devices for back seat passengers of automobiles.

For descriptive convenience, FIGS. 1 and 2 illustrate use of a smartphone as the display device 1 according to an exemplary embodiment. The display device 1 according to an exemplary embodiment includes a cover window 50, a display panel 10, a display circuit board 30, a display driving unit 32, a touch sensor driving unit 33, a bracket 60, a main circuit board 70, a battery 80, and a lower cover 90.

The term "above" indicates a direction in which the cover window 50 is arranged in relation to the display panel 10, namely, a +z direction, and the term "below" indicates a direction in which the lower cover 90 is arranged in relation to the display panel 10, namely, a, −z direction. The terms "left," "right," "upper," and "lower" indicate directions when the display panel 10 is viewed from the top. For example, "left" indicates a −x direction, "right" indicates a +x direction, "upper" indicates a +y direction, and "lower" indicates a −y direction.

The display device 1 may have a rectangular shape in a plan view. For example, the display device 1 may have a rectangular planar shape having shorter sides in a first direction (e.g., x direction) and longer sides in a second direction (e.g., y direction), as shown in FIG. 1. Corners between the shorter sides in the first direction (e.g., x direction) and the longer sides in the second direction (e.g., y direction) may be rounded to have a certain curvature, or may have right angles. However, exemplary embodiments are not limited thereto. For example, the shape of the display device 1 in a plan view may be any other polygon, an oval, or an irregular shape.

The cover window 50 may be above the display panel 10 to cover an upper surface of the display panel 10. Thus, the cover window 50 may function to protect the upper surface of the display panel 10.

The cover window 50 may include a transmission cover unit DA50 corresponding to the display panel 10, and a light-shielding cover unit NDA50 corresponding to an area other than the display panel 10. The light-shielding cover unit NDA50 may include an opaque material that shields light. The light-shielding cover unit NDA50 may include a pattern that may be shown to a user when no images are displayed.

The display panel 10 may be below the cover window 50. The display panel 10 may be overlapped by the transmission cover unit DA50 of the cover window 50.

The display panel 10 includes a main display area MDA and a component area CA. Both the main display area MDA and the component area CA are areas where an image is displayed, and the component area CA may be an area below which a component 40 such as a sensor sensing visible light, infrared light, sound, or the like, and a camera is arranged. According to an exemplary embodiment, the component area CA may have a higher light transmittance e and/or a higher sound transmittance than the main display area MDA. According to an exemplary embodiment, when light is transmitted through the component area CA, a light transmittance in the component area CA may be about 25% or greater or about 30% or greater, for example, about 50% or greater, about 75% or greater, about 80% or greater, about 85% or greater, or about 90% or greater.

The display panel 10 may be a light-emitting display panel including a light-emitting element. For example, the display panel 10 may be an organic light-emitting display panel including an organic light-emitting diode with an organic emission layer, a micro light-emitting diode (LED) display panel including a micro LED, a quantum dot light-emitting display panel including a quantum dot LED with a quantum dot emission layer, or an inorganic light-emitting display panel including an inorganic light-emitting element with an inorganic semiconductor.

The display panel 10 may be a rigid display panel having rigidity and thus not being easily bent, or a flexible display panel having flexibility and thus being easily bent, folded, or rolled. For example, the display panel 10 may be a foldable display panel, a curved display panel having a curved display surface, a bent display panel of which an area other than a display surface is bent, a rollable display panel, or a stretchable display panel.

The display panel 10 may be a transparent display panel that transmits light so that an object or a background arranged on the lower surface of the display panel 10 may be seen through the upper surface of the display panel 10. Alternatively, the display panel 10 may be a reflective display panel capable of reflecting an object or a background on the upper surface of the display panel 10.

A first flexible film 34 may be attached to an edge of the display panel 10. One side of the first flexible film 34 may be attached to an edge of the display panel 10 through an anisotropic conductive film. The first flexible film 34 may be a flexible film that is bendable.

The display driving unit 32 may be on the first flexible film 34. The display driving unit 32 may receive control signals and power supply voltages and generate output signals and voltages for driving the display panel 10. The display driving unit 32 may be an integrated circuit (IC).

The display circuit board 30 may be attached on another side of the first flexible film 34. The other side of the first flexible film 34 may be attached to an upper surface of the display circuit board 30 through an anisotropic conductive film. The display circuit board 30 may be a flexible printed circuit board (FPCB) that is bendable, a rigid printed circuit board (PCB) that has rigidity and thus is not easily bent, or a complex PCB including both a rigid PCB and an FPCB.

The touch sensor driving unit 33 may be on the display circuit board 30. The touch sensor driving unit 33 may be implemented as an IC. The touch sensor driving unit 33 may be attached to the upper surface of the display driving unit 30. The touch sensor driving unit 33 may be electrically connected to touch electrodes of a touch screen layer of the display panel 10 via the display circuit board 30.

The touch screen layer of the display panel 10 may sense a touch input of a user by at least one of several touch methods such as a resistance film method and a capacitive method. For example, when the touch screen layer of the display panel 10 senses a touch input of a user by a capacitive method, the touch sensor driving unit 33 may apply driving signals to driving electrodes from among the touch electrodes and sense voltages charged in a mutual capacitance between sensing electrodes from among the touch electrodes and the driving electrodes via the sensing electrodes, thereby determining whether there is a touch of a user. The touch of the user may include a contact touch and a proximity touch. The contact touch indicates that a finger of a user or an object such as a pen directly touches the cover window 50 arranged on the touch screen layer. The proximity touch indicates that a finger of a user or an object such as a pen is located over the cover window 50 at a close distance from the cover window 50, such as hovering. The touch sensor driving unit 33 may transmit sensor data to a main processor 710 according to the sensed voltages, and the main processor 710 may calculate a touch coordinate at which a touch is input, by analyzing the sensor data.

A power supplier for supplying driving voltages for driving the pixels of the display panel 10, a scan driving unit, and the display driving unit 32 may be additionally arranged on the display circuit board 30. Alternatively, the power supplier may be integrated with the display driving unit 32. In this case, the display driving unit 32 and the power supplier may be implemented as a single IC.

The bracket 60 for supporting the display panel 10 may be below the display panel 10. The bracket 60 may include plastic, metal, or both plastic and metal. The bracket 60 may include a first camera hole CMH1 through which a camera 731 is inserted, a battery hole BH in which the battery 80 is arranged, and a cable hole CAH through which a cable 35 connected to the display circuit board 30 passes. The bracket 60 may also include a component hole CPH that is overlapped by the component area CA of the display panel 10. The component hole CPH may overlap components 40 of the main circuit board 70 in a third direction (e.g., z direction). Accordingly, the component area CA of the display panel 10 may overlap the components 40 of the main circuit board 70 in the third direction (e.g., z direction). The bracket 60 may not include the component hole CPH. In this case, the bracket 60 may be located not to be overlapped by the component area CA of the display panel 10 in the third direction (e.g., z direction).

A plurality of components 40 overlapped by the component area CA of the display panel 10 may be included. For example, first, second, third, and fourth components 41, 42, 43, and 44 may be overlapped by the component area CA. The first, second, third, and fourth components 41, 42, 43, and 44 may be a proximity sensor, an illumination sensor, an iris sensor, and a camera (e.g., an image sensor), respectively. As the component area CA of the display panel 10 includes a certain light transmittance, the proximity sensor using infrared light may detect an object arranged close to the upper surface of the display device 1, and the illumination sensor may sense the brightness of light that is incident upon the upper surface of the display device 1. The iris sensor may image an iris of a person arranged on the upper surface of the display device 1, and the camera may capture an image of an object arranged on the upper surface of the display device 1. The components 40 overlapped by the component area CA of the display panel 10 are not limited to a proximity sensor, an illumination sensor, an iris sensor, and a camera, and may be various other sensors which will be described later.

The main circuit board 70 and the battery 80 may be below the bracket 60. The main circuit board 70 may be a PCB or a FPCB.

The main circuit board 70 may include the main processor 710, the camera 731, a main connector 75, and the components 40. The main processor 710 may be implemented as an IC. The camera 731 may be arranged on both the upper and lower surfaces of the main circuit board 70, and each of the main processor 710 and the main connector 75 may be arranged on one of the upper and lower surfaces of the main circuit board 70.

The main processor 710 may control all functions of the display device 1. For example, the main processor 710 may output digital video data to the display driving unit 32 via the display circuit board 30 so that the display panel 10 displays an image. The main processor 710 receives the sensor data from the touch sensor driving unit 33. The main processor 710 may determine whether there is a user's touch, according to the sensor data, and may execute an operation corresponding to a direct touch or proximity touch of the user. For example, the main processor 710 may calculate the touch coordinate of the user by analyzing the sensor data, and then may execute an application or operation indicated by an icon touched by the user. The main processor 710 may be an application processor, a central processing unit, or a system chip, each which is implemented as an IC.

The camera 731 processes an image frame such as a still image or a moving image obtained by the image sensor in a camera mode, and outputs a result of the processing to the main processor 710. The camera 731 may include at least one of a camera sensor (e.g., a CCD or a CMOS), a photo sensor (e.g., an image sensor), and a laser sensor. The camera 731 may be connected to the image sensor from among the components 40 overlapped by the component area CA, and may process an image input to the image sensor.

The cable 35 that passed through the cable hole CAH of the bracket 60 may be connected to the main connector 75, and accordingly, the main circuit board 70 may be electrically connected to the display circuit board 30.

The main circuit board 70 may further include, in addition to the main processor 710, the camera 731, and the main connector 75, at least one of the components included in a wireless communication interface, at least one of the components included in an input interface, at least one of the components included in a sensor unit, at least one of the components included in an output interface, at least one of the components included in an interface unit, a memory, and a power supplier.

The wireless communication interface may include at least one of a broadcast reception module, a mobile communication module, a wireless internet module, a short-distance communication module, and a position information module.

The broadcast reception module receives a broadcasting signal and/or broadcasting-related information from an external broadcasting management server via a broadcasting channel. The broadcasting channel may be a satellite channel, a ground wave channel, or the like.

The mobile communication module transmits or receives a wireless signal to or from at least one of a base station, an external terminal, and a server on a mobile communication network established according to technology standards or communication methods for mobile communication (e.g., Global System for Mobile communication (GSM), Code Division Multi Access (CDMA), Code Division Multi Access 2000 (CDMA2000), Enhanced Voice-Data Optimized or Enhanced Voice-Data Only (EV-DO), Wideband CDMA (WCDMA), High Speed Downlink Packet Access (HSDPA), High Speed Uplink Packet Access (HSUPA), Long Term Evolution (LTE), and Long Term Evolution-Advanced (LTE-A)). Examples of the wireless signal may include a voice call signal, a video call signal, and various types of data according to text/multimedia messages transception.

The wireless internet module indicates a module for wireless Internet access. The wireless internet module may be configured to transmit or receive a wireless signal in a communication network based on the wireless Internet technologies. The wireless Internet technologies may be, e.g., a Wireless LAN (WLAN), Wireless-Fidelity (Wi-Fi), Wi-Fi Direct, and Digital Living Network Alliance (DLNA).

The short-distance communication module is for short-range communication, and thus may support short-distance communication by at least one technology from among Bluetooth™, Radio Frequency Identification (RFID), Infrared Data Association (IrDA), Ultra Wideband (UWB), Zig-Bee, Near Field Communication (NFC), Wi-Fi, Wi-Fi Direct, and Wireless Universal Serial Bus (Wireless USB). The short-distance communication module may support wireless communication between the display device 1 and a wireless communication system, between the display device 1 and another electronic apparatus, or between the display device 1 and a network where another electronic apparatus (e.g., an external server) is located, through wireless area networks. The wireless area networks may be wireless personal area networks. The other electronic device may be a wearable device capable of exchanging data with (or interoperating with) the display device 1.

The position information module is included to obtain a position (e.g., a current position) of the display device 1, and thus representative examples of the position information module include a global positioning system (GPS) module and a Wi-Fi module. For example, the display device 1 may obtain the position of the display device 1 by a signal sent by a GPS satellite, when using a GPS module. When using a Wi-Fi module, the display device 1 may obtain the position of the display device 1, based on information of a wireless access point (AP) that transmits or receives a wireless signal to or from the Wi-Fi module. Because the position information module is used to obtain the position (e.g., the current position) of the display device 1, the position information module is not limited to a module that directly calculates or obtains the position of the display device 1.

The input interface may include an image input interface such as the camera 731 for inputting an image signal, an audio input interface such as a microphone for inputting an audio signal, and an input device for receiving information from a user.

The camera 731 processes an image frame such as a still image or a moving image obtained by the image sensor in a video call mode or an image capture mode. A processed image frame corresponding to a result of the processing may be displayed on the display panel 10 or may be stored in the memory.

The microphone processes an external audio signal into electrical audio data. The electrical audio data may be used in various ways according to a function currently being performed (or an application currently being executed) in the display device 1. Various noise removal algorithms for removing noise that is generated while receiving the external audio signal may be implemented in the microphone.

The main processor 710 may control an operation of the display device 1 to correspond to information that is input via the input device. The input device may include mechanical input unit such as a button, a dome switch, a jog wheel, and a jog switch, each which is located on a rear or lateral surface of the display device 1, or a touch input unit. The touch input unit may be implemented as the touch screen layer of the display panel 10.

The sensor unit may include at least one sensor that senses at least one of information within the display device 1, information of a surrounding environment of the display device 1, and user information, and generates a sensing signal corresponding to the at least one information. Based on such a sensing signal, the main processor 710 may control driving or operation of the display device 1 or may perform data processing, a function, or an operation associated with an application provided in the display device 1. The sensor unit may include at least one of a proximity sensor, an illumination sensor, an acceleration sensor, a magnetic sensor, a gravity (G)-sensor, a gyroscope sensor, a motion sensor, an RGB sensor, an infrared (IR) sensor, a finger scan sensor, an ultrasonic sensor, an optical sensor, a battery gauge, an environment sensor (e.g., a barometer, a hygrometer, a thermometer, a radiation sensor, a heat sensor, and a gas sensor), and a chemical sensor (e.g., an electronic nose, a healthcare sensor, and a biometric sensor).

The proximity sensor is a sensor that senses the existence of an object that approaches a preset sensing surface or exists near the preset sensing surface, without mechanical contact, by an electromagnetic force or IR rays. Examples of the proximity sensor include a transmission-type photoelectric sensor, a direct reflection-type photoelectric sensor, a mirror reflection-type photoelectric sensor, a high frequency oscillation-type proximity sensor, a capacity-type proximity sensor, a magnetic proximity sensor, and an infrared-type proximity sensor. The proximity sensor may not only sense a proximity touch operation but also may sense a proximity touch pattern such as a proximity touch distance, a proximity touch direction, a proximity touch speed, a proximity touch time, a proximity touch location, or a proximity touch moving state. The main processor 710 may process data (e.g., information) corresponding to the proximity touch operation and the proximity touch pattern both sensed by the proximity sensor, and may control visual information corresponding to the processed data to be displayed on the display panel 10.

The ultrasonic sensor may recognize location information of an object by ultrasonic waves. The main processor 710 may calculate the location of an object from information sensed by an optical sensor and a plurality of ultrasonic sensors. As the speed of light is different from the speed of ultrasonic waves, the location of the object may be calculated using a time when light reaches the optical sensor and a time when ultrasonic waves reach the ultrasonic sensors.

The output interface generates an output associated with sight, hearing, or tactile sense, and thus may include at least one of the display panel 10, an audio output interface, a haptic module, and an optical output interface.

The display panel 10 displays (or outputs) information that is processed by the display device 1. For example, the display panel 10 may display execution screen information of an application being driven by the display device 1, or may display user interface (UI) and graphic user interface (GUI) information based on the execution screen information. The display panel 10 may include a display layer that displays an image, and a touch screen layer that senses a touch input of a user. Accordingly, the display panel 10 may function as the input device providing an input interface between the display device 1 and a user, and also function as the output interface providing an output interface between the display device 1 and the user.

The audio output interface may output audio data received from the wireless communication interface in a call signal reception mode, a call or recording mode, a voice recognition mode, a broadcast reception mode, and the like, or audio data stored in the memory. The audio output interface also outputs an audio signal related with a function performed by the display device 1 (e.g., a call signal receiving sound or a message receiving sound). The audio output interface may include a receiver and a speaker. A least one of the receiver and the speaker may be an audio generation device that is attached to a lower portion of the display panel 10 and vibrates the display panel 10 to output an audio. The audio generation device may be a piezoelectric element or piezoelectric actuator that shrinks and expands according to an electrical signal, or an exciter that generates a magnetic force by a voice coil and vibrates the display panel 10.

The haptic module generates various tactile effects that is recognized by a user. The haptic module may provide a user with vibration as a tactile effect. The intensity, pattern, and the like of vibration generated by the haptic module may be controlled according to a user's selection or settings of the main processor 710. For example, the haptic module may synthesize different vibrations and output a result of the synthesis, or may sequentially output the different vibrations. The haptic module may generate, in addition to vibrations, various other tactile effects such as an effect due to a pin arrangement vertically moving with respect to a skin surface, a jet force or suction force of the air through a nozzle or inlet, grazing of the skin surface, a contact of an electrode, and a stimulus such as an electrostatic force, and an effect due to reproduction of cold and warmth senses by an element capable of heat absorption and heat emission. The haptic module may transmit a tactile effect through direct contact, and may also be implemented such that a user may recognize a tactile effect through a muscle sense such as in a finger or an arm.

The optical output interface outputs a signal for notifying occurrence of an event, by the light of a light source. Examples of the event generated in the display device 1 may include message reception, call signal reception, a missed call, an alarm, schedule notification, e-mail reception, and information reception through an application. The signal output by the optical output interface is implemented by the display device 1 that emits light of a single color or light beams of a plurality of colors to its front surface or rear surface. The outputting of the signal may be terminated when the display device 1 senses that a user confirms an event.

The interface unit serves as a passage with various types of external apparatuses that are connected to the display device 1. The interface unit may include at least one of a wired/wireless headset port, an external charger port, a wired/wireless data port, a memory card port, a port connecting a device including an identification module, an audio input/output (I/O) port, a video I/O port, and an earphone port. When an external apparatus is connected to the interface unit, the display device 1 may perform an appropriate control related with the connected external apparatus.

The memory may store data that supports various functions of the display device 1. The memory may store a plurality of application programs driven by the display device 1, pieces of data for operations of the display device 1, and instructions. At least some of the plurality of application programs may be downloaded from an external server through wireless communication. The memory may store an application for an operation of the main processor 710, and may temporarily store input/output data, for example, a phone book, a message, a still image, and a moving image. The memory 770 may also store haptic data for various patterns of vibration that are provided to the haptic module, and audio data about various sounds that are provided to the audio output interface. The memory may include at least one type of storage medium selected from among a flash memory type, a hard disk type, a solid state disk (SSD) type, a silicon disk drive (SDD) type, a multimedia card micro type, a card type memory (e.g., a secure digital (SD) or extreme digital (XD) memory), a random access memory (RAM), a static random access memory (SRAM), a read-only memory (ROM), an electrically erasable programmable ROM (EEPROM), a programmable ROM (PROM), magnetic memory, a magnetic disk, and an optical disk.

Under the control of the main processor 710, the power supplier receives external power and internal power, and supplies the external and internal power to the components included in the display device 1. The power supplier may include the battery 80. The power supplier includes a connection port as an example of the interface unit to which an external charger for supplying power to charge a battery is electrically connected. Alternatively, the power supplier may be configured to charge the battery 80 in a wireless manner without using a connection port. The battery 80 may receive power from an external wireless power transmission device by at least one of an inductive coupling method based on a magnetic induction phenomenon or a magnetic resonance coupling method based on an electromagnetic resonance phenomenon. The battery 80 may be arranged to not overlap the main circuit board 70 in the third direction (e.g., z direction). The battery 80 may be overlapped by the battery hole BH of the bracket 60.

The lower cover 90 may be below the main circuit board 70 and the battery 80. The lower cover 90 may be fastened to the bracket 60 and fixed thereto. The lower cover 90 may form the outer appearance of the lower surface of the display device 1. The lower cover 90 may include plastic, metal, or both plastic and metal.

A second camera hole CMH2 via which the lower surface of the camera 731 is exposed may be provided in the lower cover 90. However, exemplary embodiments are not limited to the location of the camera 731 and the locations of the first and second camera holes CMH1 and CMH2 corresponding to the camera 731 in FIGS. 1 and 2.

Figure 3:
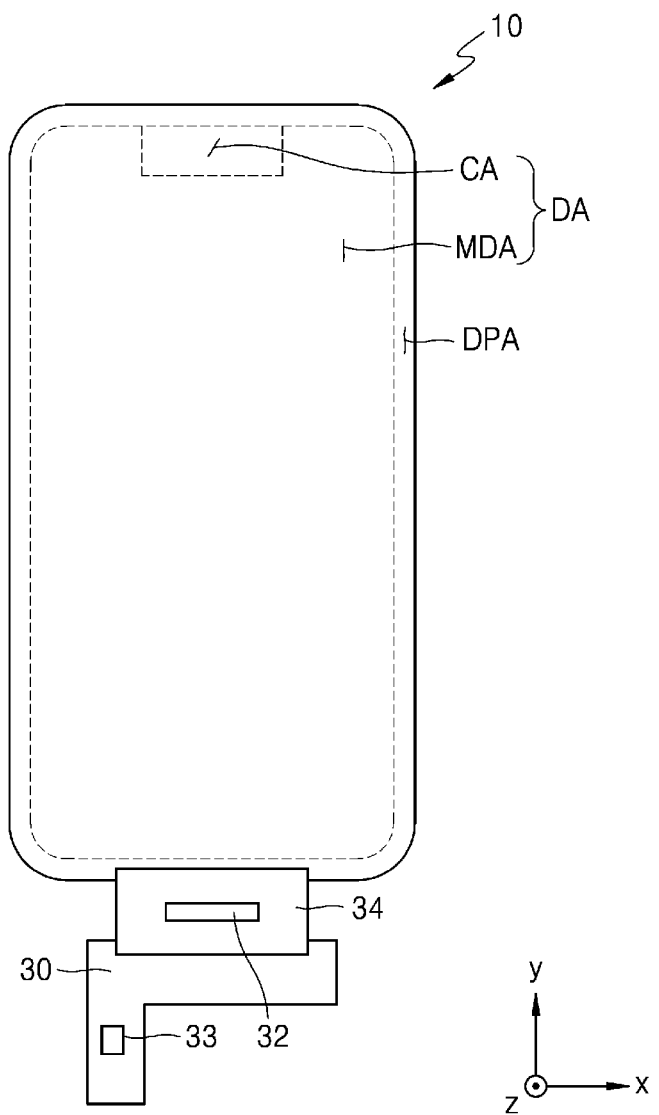
FIG. 3 is a plan view of an exemplary embodiment of a display panel of the display device of FIG. 2.
Figure 4:
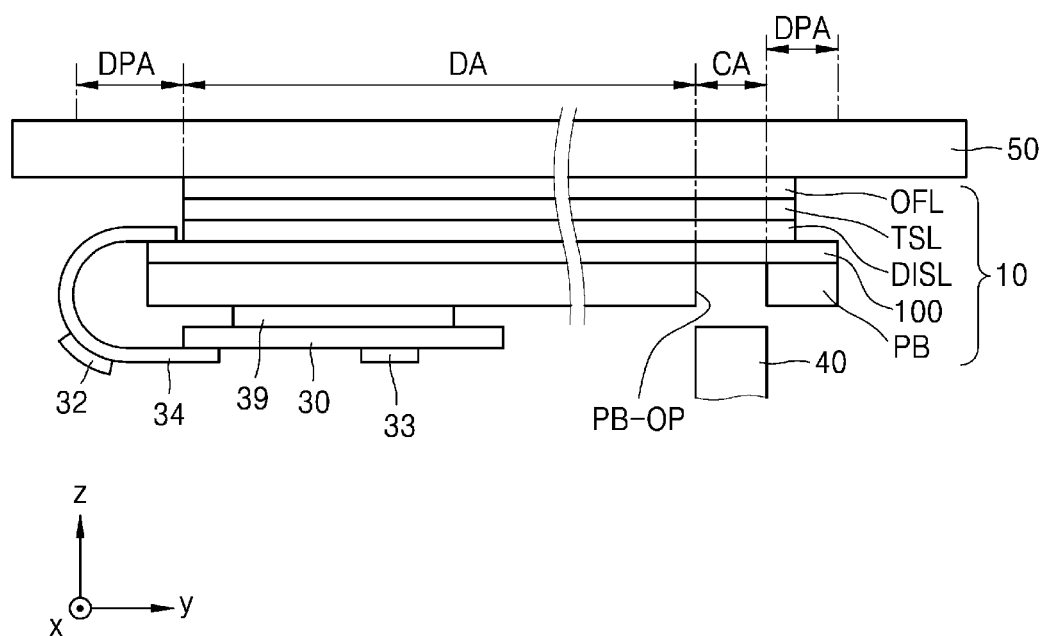
FIG. 4 is a cross-sectional view of the display panel of FIG. 3.

FIG. 3 is a plan view of an exemplary embodiment of the display panel 10 of the display device of FIG. 2. FIG. 4 is a cross-sectional view of the display panel 10 of FIG. 3.

Referring to FIGS. 3 and 4, the display panel 10 may include a substrate 100, a display layer DISL, a touch screen layer TSL, an optical functional layer OFL, and a panel protection member PB.

The substrate 100 may include an insulative material, such as glass, quartz, and polymer resin. The substrate 100 may be a rigid substrate or a flexible substrate that is bendable, foldable, or rollable. For example, the substrate 100 may include polymer resin such as polyethersulphone, polyacrylate, polyetherimide, polyethylene naphthalate, polyethylene terephthalate, polyphenylene sulfide, polyarylate, polyimide, polycarbonate, or cellulose acetate propionate. The substrate 100 may have a multi-layered structure including a layer including the aforementioned polymer resin and an inorganic layer. For example, the substrate 100 may include two layers including the aforementioned polymer resin and an inorganic barrier layer between the two layers.

The display layer DISL may be on the substrate 100. The display layer DISL may include pixels, and may be a layer that displays an image. The display layer DISL may include a circuit layer including thin-film transistors, a display element layer on which display elements are arranged, and an encapsulation member for encapsulating the display element layer.

The display layer DISL may be divided into a display area DA and a peripheral area DPA. The display area DA may be an area that includes pixels arranged therein and displays an image. The peripheral area DPA may be an area that is outside the display area DA and does not display an image. The peripheral area DPA may be arranged to surround the display area DA. The peripheral area DPA may be an area extending from the outside of the display area DA to the edge of the display panel 10. In the display area DA, not only the pixels but also pixel circuits driving the pixels, and scan lines, data lines, and power lines connected to the pixel circuits may be arranged. In the peripheral area DPA, a scan driving unit for applying scan signals to the scan lines, and fan out lines that connect the data lines to the display driving unit 32 may be arranged.

The touch screen layer TSL may be on the display layer DISL. The touch screen layer TSL includes touch electrodes, and may sense whether there is a user's touch. The touch screen layer TSL may be directly on the encapsulation member of the display layer DISL. Alternatively, the touch screen layer TSL may be separately provided and then coupled to the upper surface of the encapsulation member of the display layer DISL via an adhesive layer, such as an optically clear adhesive (OCA).

The optical functional layer OFL may be on the touch screen layer TSL. The optical functional layer OFL may include an anti-reflection layer. The anti-reflection layer may reduce reflectivity of light (e.g., external light) that is incident from an external source toward the display device 1.

According to some exemplary embodiments, the anti-reflection layer may include a polarization film. The polarization film may include a linear planarization plate and a phase delay film such as a quarter-wave (λ/4) plate. The phase delay film may be on the touch screen layer TSL, and the linear planarization plate may be on the phase delay film.

According to some exemplary embodiments, the anti-reflection layer may include a filter layer including a black matrix and color filters. The color filters may be arranged according to the colors of light beams emitted by the pixels of the display device 1. For example, the filter layer may include a color filter of a red color, a green color, or a blue color.

According to some exemplary embodiments, the anti-reflection layer may include a destructive interference structure. The destructive interference structure may include a first reflection layer and a second reflection layer arranged on different layers. First reflected light reflected by the first reflection layer and second reflected light reflected by the second reflection layer may destructively interfere with each other, and thus the reflectance of external light may be reduced.

The cover window 50 may be arranged on the optical functional layer OFL. The cover window 50 may be attached to the upper surface of the optical functional layer OFL by a transparent adhesive member such as an OCA film.

The panel protection member PB may be below the display panel 10. The panel protection member PB may be attached to the lower surface of the display panel 10 by an adhesive member. The adhesive member may be a pressure sensitive adhesive (PSA). The panel protection member PB may include at least one of a light absorption layer for absorbing external light incident thereto, a cushion layer for absorbing an external impact, and a heat sink layer for efficiently dissipating heat of the display panel 10.

The light absorption layer may be below the display panel 10. The light absorption layer stops transmission of light to prevent the components (e.g., the display circuit board 30 arranged below the light absorption layer) from being visible from above the display panel 10. The light absorption layer may include a light absorbing material, such as a black pigment or a black dye.

The cushion layer may be below the light absorption layer. The cushion layer absorbs an external impact to prevent the display panel 10 from being destroyed. The cushion layer may be a single layer or a plurality of layers. For example, the cushion layer may include copolymer resin such as polyurethane, polycarbonate, polypropylene, or polyethylene, or may include an elastic material, such as rubber, a urethane-based material, or a sponge obtained by foam-molding an acryl-based material.

The heat sink layer may be below the cushion layer. The heat sink layer may include a first heat sink layer including graphite or carbon nanotubes, and a second heat sink layer capable of shielding electromagnetic waves and including a metal thin film having high thermal conductivity, such as copper, nickel, ferrite, or silver.

The panel protection member PB may include an opening PB_OP corresponding to the component area CA. The inclusion of the opening PB_OP in the panel protection member PB may improve the light transmittance of the component area CA.

The component area CA may have a larger area than an area where the components 40 are arranged. Accordingly, the area of the opening PB_OP included in the panel protection member PB may not be identical with the area of the component area CA. The components 40 may be arranged to be overlapped by the opening PB_OP. According to an exemplary embodiment, the components 40 may be arranged to be inserted into the opening PB_OP.

The first flexible film 34 may be in a peripheral area DPA of an edge of the display panel 10. The first flexible film 34 may be bent below the display panel 10, and the display circuit board 30 may be located on the lower surface of the panel protection member PB. The display circuit board 30 may be attached to and fixed to the lower surface of the panel protection member PB via a first adhesive member 39. The first adhesive member 39 may be a PSA.

The display area DA of the display panel 10 includes the component area CA below which the components 40 are arranged, and the main display area MDA. The component area CA may be arranged on one side of the main display area MDA. According to an exemplary embodiment, FIG. 3 illustrates that the component area CA is a bar-type component area including a different same width from the width of the main display area MDA in the x direction. The component area CA may be between the peripheral area DPA and the main display area MDA such that upper, right, and left edges of the component area CA may contact the peripheral area DPA, and a lower edge thereof may contact the main display area MDA. According to another exemplary embodiment, the component area CA may be a bar-type component area including the same width as the width of the main display area MDA in the x or y direction. According to another exemplary embodiment, the component area CA may be a bar-type component area and may be arranged within the main display area MDA. According to another exemplary embodiment, the component area CA may have a circular shape, and, as described above, may contact the rim of the main display area MDA or may be arranged within the main display area MDA. According to another exemplary embodiment, the component area CA may have a polygonal or oval shape, and may contact the rim of the main display area MDA or may be arranged within the main display area MDA as described above. However, for convenience of description, the component area CA arranged as a bar-type component area and connected to the rim of the main display area MDA will now be focused on and described in detail.

Figure 5:
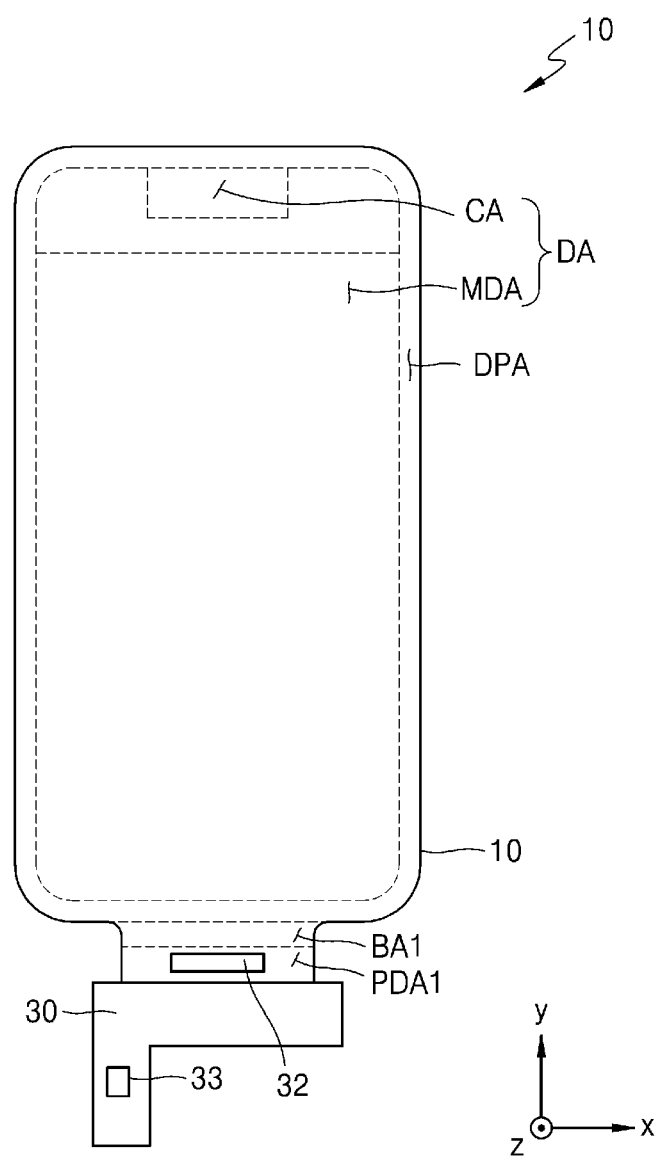
FIG. 5 is a plan view of another exemplary embodiment of the display panel of the display device of FIG. 2.
Figure 6:
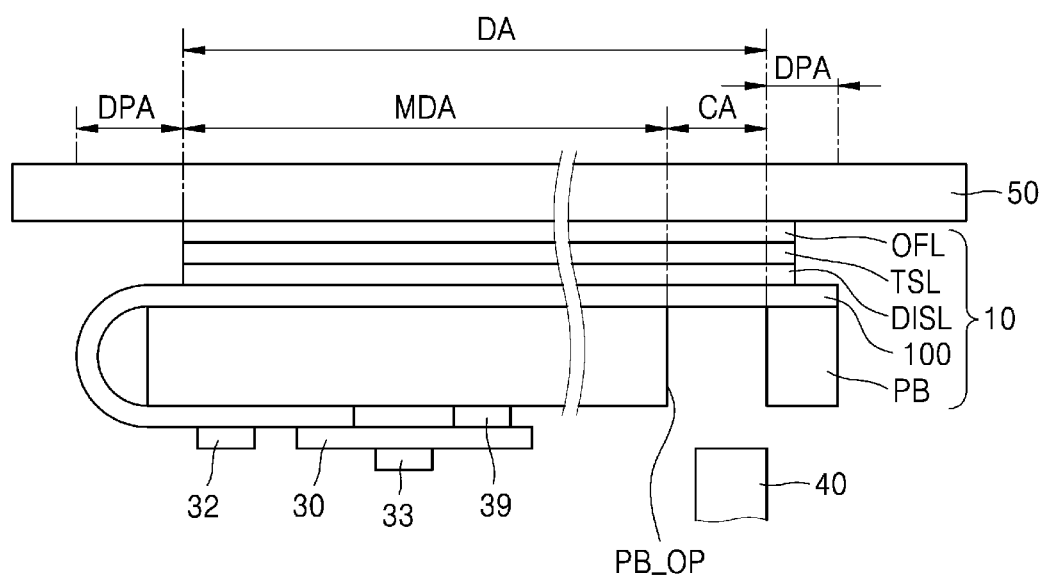
FIG. 6 is a cross-section view of the display panel of FIG. 5.

FIG. 5 is a plan view of another exemplary embodiment of the display panel 10 of FIG. 2. FIG. 6 is a cross-sectional view of the display panel 10 of FIG. 5. FIG. 5 shows a plan view of the display panel 10 of which a first bending area BA1 is unfolded.

The exemplary embodiment of FIGS. 5 and 6 is different from that of FIGS. 3 and 4 in that the first bending area BA1 of the display panel 10 is bent and thus a first pad area PDA1 is located on the lower surface of the panel protection member PB. In other words, the display panel 10 may be a display panel of which one part is bent.

Referring to FIGS. 5 and 6, the first bending area BA1 and the first pad area PDA1 may protrude from a peripheral area DPA of one side of the display panel 10 in the −y direction. As shown in FIG. 6, respective lengths of the first bending area BA1 and the first pad area PDA1 in the x direction may each be smaller than a length of the display area DA in the x direction.

The display panel 10 may be bent at the first bending area BA1, and the first pad area PDA1 may be arranged on the lower surface of the panel protection member PB. The first pad area PDA1 may be overlapped by the display area DA in a thickness direction (e.g., the z direction) of the display panel 10. In the first pad area PDA1, the display driving unit 32 and the display circuit board 30 may be arranged.

Although the component area CA of the display area DA is included as a bar-type in FIGS. 3 and 5, exemplary embodiments are not limited thereto. For example, the shape of the component area CA may be a circle, an oval, or a polygon such as a triangle or a pentagon, and the location of the component area CA may vary. A display device may have two or more component areas CA, and the plurality of component areas CA may have different shapes and different sizes.

Figure 7A:
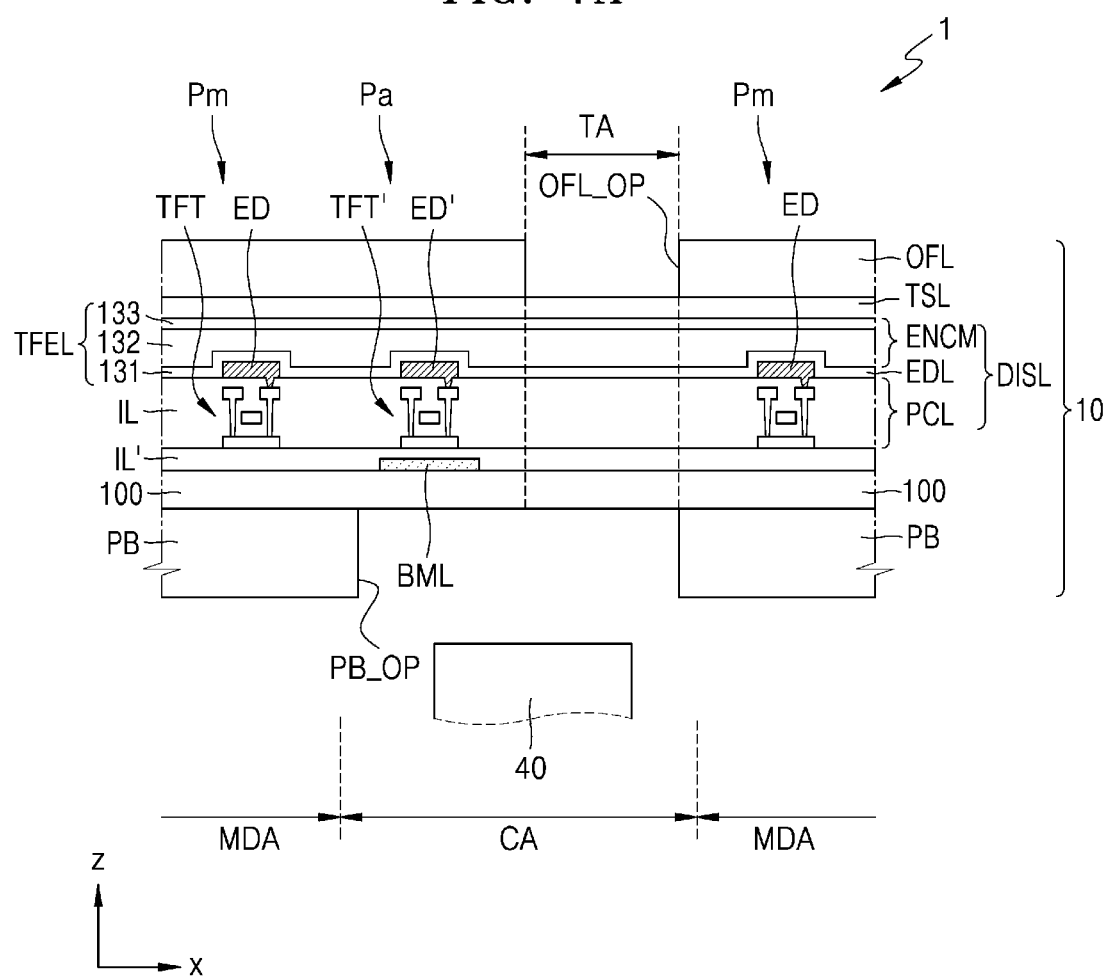
FIGS. 7A and 7B are schematic cross-sectional views of respective portions of other exemplary embodiments of the display device of FIG. 1.
Figure 7B:
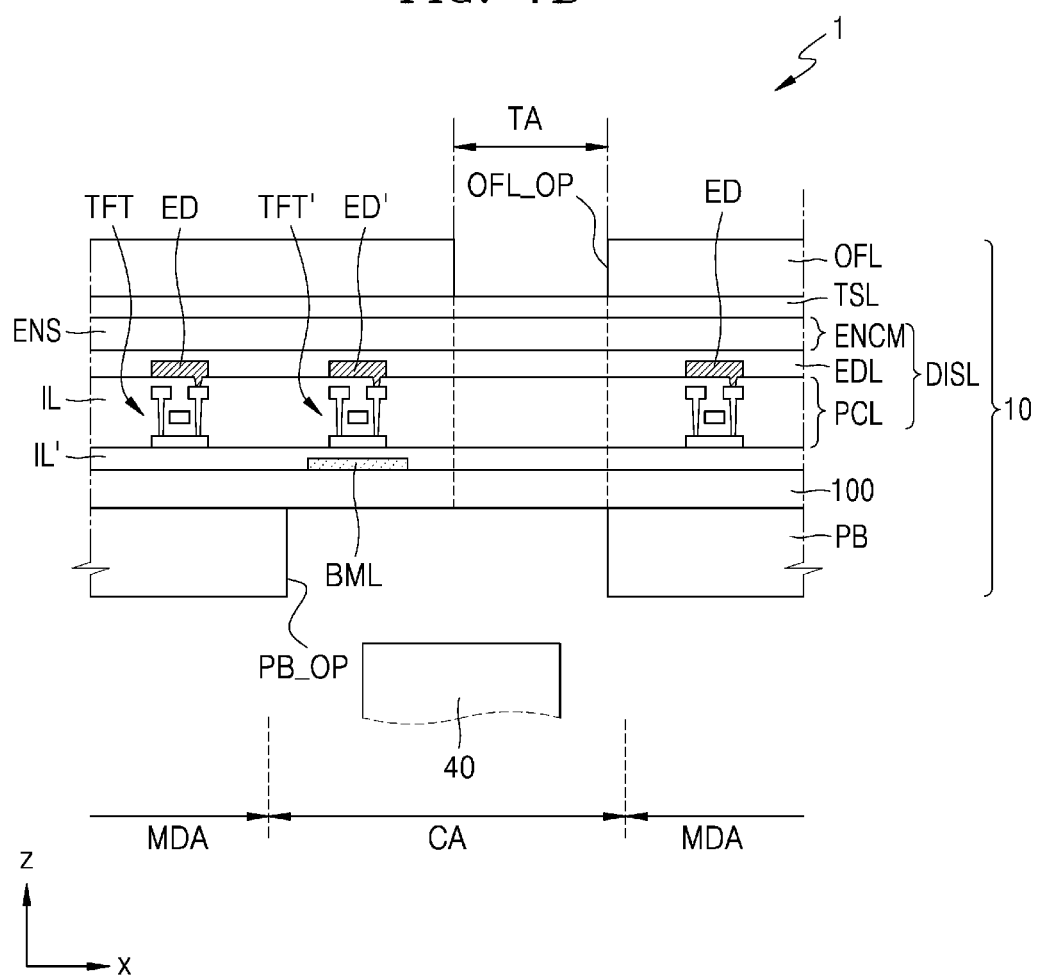

FIGS. 7A and 7B are schematic cross-sectional views of respective portions of other exemplary embodiments of the display device of FIG. 1.

Referring to FIGS. 7A and 7B, the display devices 1 may include a display panel 10 and a component 40 overlapped by the display panel 10. As described above, the display panel 10 includes a component area CA overlapping the component 40, and a main display area MDA on which a main image is displayed.

The display panel 10 may include a substrate 100, a display layer DISL, a touch screen layer TSL, and an optical functional layer OFL on the substrate 100, and a panel protection member PB below the substrate 100. The display layer DISL may include a circuit layer PCL including main and auxiliary thin-film transistors TFT and TFT', a display element layer including main and auxiliary light-emitting elements ED and ED' that are display elements, and an encapsulation member ENCM such as a thin-film encapsulation layer TFEL or an encapsulation substrate ENS. Insulating layers IL and IL' may be arranged between the substrate 100 and the display layer DISL and within the display layer DISL.

The substrate 100 may include an insulative material, such as glass, quartz, and polymer resin. The substrate 100 may be a rigid substrate or a flexible substrate that is bendable, foldable, or rollable.

In the main display area MDA of the display panel 10, the main thin-film transistor TFT and the main light-emitting element ED connected thereto may be arranged to form a main subpixel Pm. In the component area CA of the display panel 10, the auxiliary thin-film transistor TFT' and the auxiliary light-emitting element ED' connected thereto may be arranged to form an auxiliary subpixel Pa.

In the component area CA, a transmission area TA, in which display elements are not arranged, may be arranged. The transmission area TA may transmit a light/signal emitted by the component 40 arranged to correspond to the component area CA or a light/signal incident upon the component 40.

A bottom metal layer BML may be arranged in the component area CA. The bottom metal layer BML may be arranged below the auxiliary thin-film transistor TFT'. For example, the bottom metal layer BML may be between the auxiliary thin-film transistor TFT' and the substrate 100. The bottom metal layer BML may prevent external light from being transmitted to the auxiliary thin-film transistor TFT'. According to some exemplary embodiments, a static voltage or a signal is applied to the bottom metal layer BML, and thus the bottom metal layer BML may prevent a pixel circuit from being damaged by electrostatic discharge. A plurality of bottom metal layers BML may be arranged within the component area CA. In some cases, different voltages may be applied to the plurality of bottom metal layers BML. A single bottom metal layer BML including a hole corresponding to the transmission area TA may be located within the component area CA.

The display element layer EDL may be covered by the thin-film encapsulation layer TFEL or by the encapsulation substrate ENS. According to some exemplary embodiments, the thin-film encapsulation layer TFEL may include at least one inorganic encapsulation layer and at least one organic encapsulation layer, as shown in FIG. 7A. According to an exemplary embodiment, the thin-film encapsulation layer TFEL may include first and second inorganic encapsulation layers 131 and 133 and an organic encapsulation layer 132 therebetween.

According to some exemplary embodiments, the encapsulation substrate ENS may be arranged to face the substrate 100 with the display element layer EDL therebetween, as shown in FIG. 7B. A gap may be between the encapsulation substrate ENS and the display element layer EDL. The encapsulation substrate ENS may include glass. A sealant including frit or the like may be arranged between the substrate 100 and the encapsulation substrate ENS, and may be arranged in the peripheral area DPA. The sealant arranged in the peripheral area DPA may surround the display area DA and prevent moisture from permeating through the side surfaces of the display panel 10.

The touch screen layer TSL may obtain coordinate information based on an external input, for example, a touch event. The touch screen layer TSL may include a touch electrode and touch wires connected to the touch electrode. The touch screen layer TSL may sense an external input according to a self-capacitive method or a mutual-capacitive method.

The touch screen layer TSL may be on the thin-film encapsulation layer TFEL. Alternatively, the touch screen layer TSL may be separately provided on a touch substrate and then coupled to the upper surface of the thin-film encapsulation layer TFEL via the adhesive layer, such as an OCA. According to an exemplary embodiment, as shown in FIGS. 7A and 7B, the touch screen layer TSL may be provided directly on the thin-film encapsulation layer TFEL.

In this case, adhesive layers may not be between the touch screen layer TSL and the thin-film encapsulation layer TFEL.

The optical functional layer OFL may include an anti-reflection layer. The anti-reflection layer may reduce reflectivity of light (e.g., external light) that is incident from an external source toward the display device 1.

According to some exemplary embodiments, the optical functional layer OFL may be a polarization film. The optical functional layer OFL may include an opening OFL_OP corresponding to the transmission area TA. Accordingly, the light transmittance of the transmission area TA may be significantly improved. The opening OFL_OP may be filled with a transparent material such as an optically clear resin (OCR).

Figure 8:
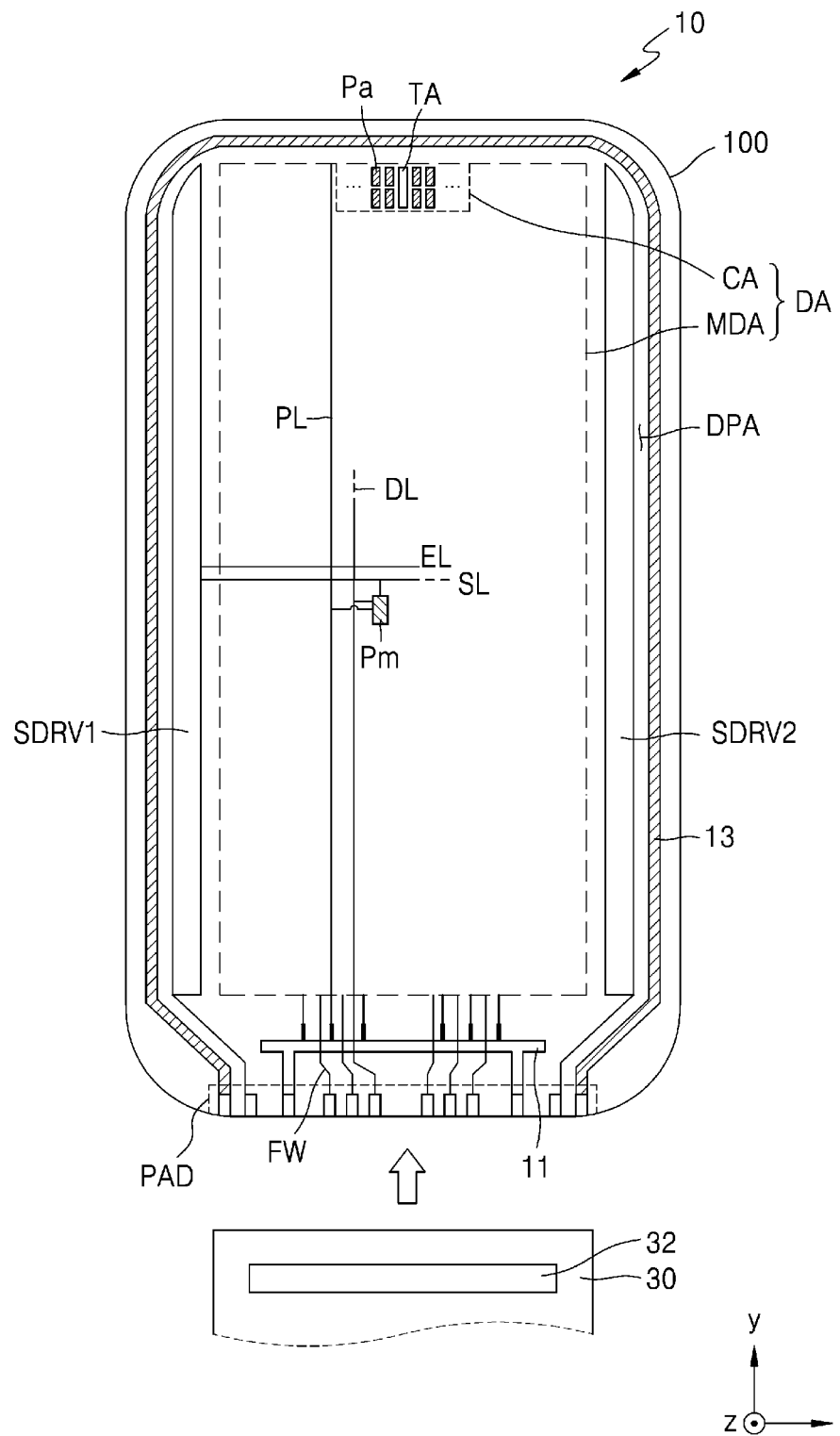
FIG. 8 is a schematic plan view of the display panel of FIG. 2.

FIG. 8 is a schematic plan view of the display panel 10 of FIG. 2.

Referring to FIG. 8, various components included in the display panel 10 are arranged on a substrate 100. The substrate 100 includes a display area DA and a peripheral area PDA surrounding the display area DA. The display area DA includes a main display area MDA on which a main image is displayed, and a component area CA which includes a transmission area TA and on which an auxiliary image is displayed. The auxiliary image may form a single entire image together with the main image, or may be an image independent from the main image.

A plurality of main subpixels Pm are arranged in the main display area MDA. Each of the plurality of main pixels Pm may be implemented as a display element, such as an organic light-emitting diode OLED. Each of the plurality of main subpixels Pm may emit, for example, a red light, a green light, a blue light, or a white light. The main display area MDA may be covered with an encapsulation member and thus may be protected from ambient air, moisture, or the like.

The component area CA may be located on one side of the main display area MDA as described above, or may be arranged within the display area DA and surrounded by the main display area MDA. A plurality of auxiliary subpixels Pa are arranged in the component area CA. Each of the plurality of auxiliary subpixels Pa may be implemented as a display element, such as an organic light-emitting diode OLED. Each of the plurality of auxiliary subpixels Pa may emit, for example, a red light, a green light, a blue light, or a white light. The component CA may be covered with an encapsulation member and thus may be protected from ambient air, moisture, or the like.

The component area CA may have transmission areas TA. The transmission areas TA may be arranged to surround the plurality of auxiliary subpixels Pa. Alternatively, the transmission areas TA may be arranged in a lattice configuration, together with the plurality of auxiliary subpixels Pa.

Because the component area CA has the transmission areas TA, a resolution of the component area CA may be lower than a resolution of the main display area MDA. For example, the resolution of the component area CA may be about ½, about ⅜, about ⅓, about ¼, about ⅖, about ⅛, about ⅑, or about 1/16 of the resolution of the main display area MDA. For example, the resolution of the main display area MDA may be about 400 ppi or greater, and the resolution of the component area CA may be about 200 ppi or about 100 ppi.

Pixel circuits that drive the main and auxiliary subpixels Pm and Pa may be electrically connected to outer circuits arranged in the peripheral area DPA, respectively. In the peripheral area DPA, a first scan driving circuit SDRV1, a second scan driving circuit SDRV2, a terminal unit PAD, a driving voltage supply line 11, and a common voltage line 13 may be arranged.

The first scan driving circuit SDRV1 may apply a scan signal, via a scan line SL, to each of the pixel circuits that drive the main and auxiliary subpixels Pm and Pa. The first scan driving circuit SDRV1 may apply a light-emission control signal to each of the pixel circuits via a light-emission control line EL. The second scan driving circuit SDRV2 may be located on a side of the main display area MDA that is opposite to the side where the first scan driving circuit SDRV1 is located, and may be approximately parallel to the first scan driving circuit SDRV1. Some of the pixel circuits of the plurality of main subpixels Pm arranged in the main display area MDA may be electrically connected to the first scan driving circuit SDRV1, and the remaining pixel circuits may be electrically connected to the second scan driving circuit SDRV2. Some of the pixel circuits of the plurality of auxiliary subpixels Pa arranged in the component area CA may be electrically connected to the first scan driving circuit SDRV1, and the remaining pixel circuits may be electrically connected to the second scan driving circuit SDRV2. The second scan driving circuit SDRV2 may not be included.

The terminal unit PAD may be arranged on one side of the substrate 100. The terminal unit PAD is exposed without being covered by an insulating layer, and is connected to the display circuit board 30. The display driving unit 32 may be on the display circuit board 30. The display driving unit 32 may generate a control signal that is transmitted to the first scan driving circuit SDRV1 and the second scan driving circuit SDRV2. The display driving unit 32 may supply a driving voltage ELVDD to the driving voltage supply line 11, and may supply a common voltage ELVSS to the common voltage supply line 13. The driving voltage ELVDD may be applied to the pixel circuits of the main and auxiliary subpixels Pm and Pa via a driving voltage line PL connected to the driving voltage supply line 11, and the common voltage ELVSS may be connected to the second power supply line 13 and thus may be applied to an opposite electrode of each display element. The display driving unit 32 may generate a data signal, and the generated data signal may be transmitted to the pixel circuits of the main and auxiliary subpixels Pm and Pa via fanout wires FW and data lines DL connected to the fanout wires FW.

The driving voltage supply line 11 may extend in the x direction along a lower side of the main display area MDA. The common voltage supply line 13 may have a loop shape of which one side is open, and may surround a portion of the main display area MDA.

Figure 9A:
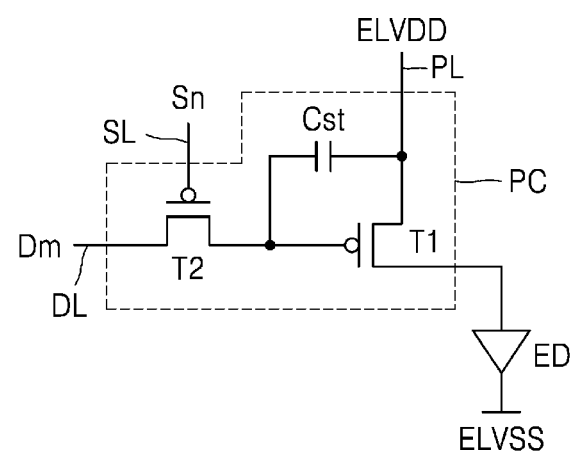
FIGS. 9A and 9B are equivalent circuit diagrams of pixel circuits for driving subpixels in the display device of FIG. 1.
Figure 9B:
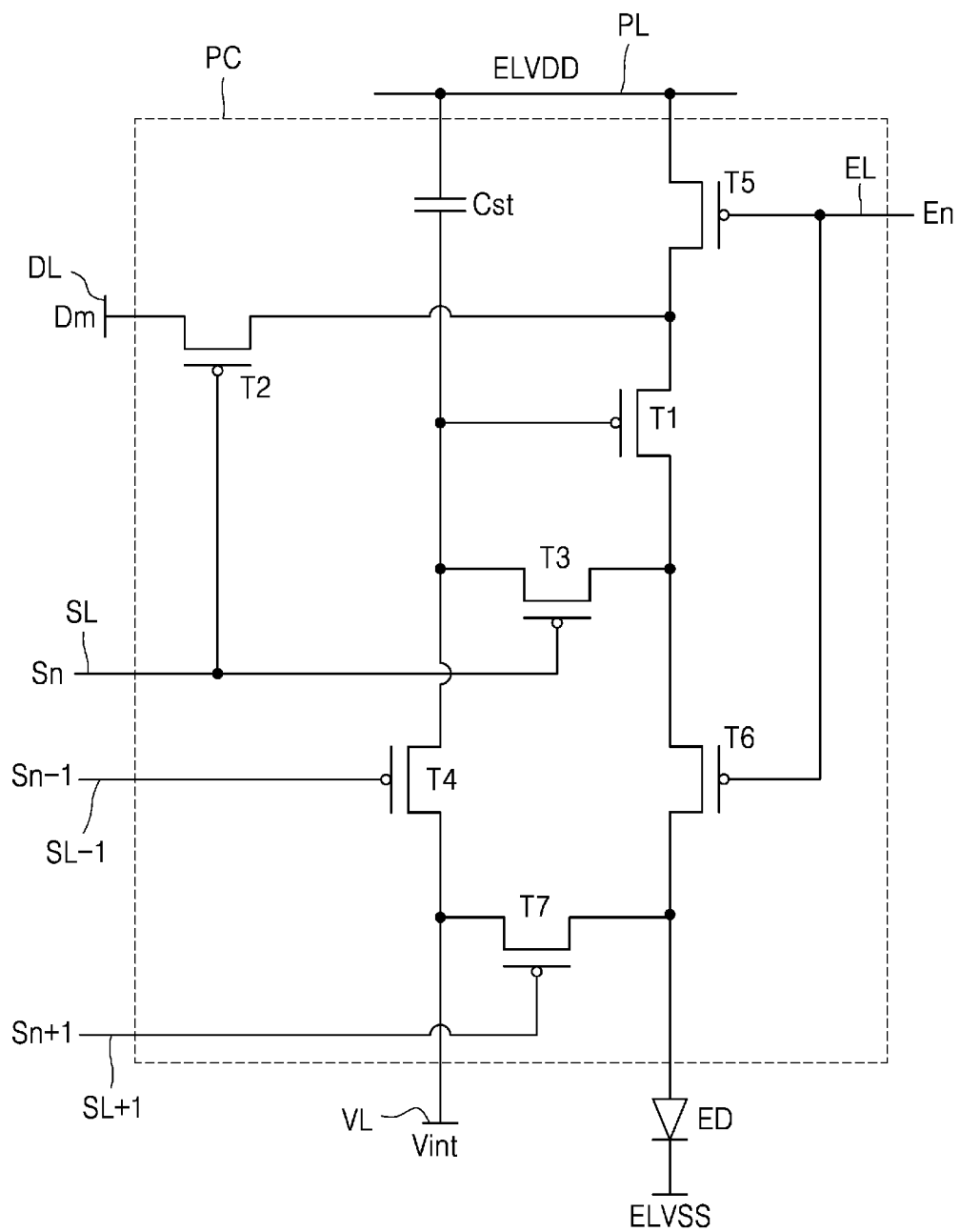

FIGS. 9A and 9B are equivalent circuit diagrams of pixel circuits for driving subpixels in the display device of FIG. 1.

Referring to FIGS. 9A and 9B, a pixel circuit PC may be connected to a light-emitting element ED and may realize light emission of subpixels. The pixel circuit PC includes a driving thin-film transistor T1, a switching thin-film transistor T2, and a storage capacitor Cst. The switching thin-film transistor T2 is connected to the scan line SL and the data line DL, and transmits, to the driving thin-film transistor T1, a data signal Dm received via the data line DL according to a scan signal Sn received via the scan line SL.

The storage capacitor Cst is connected to the switching thin-film transistor T2 and a driving voltage line PL, and stores a voltage corresponding to a difference between a voltage received from the switching thin-film transistor T2 and the driving voltage ELVDD supplied to the driving voltage line PL.

The driving thin-film transistor T1 is connected to the driving voltage line PL and the storage capacitor Cst, and may control a driving current flowing from the driving voltage line PL to the light-emitting element ED, in accordance with a voltage value stored in the storage capacitor Cst. The light-emitting element ED may emit light having a certain brightness due to the driving current.

Although a case where the pixel circuit PC includes two TFTs and one storage capacitor is illustrated in FIG. 9A, exemplary embodiments are not limited thereto.

Referring to FIG. 9B, a pixel circuit PC may include a driving thin-film transistor T1, a switching thin-film transistor T2, a compensating thin-film transistor T3, a first initializing thin-film transistor T4, an operation control thin-film transistor T5, a light-emission control thin-film transistor T6, and a second initializing thin-film transistor T7.

Although the pixel circuit PC includes signal lines including a scan line SL, a previous scan line SL−1, a next scan line SL+1, a light-emission control line EL, and a data line DL, an initializing voltage line VL, and a driving voltage line PL in FIG. 9B, exemplary embodiments are not limited thereto. According to another exemplary embodiment, at least one of the signal lines including the scan line SL, the previous scan line SL−1, the next scan line SL+1, the light-emission control line EL, and the data line DL, or/and the initializing voltage line VL may be shared by neighboring pixel circuits.

A drain electrode of the driving thin-film transistor T1 may be electrically connected to the light-emitting element ED via the light-emission control thin-film transistor T6. The driving thin-film transistor T1 receives the data signal Dm according to a switching operation of the switching thin-film transistor T2 and supplies a driving current to the light-emitting element ED.

A gate electrode of the switching thin-film transistor T2 is connected to the scan line SL, and a source electrode thereof is connected to the data line DL. A drain electrode of the switching thin-film transistor T2 may be connected to a source electrode of the driving thin-film transistor T1 and at the same time may be connected to the driving voltage line PL via the operation control thin-film transistor T5.

The switching thin-film transistor T2 is turned on according to the scan signal Sn received via the scan line SL and performs a switching operation of transmitting the data signal Dm received from the data line DL to the source electrode of the driving thin-film transistor T1.

A gate electrode of the compensating thin-film transistor T3 may be connected to the scan line SL. A source electrode of the compensating thin-film transistor T3 may be connected to the drain electrode of the driving thin-film transistor T1 and at the same time may be connected to a pixel electrode of the light-emitting element ED via the light-emission control thin-film transistor T6. A drain electrode of the compensating thin-film transistor T3 may be connected to one electrode of the storage capacitor Cst, a source electrode of the first initializing thin-film transistor T4, and a gate electrode of the driving thin-film transistor T1. The compensating thin film transistor T3 is turned on according to the scan signal Sn received via the scan line SL and connects the gate electrode and the drain electrode of the driving thin film transistor T1 to each other, thus forming diode-connection of the driving thin film transistor T1.

A gate electrode of the first initializing thin-film transistor T4 may be connected to the previous scan line SL−1. A drain electrode of the first initializing thin-film transistor T4 may be connected to the initializing voltage line VL. A source electrode of the first initializing thin-film transistor T4 may be connected to the one electrode of the storage capacitor Cst, the drain electrode of the compensating thin film transistor T3, and the gate electrode of the driving thin-film transistor T1. The first initializing thin-film transistor T4 may be turned on according to a previous scan signal Sn−1 received via the previous scan line SL−1 and may transmit an initializing voltage Vint to the gate electrode of the driving thin-film transistor T1 to thereby initialize a voltage of the gate electrode of the driving thin-film transistor T1.

A gate electrode of the operation control thin-film transistor T5 may be connected to the light-emission control line EL. A source electrode of the operation control thin-film transistor T5 may be connected to the driving voltage line PL. A drain electrode of the operation control thin-film transistor T5 is connected to the source electrode of the driving thin-film transistor T1 and the drain electrode of the switching thin-film transistor T2.

A gate electrode of the light-emission control thin-film transistor T6 may be connected to the light-emission control line EL. A source electrode of the light-emission control thin-film transistor T6 may be connected to the drain electrode of the driving thin-film transistor T1 and the source electrode of the compensating thin-film transistor T3. A drain electrode of the light-emission control thin-film transistor T6 may be electrically connected to the pixel electrode of the light-emitting element ED. The operation control thin-film transistor T5 and the light-emission control thin-film transistor T6 are simultaneously turned on according to a light-emission control signal En received via the light-emission control line EL, and thus the driving voltage ELVDD is transmitted to the light-emitting element ED and the driving current flows in the light-emitting element ED.

A gate electrode of the second initializing thin-film transistor T7 may be connected to the next scan line SL+1. A source electrode of the second initializing thin-film transistor T7 may be connected to the pixel electrode of the light-emitting element ED. A drain electrode of the second initializing thin-film transistor T7 may be connected to the initializing voltage line VL. The second initializing thin-film transistor T7 may be turned on according to a next scan signal Sn+1 received via the next scan line SL+1 and may initialize the pixel electrode of the light-emitting element ED.

Although the first initializing thin-film transistor T4 and the second initializing thin-film transistor T7 are respectively connected to the previous scan line SL−1 and the next scan line SL+1 in FIG. 9B, exemplary embodiments are not limited thereto. According to another exemplary embodiment, both the first initializing thin-film transistor T4 and the second initializing thin-film transistor T7 may be connected to the previous scan line SL−1 and may be driven according to the previous scan signal Sn−1.

Another electrode of the storage capacitor Cst may be connected to the driving voltage line PL. The one electrode of the storage capacitor Cst may be connected to the gate electrode of the driving thin-film transistor T1, the drain electrode of the compensating thin film transistor T3, and the source electrode of the first initializing thin-film transistor T4.

An opposite electrode (e.g., a cathode) of the light-emitting element ED provides the common voltage ELVSS. The light-emitting element ED receives the driving current from the driving thin-film transistor T1 and emits light.

The pixel circuit PC is not limited to the number of thin-film transistors, the number of storage capacitors, and the circuit designs all described above with reference to FIGS. 9A and 9B. For example, the number of thin-film transistors, the number of storage capacitors, and a circuit design may vary.

The pixel circuits PC for driving a main subpixel Pm and an auxiliary subpixel Pa may be the same as each other or may be different from each other. For example, the pixel circuit PC of FIG. 9B may be used as each of the pixel circuits PC for driving a main subpixel Pm and an auxiliary subpixel Pa. According to another exemplary embodiment, the pixel circuit PC of FIG. 9B may be used as a pixel circuit PC for driving a main subpixel Pm, and the pixel circuit PC of FIG. 9A may be used as a pixel circuit PC for driving an auxiliary subpixel Pa.

Figure 10:
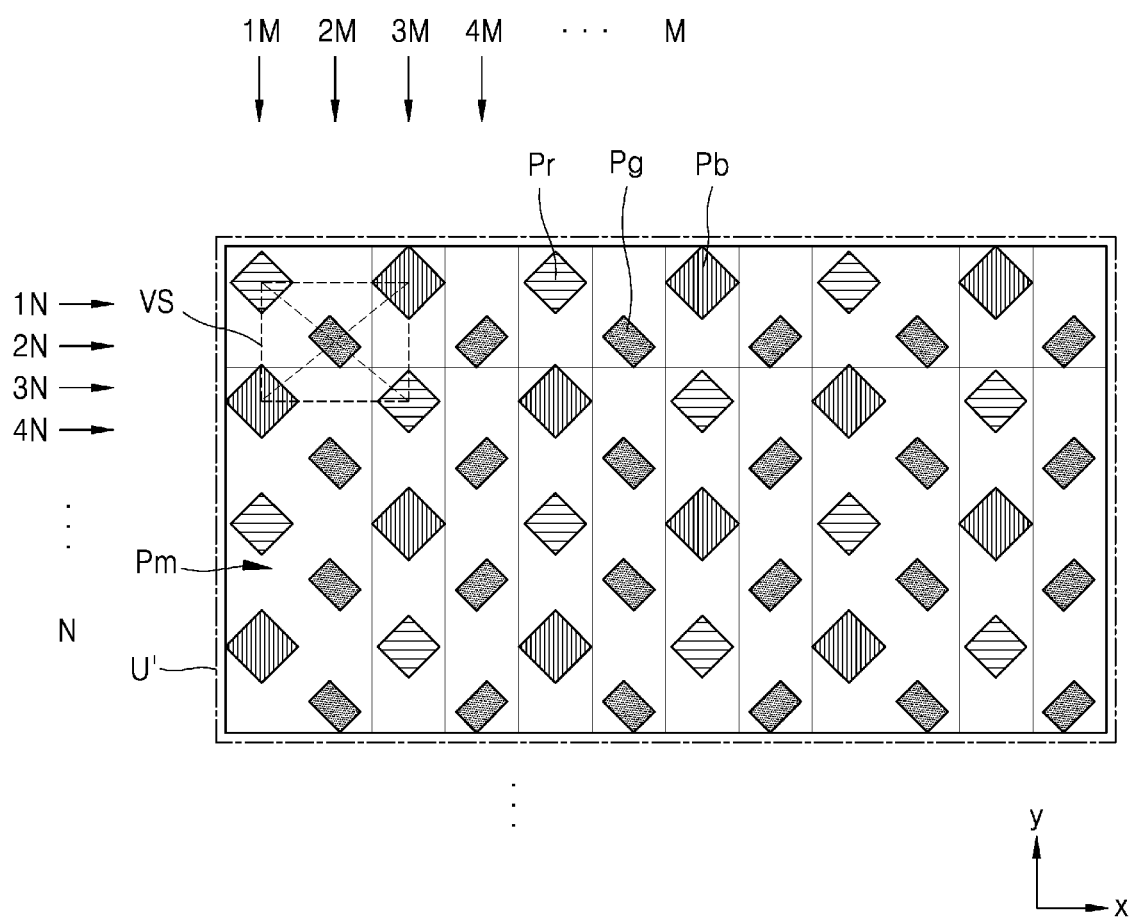
FIG. 10 is a schematic layout view illustrating a pixel arrangement structure in a main display area of the display panel of FIG. 2.

FIG. 10 is a schematic layout view illustrating a pixel arrangement structure in the main display area MDA of the display panel 10 of FIG. 2.

Referring to FIG. 10, a plurality of main subpixels Pm may be arranged in the main display area MDA. A subpixel, as used herein, refers to a light-emission area as a minimum unit that generates an image. When an organic light-emitting diode is used as a display element, the light-emission area may be defined by the opening of a pixel defining layer. This will be described later.

As shown in FIG. 10, the main subpixels Pm arranged in the main display area MDA may have a PenTile structure. A red subpixel Pr, a green subpixel Pg, and a blue subpixel Pb may represent a red color, a green color, and a blue color, respectively.

Accordingly, a plurality of red subpixels Pr and a plurality of blue subpixels Pb are alternatively disposed with each other on a first row 1N, a plurality of green subpixels Pg are apart from each other by a preset distance on a second row 2N adjacent to the first row 1N, blue subpixels Pb and red subpixels Pr are alternatively disposed with each other on a third row 3N adjacent to the second row 2N, and a plurality of green subpixels Pg are apart from each other by a preset distance on a fourth row 4N adjacent to the third row 3N, and this pixel arrangement is repeated up to an N-th row. In this case, the blue subpixels Pb and the red subpixels Pr may be larger than the green subpixels Pg.

The plurality of red subpixels Pr and the plurality of blue subpixels Pb on the first row 1N, and the plurality of green subpixels Pg on the second row 2N are arranged in a zigzag configuration. Accordingly, the red subpixels Pr and the blue subpixels Pb are alternatively disposed with each other on a first column 1M, the plurality of green subpixels Pg are apart from each other by a preset distance on a second column 2M adjacent to the first column 1M, the blue subpixels Pb and the red subpixels Pr are alternatively disposed with each other on a third column 3M adjacent to the second column 2M, and the plurality of green subpixels Pg are apart from each other by a preset distance on a fourth column 4M adjacent to the third column 3M, and this pixel arrangement is repeated up to an M-th column.

Describing this pixel arrangement structure differently, red subpixels Pr are arranged at first and third facing vertexes of the four vertexes of a virtual quadrilateral VS having a center point of a green subpixel Pg as its center point, and blue subpixels Pb are arranged at the remaining vertexes, e.g., second and fourth vertexes. The virtual quadrilateral VS may be a rectangle, a rhombus, a square, or the like. The virtual quadrilateral VS may be a main pixel group.

This pixel arrangement structure is referred to as a PenTile matrix structure or a PenTile structure. By applying rendering, in which a color of a pixel is represented by sharing the colors of its adjacent pixels, a high resolution may be obtained via a small number of pixels.

Although the plurality of main subpixels Pm are arranged in a PenTile matrix structure in FIG. 10, exemplary embodiments are not limited thereto. For example, the plurality of main subpixels Pm may be arranged in various configurations, such as a stripe structure, a mosaic arrangement structure, and a delta arrangement structure. For example, the stripe structure means that each subpixel has a length and a width shorter than the length.

Figure 11A:
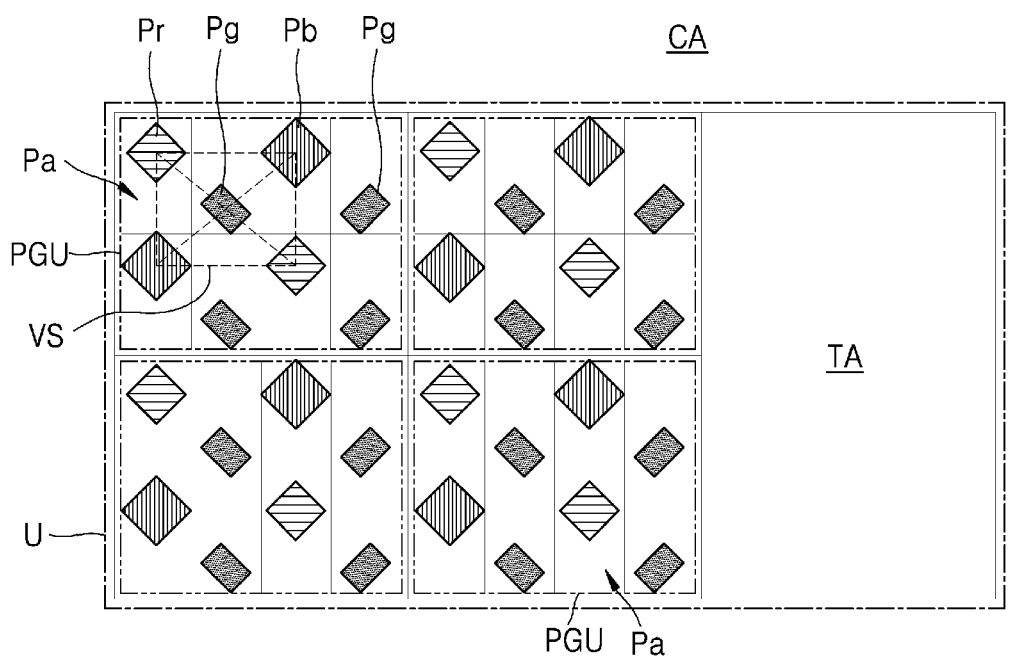
FIGS. 11A, and 11B, 11C are schematic layout views illustrating pixel arrangement structures in a component area of the display panel of FIG. 2.
Figure 11B:
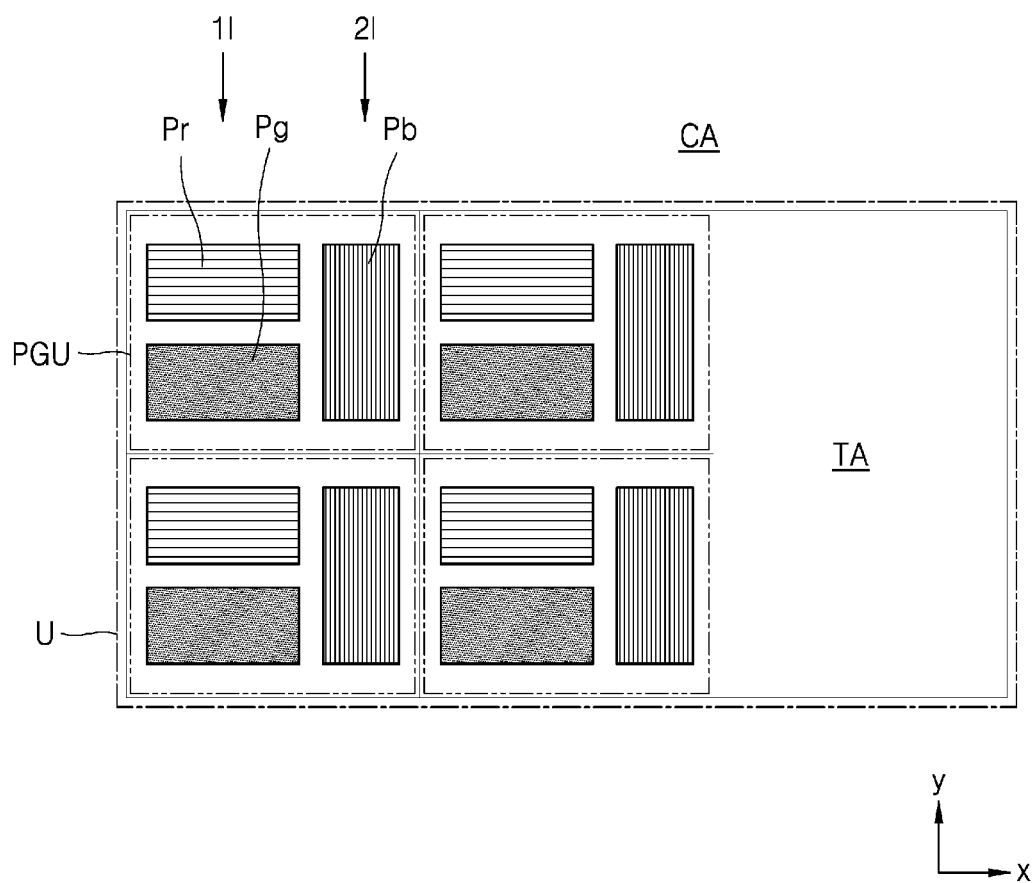
Figure 11C:
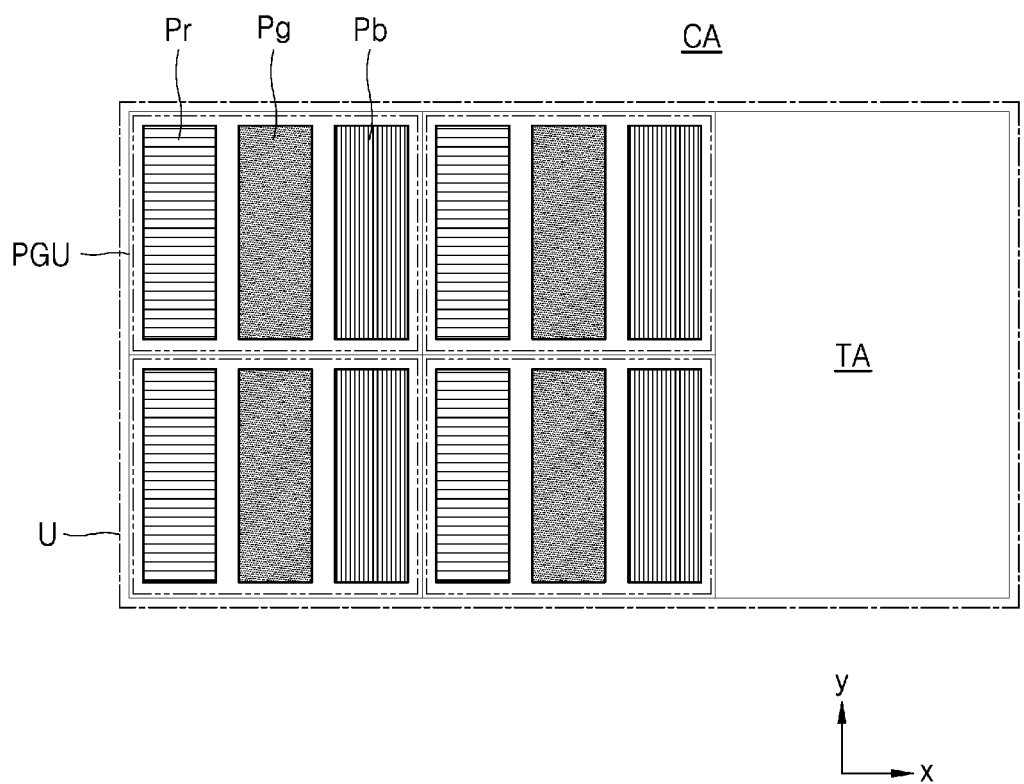

FIGS. 11A, 11B, and 11C are schematic layout views illustrating pixel arrangement structures in the component area CA of the display panel 10 of FIG. 2.

Referring to FIGS. 11A through 11C, a plurality of auxiliary subpixels Pa may be arranged in the component area CA. Each of the auxiliary subpixels Pa may emit, for example, a red light, a green light, a blue light, or a white light.

The component area CA may include an auxiliary pixel group PGU and a transmission area TA, the auxiliary pixel group PGU including at least one auxiliary subpixel Pa. The auxiliary pixel group PGU and the transmission area TA may be alternatively disposed with each other both in the x direction and the y direction, and may be arranged in, for example, a lattice configuration. In this case, the component area CA may have a plurality of auxiliary pixel groups PGU and a plurality of transmission areas TA.

The auxiliary pixel group PGU may be defined as a subpixel set in which a plurality of auxiliary subpixels Pa are grouped in a preset unit. For example, as shown in FIG. 11A, a single auxiliary pixel group PGU may include eight auxiliary subpixels Pa arranged in a PenTile structure. In other words, a single auxiliary pixel group PGU may include two red subpixels Pr, four green subpixels Pg, and two blue subpixels Pb.

In the component area CA, a basic unit U including a certain number of auxiliary pixel groups PGU and a certain number of transmission areas TA may be repeated in the x direction and the y direction. In FIG. 11A, the basic unit U may have a quadrilateral shape in which four auxiliary pixel groups PGU and two transmission areas TA arranged around the four auxiliary pixel groups PGU are grouped. In this case, the four auxiliary pixel groups PGU may be connected to each other, and the two transmission areas TA may be connected to each other. The basic unit U has a repetitive structure and does not have a disconnected configuration.

In the main display area MDA, a corresponding unit U' having the same area as that of the basic unit U may be set. In this case, the number of main subpixels Pm included in the corresponding unit U' may be greater than that of auxiliary subpixels Pa included in the basic unit U. For example, the number of auxiliary subpixels Pa included in the basic unit U is 32 and the number of main subpixels Pm included in the corresponding unit U' is 48. Thus, the ratio of the number of auxiliary subpixels Pa to the number of main subpixels Pm arranged on the same area may be 2:3 (see FIG. 10).

Corresponding units U' as described above may be lined up. For example, the corresponding units U' may be arranged in the y direction of FIGS. 11A and 11B within the component area CA. In this case, the auxiliary pixel groups PGU may be lined up, and the transmission areas TA may be lined up. A width of the transmission areas TA may be smaller than a width of a portion of the corresponding unit U' except for the transmission areas TA. Each of the two widths may be measured in the x direction of FIGS. 11A and 11B.

Referring to FIG. 11B, the pixel arrangement structure of the component area CA may be an S-stripe structure as described below. According to the illustrated exemplary embodiment, a single auxiliary pixel group PGU may include a total of three auxiliary subpixels Pa, e.g., one red subpixel Pr, one green subpixel Pg, and one blue subpixel Pb.

According to the illustrated exemplary embodiment, one red subpixel Pr and one green subpixel Pg of the single auxiliary pixel group PGU may be alternatively disposed with each other on a first column 1I, and one blue subpixel Pb of the single auxiliary pixel group PGU may be arranged on a second column 2I adjacent to the first column 1I. Thus, the single auxiliary pixel group PGU may has an S-stripe structure. In this case, each of the red subpixel Pr and the green subpixel Pg has a rectangular shape having a longer side in the x direction, and the blue subpixel Pb may be arranged to have a rectangular shape having a longer side in the y direction. A length of the blue subpixel Pb in the y direction may be equal to or greater than a sum of a length of the red subpixel Pr in the y direction and a length of the green subpixel Pg in the y direction. Accordingly, a size of the blue subpixel Pb may be greater than a size of each of the red and green subpixels Pr and Pg.

According to the illustrated exemplary embodiment, an area occupied by the single auxiliary pixel group PGU in the basic unit U may be about ¼ of the basic unit U. In FIG. 11B, only four auxiliary pixel groups PGU are included in the basic unit U. However, according to another exemplary embodiment, the basic unit U may include one or more auxiliary pixel groups PGU. The area of the auxiliary subpixels Pa included in each auxiliary pixel group PGU may vary.

Referring to FIG. 11C, the pixel arrangement structure of the component area CA may be a stripe structure. In other words, a red subpixel Pr, a green subpixel Pg, and a blue subpixel Pb may be sequentially disposed in the x direction. In this case, each of the red subpixel Pr, the green subpixel Pg, and the blue subpixel Pb may have a longer side in the y direction.

Alternatively, a red subpixel Pr, a green subpixel Pg, and a blue subpixel Pb may be sequentially disposed in the y direction. In this case, each of the red subpixel Pr, the green subpixel Pg, and the blue subpixel Pb may have a longer side in the x direction.

However, exemplary embodiments are not limited to an arrangement of such auxiliary subpixels and the shapes thereof. For example, the auxiliary subpixels may be arranged in various configurations, and may have various shapes.

Figure 12:
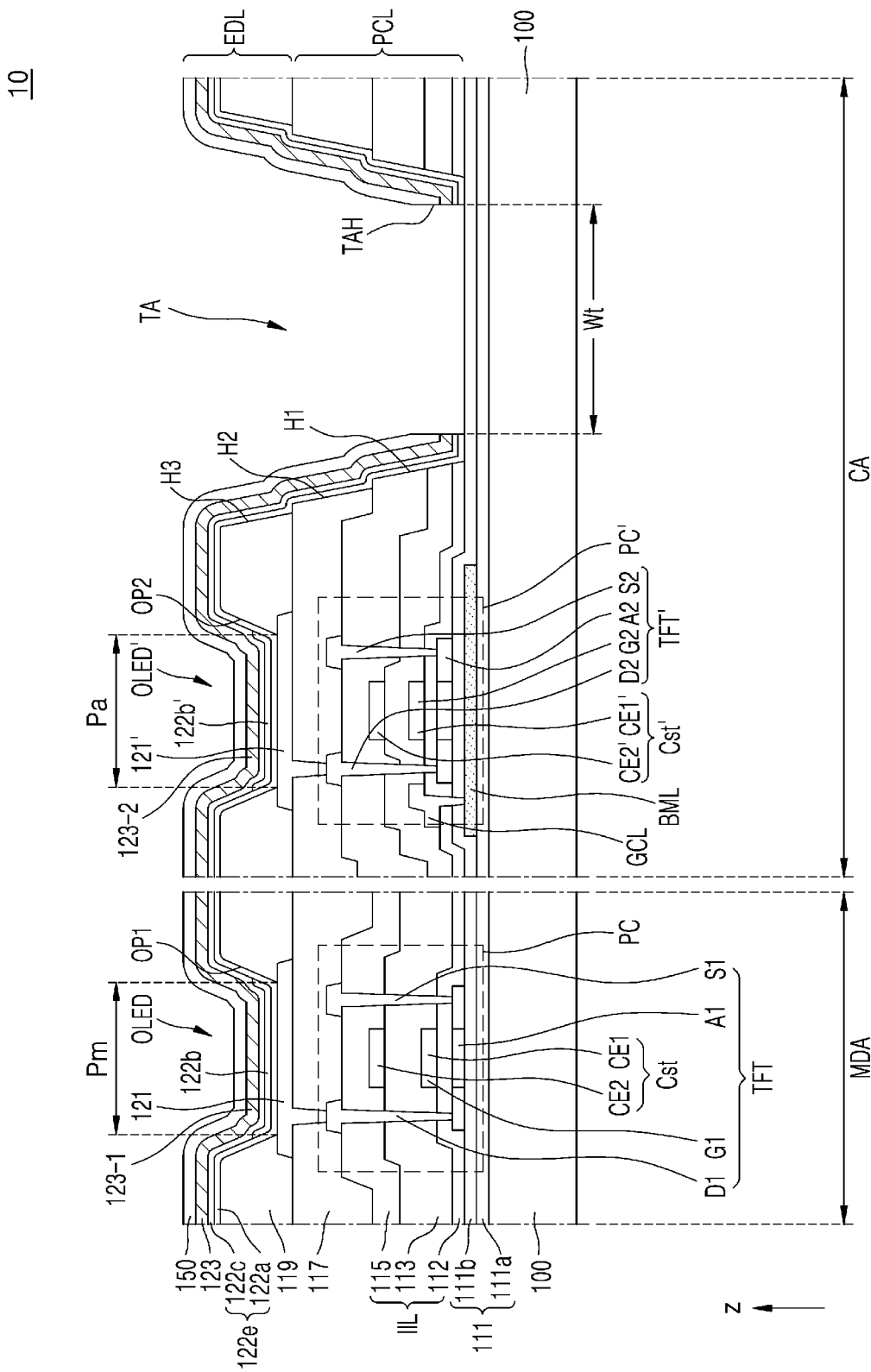
FIG. 12 is a schematic cross-sectional view of a portion of an exemplary embodiment of the display panel of FIG. 2.

FIG. 12 is a schematic cross-sectional view of a portion of another embodiment of the display panel 10 of FIG. 2, that is, the main display area MDA and the component area CA.

Referring to FIG. 12, the display panel 10 includes the main display area MDA and the component area CA. A main subpixel Pm is arranged in the main display area MDA, and an auxiliary subpixel Pa and a transmission area TA are arranged in the component area CA. In the main display area MDA, a main pixel circuit PC including a main thin-film transistor TFT and a main storage capacitor Cst, and a main organic light-emitting diode OLED as a display element connected to the main pixel circuit PC may be arranged. In the component area CA, an auxiliary pixel circuit PC' including an auxiliary thin-film transistor TFT' and an auxiliary storage capacitor Cst', and an auxiliary organic light-emitting diode OLED' as a display element connected to the auxiliary pixel circuit PC' may be arranged.

According to the illustrated exemplary embodiment, an organic light-emitting diode is employed as a display element. However, according to another exemplary embodiment, an inorganic light-emitting diode or a quantum dot light-emitting diode may be employed as a display element.

A structure in which the components included in the display panel 10 are stacked will now be described. The display panel 10 may be a stack of a substrate 100, a buffer layer 111, a circuit layer PCL, and a display element EDL.

As described above, the substrate 100 may include an insulative material, such as glass, quartz, and polymer resin. The substrate 100 may be a rigid substrate or a flexible substrate that is bendable, foldable, or rollable.

The buffer layer 111 may be positioned on the substrate 100 and may reduce or prevent infiltration of a foreign material, moisture, or ambient air from below the substrate 100 and may provide a flat surface on the substrate 100. The buffer layer 111 may include an inorganic material (such as oxide or nitride), an organic material, or an organic and inorganic compound, and may be a single layer or multiple layers of an inorganic material and an organic material. A barrier layer may be between the substrate 100 and the buffer layer 111 in order to prevent infiltration or permeation of ambient air. According to some exemplary embodiments, the buffer layer 111 may include silicon oxide ($SiO_2$) or silicon nitride ($SiN_x$). The buffer layer 111 may include a first buffer layer 111a and a second buffer layer 111b, one of which is stacked on the other.

In the component area CA, a bottom metal layer BML may be between the first buffer layer 111a and the second buffer layer 111b. According to another exemplary embodiment, the bottom metal layer BML may be between the substrate 100 and the first buffer layer 111a. The bottom metal layer BML may be located below the auxiliary pixel circuit PC' and may prevent characteristics of the auxiliary thin-film transistor TFT' from degrading due to light emitted from, for example, a component. The bottom metal layer BML may prevent light that is emitted from the component or the like or heads toward the component from being diffracted through a narrow gap between wires connected to the auxiliary pixel circuit PC'. The bottom metal layer BML may not be disposed in the transmission area TA.

The bottom metal layer BML may be connected to a wire GCL arranged on another layer, via a contact hole. The bottom metal layer BML may receive a static voltage or a signal from the wire GCL. For example, the bottom metal layer BML may receive a driving voltage ELVDD or a scan signal. Due to the bottom metal layer BML receiving a static voltage or a signal, the probability that electrostatic discharge occurs may be significantly reduced. The bottom metal layer BML may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu). The bottom metal layer BML may be a single layer or a multi-layer including the aforementioned materials.

The circuit layer PCL may be on the buffer layer 111, and may include the main and auxiliary pixel circuits PC and PC', a first gate insulating layer 112, a second gate insulating layer 113, an interlayer insulating layer 115, and a planarization layer 117. The main pixel circuit PC may include the main thin-film transistor TFT and the main storage capacitor Cst, and the auxiliary pixel circuit PC' may include the auxiliary thin-film transistor TFT' and the auxiliary storage capacitor Cst'.

The main thin-film transistor TFT and/or the auxiliary thin-film transistor TFT' may be above the buffer layer 111. The main thin-film transistor TFT includes a first semiconductor layer A1, a first gate electrode G1, a first source electrode S1, and a first drain electrode D1, and the auxiliary thin-film transistor TFT' includes a second semiconductor layer A2, a second gate electrode G2, a second source electrode S2, and a second drain electrode D2. The main thin-film transistor TFT may be connected to the main organic light-emitting diode OLED and may drive the main organic light-emitting diode OLED. The auxiliary thin-film transistor TFT' may be connected to the auxiliary organic light-emitting diode OLED' and may drive the auxiliary organic light-emitting diode OLED'.

The first semiconductor layer A1 and the second semiconductor layer A2 may be on the buffer layer 111 and may include polysilicon. According to another exemplary embodiment, the first semiconductor layer A1 and the second semiconductor layer A2 may include amorphous silicon. According to another exemplary embodiment, the first and second semiconductor layers A1 and A2 may include oxide of at least one selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn). The first and second semiconductor layers A1 and A2 may include a channel region, and a source region and a drain region doped with impurities.

The second semiconductor layer A2 may overlap the bottom metal layer BML with the second buffer layer 111b therebetween. According to an exemplary embodiment, a width of the second semiconductor layer A2 may be smaller than a width of the bottom metal layer BML. Accordingly, when projection is performed in a direction substantially perpendicular to the substrate 100 (e.g., when viewed in plan), the second semiconductor layer A2 may entirely overlap the bottom metal layer BML.

The first gate insulating layer 112 may cover the first and second semiconductor layers A1 and A2. The first gate insulating layer 112 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The first gate insulating layer 112 may be a single layer or a multi-layer including the aforementioned inorganic insulating materials.

The first gate electrode G1 and the second gate electrode G2 are located above the first gate insulating layer 112 to overlap the first semiconductor layer A1 and the second semiconductor layer A2, respectively. The first and second gate electrodes G1 and G2 may include molybdenum (Mo), aluminum (Al), copper (Cu), or titanium (Ti), and may each be a single layer or multiple layers. For example, the first and second gate electrodes G1 and G2 may each be a single layer of Mo.

The second gate insulating layer 113 may cover the first gate electrode G1 and the second gate electrode G2. The second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The second gate insulating layer 113 may be a single layer or a multi-layer including the aforementioned inorganic insulating materials.

A first upper electrode CE2 of the main storage capacitor Cst and a second upper electrode CE2' of the auxiliary storage capacitor Cst' may be above the second gate insulating layer 113.

In the main display area MDA, the first upper electrode CE2 may overlap the first gate electrode G1. The first gate electrode G1 and the first upper electrode CE2 overlapping each other with the second gate insulating layer 113 therebetween may form the main storage capacitor Cst. The first gate electrode G1 may be the first lower electrode CE1 of the main storage capacitor Cst.

In the component area CA, the second upper electrode CE2' may overlap the second gate electrode G2. The second gate electrode G2 and the second upper electrode CE2' overlapping each other with the second gate insulating layer 113 therebetween may form the auxiliary storage capacitor Cst'. The first gate electrode G1 may be the second lower electrode CE1' of the auxiliary storage capacitor Cst'.

The first and second upper electrodes CE2 and CE2' may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu), and may each be a single layer or a multi-layer including the aforementioned materials.

The interlayer insulating layer 115 may cover the first upper electrode CE2 and the second upper electrode CE2'. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like. The interlayer insulating layer 115 may be a single layer or a multi-layer including the aforementioned inorganic insulating materials.

When the first gate insulating layer 112, the second gate insulating layer 113, and the interlayer insulating layer 115 are collectively referred to as an inorganic insulating layer IIL, the inorganic insulating layer IIL may have a first hole H1 corresponding to the transmission area TA. The first hole H1 may expose a portion of the upper surface of the buffer layer 111 or the substrate 100. The first hole H1 may overlap an opening of the first gate insulating layer 112, an opening of the second gate insulating layer 113, and an opening of the interlayer insulating layer 115 that correspond to the transmission area TA. These openings of the first gate insulating layer 112, the second gate insulating layer 113, and the interlayer insulating layer 115 may be individually formed through separate processes, or may be simultaneously formed through the same process. When these openings of the first gate insulating layer 112, the second gate insulating layer 113, and the interlayer insulating layer 115 are formed through separate processes, the inner surface of the first hole H1 may not be smooth and may have steps such as a staircase shape.

Alternatively, the inorganic insulating layer IIL may have a groove other than the first hole H1 exposing the buffer layer 111. Alternatively, the inorganic insulating layer IIL may not have the first hole H1 or groove corresponding to the transmission area TA. Because the inorganic insulating layer IIL generally includes an inorganic insulative material having a high light transmittance, even when the inorganic insulating layer IIL does not have a hole or groove corresponding to the transmission area TA, the inorganic insulating layer IIL may have a sufficient transmittance, so that the component 40 of FIG. 2 may transmit/receive a sufficient amount of light.

The first and second source electrodes S1 and S2 and the first and second drain electrodes D1 and D2 are on the interlayer insulating layer 115. Each of the first and second source electrodes S1 and S2 and the first and second drain electrodes D1 and D2 may include a conductive material including Mo, Al, Cu, and Ti, and may be a multi-layer or a single layer including the aforementioned materials. For example, each of the first and second source electrodes S1 and S2 and the first and second drain electrodes D1 and D2 may be a multi-layer of Ti/Al/Ti.

The planarization layer 117 may cover the first and second source electrodes S1 and S2 and the first and second drain electrodes D1 and D2. The planarization layer 117 may have a flat upper surface such that a first pixel electrode 121 and a second pixel electrode 121' are formed in a flat shape on the flat upper surface of the planarization layer 117.

The planarization layer 117 may include an organic material or an inorganic material and may have a single layer structure or a multi-layer structure. The planarization layer 117 may include a commercial polymer such as benzocyclobutene (BCB), polyimide, hexamethyldisiloxane (HMDSO), polymethyl methacrylate (PMMA) or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or the like. The planarization layer 117 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). When the planarization layer 117 is formed, a layer may be formed, and then chemical and mechanical polishing may be performed on the upper surface of the layer such that the upper surface of the layers is flat.

The planarization layer 117 may have a second hole H2 corresponding to the transmission area TA. The second hole H2 may overlap the first hole H1. FIG. 12 illustrates the second hole H2 that is larger than the first hole H1. According to another exemplary embodiment, the planarization layer 117 may cover an edge of the first hole H1 of the inorganic insulating layer IIL, and the second hole H2 may have a smaller area than the area of the first hole H1.

The planarization layer 117 may have a via hole through which one of the first source electrode S1 and the first drain electrode D1 of the main thin-film-transistor TFT is exposed, and the first pixel electrode 121 may contact the first source electrode S1 or the first drain electrode D1 via the via hole and may be electrically connected to the main thin-film-transistor TFT. The planarization layer 117 may include another opening through which one of the second source electrode S2 and the second drain electrode D2 of the second thin-film-transistor TFT' is exposed, and the second pixel electrode 121' may contact the second source electrode S2 or the second drain electrode D2 via the other opening and may be electrically connected to the auxiliary thin-film-transistor TFT'.

The first and second pixel electrodes 121 and 121' may include conductive oxide such as indium tin oxide (ITO), indium zinc oxide (IZO), zinc oxide (ZnO), indium oxide ($In_2O_3$), indium gallium oxide (IGO), or aluminum zinc oxide (AZO). Each of the first and second pixel electrodes 121 and 121' may include a reflection layer including, for example, silver (Ag), magnesium (Mg), aluminum (Al), platinum (Pt), palladium (Pd), gold (Au), nickel (Ni), neodymium (Nd), iridium (Ir), chromium (Cr), or a compound of these materials. For example, each of the first and second pixel electrodes 121 and 121' may include films including ITO, IZO, ZnO, or $In_2O_3$ above/below the aforementioned reflection layer. In this case, each of the first and second pixel electrodes 121 and 121' may have a stack structure of ITO/Ag/ITO.

A pixel defining layer 119 may be arranged on the planarization layer 117 to cover respective edges of the first pixel electrode 121 and the second pixel electrode 121', and may include a first opening OP1 and a second opening OP2 respectively exposing the center portions of the first pixel electrode 121 and the second pixel electrode 121'. The first opening OP1 and the second opening OP2 define the sizes and the shapes of the light-emission areas of the main and auxiliary organic light-emitting diodes OLED and OLED', e.g., main and auxiliary subpixels Pm and Pa.

The pixel defining layer 119 may prevent an electric arc or the like from occurring on the edges of the first and second pixel electrodes 121 and 121' by increasing distances between the edges of the first and second pixel electrodes 121 and 121' and portions of an opposite electrode 123 on the first and second pixel electrodes 121 and 121'. The pixel defining layer 119 may be formed of an organic insulating material, such as polyimide, polyamide, acryl resin, benzocyclobutene, hexamethyldisiloxane (HMDSO), or phenol resin, via spin coating or the like.

The pixel defining layer 119 may have a third hole H3 located in the transmission area TA. The third hole H3 may overlap the first hole H1 and the second hole H2. Due to the first, second, and third holes H1, H2, and H3, the light transmittance in the transmission area TA may be improved. Although the buffer layer 111 continuously extends to correspond to the transmission area TA in FIG. 12, the buffer layer 111 may include a hole located in the transmission area TA. A portion of the opposite electrode 123 to be described later may be arranged on the inner surfaces of the first, second, and third holes H1, H2, and H3.

For example, a first intermediate layer including a first emission layer 122b may be on the first pixel electrode 121, and a second intermediate layer including a second emission layer 122b' may be on the second pixel electrode 121'. The first emission layer 122b and the second emission layer 122b' are arranged within the first opening OP1 and the second opening OP2 of the pixel defining layer 119, respectively, to correspond to the first pixel electrode 121 and the second pixel electrode 121', respectively. The first emission layer 122b and the second emission layer 122b' may include a high molecular weight material or a low molecular weight material, and may emit a red light, a green light, a blue light, or a white light.

An organic functional layer 122e may be above and/or below the first emission layer 122b and the second emission layer 122b'. The organic functional layer 122e may include a first functional layer 122a and/or a second functional layer 122c. Alternatively, the first functional layer 122a or the second functional layer 122c may be omitted.

The first functional layer 122a may be below the first emission layer 122b and the second emission layer 122b'. The first functional layer 122a may be a single layer or multiple layers including an organic material. The first functional layer 122a may be a hole transport layer (HTL) as a single layer. Alternatively, the first functional layer 122a may include a hole injection layer (HIL) and an HTL. The first functional layer 122a may be integrally provided to correspond to the main and auxiliary organic light-emitting diodes OLED and OLED' included in the main display area MDA and the component area CA.

The second functional layer 122c may be above the first emission layer 122b and the second emission layer 122b'. The second functional layer 122c may be a single layer or multiple layers including an organic material. The second functional layer 122c may include an electron transport layer (ETL) and/or an electron injection layer (EIL). The second functional layer 122c may be integrally provided to correspond to the main and auxiliary organic light-emitting diodes OLED and OLED' included in the main display area MDA and the component area CA.

The opposite electrode 123 is above the second functional layer 122c. The opposite electrode 123 may include a conductive material having a low work function. For example, the opposite electrode 123 may include a transparent layer or a semi-transparent layer including, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca) or an alloy of these materials. Alternatively, the opposite electrode 123 may further include a layer, such as ITO, IZO, ZnO, or $In_2O_3$, on the transparent layer or the semi-transparent layer including any of the above-described materials. The opposite electrode 123 may be integrally provided to correspond to the main and auxiliary organic light-emitting diodes OLED and OLED' included in the main display area MDA and the component area CA.

The opposite electrode 123 may include a main subpixel opposite electrode 123-1 arranged in the main subpixel Pm, and an auxiliary subpixel opposite electrode 123-2 arranged in the auxiliary subpixel Pa.

The layers disposed from the first pixel electrode 121 to the opposite electrode 123 arranged in the main display area MDA may form the main organic light-emitting diode OLED. The layers disposed from the second pixel electrode 121' to the opposite electrode 123 arranged in the component area CA may form the auxiliary organic light-emitting diode OLED'.

An upper layer 150 including an organic material may be on the opposite electrode 123. The upper layer 150 may be provided to protect the opposite electrode 123 and also increase light extraction efficiency. The upper layer 150 may include an organic material having a higher refractive index than the opposite electrode 123. Alternatively, the upper layer 150 may be a stack of layers having different refractive indexes. For example, the upper layer 150 may be provided by stacking a high refractive index layer, a low refractive index layer, and a high refractive index layer in this stated order. In this case, the high refractive index layer may have a refractive index of about 1.7 or more, and the low refractive index layer may have a refractive index of about 1.3 or less.

The upper layer 150 may additionally include lithium fluoride (LiF). Alternatively, the upper layer 150 may include an inorganic insulating material, such as silicon oxide ($SiO_2$) or silicon nitride ($SiN_x$).

The first functional layer 122a, the second functional layer 122c, the opposite electrode 123, and the upper layer 150 may include a transmission hole TAH corresponding to the transmission area TA. In other words, the first functional layer 122a, the second functional layer 122c, the opposite electrode 123, and the upper layer 150 may include openings corresponding to the transmission area TA, respectively. These openings may have substantially the same areas. For example, the area of the opening of the opposite electrode 123 may be substantially the same as that of the transmission hole TAH.

The transmission hole TAH corresponding to the transmission area TA may be understood as the transmission hole TAH overlapping the transmission area TA. In this case, the transmission hole TAH may have a smaller area than the first hole H1 included in the inorganic insulating layer IIL. To this end, FIG. 12 illustrates that a width Wt of the transmission hole TAH is smaller than a width of the first hole H1. The area of the transmission hole TAH may be defined as the area of the narrowest opening from among the openings that form the transmission hole TAH. The area of the first hole H1 may be defined as the area of the narrowest opening from among the openings that form the first hole H1.

A portion of the opposite electrode 123 may not be disposed in the transmission area TA due to the transmission hole TAH, and thus the light transmittance in the transmission area TA may be significantly increased. The opposite electrode 123 including the transmission hole TAH may be formed using various methods. According to an exemplary embodiment, after a material used to form the opposite electrode 123 is deposited on the entire surface of the substrate 100, a portion of the deposited material that corresponds to the transmission area TA is removed by a laser-lift-off method, and thus the opposite electrode 123 having the transmission hole TAH may be formed. According to another exemplary embodiment, the opposite electrode 123 having the transmission hole TAH may be formed by a metal self patterning (MSP) method. According to another exemplary embodiment, the opposite electrode 123 having the transmission hole TAH may be formed by a deposition method using a fine metal mask (FMM).

Figure 13:
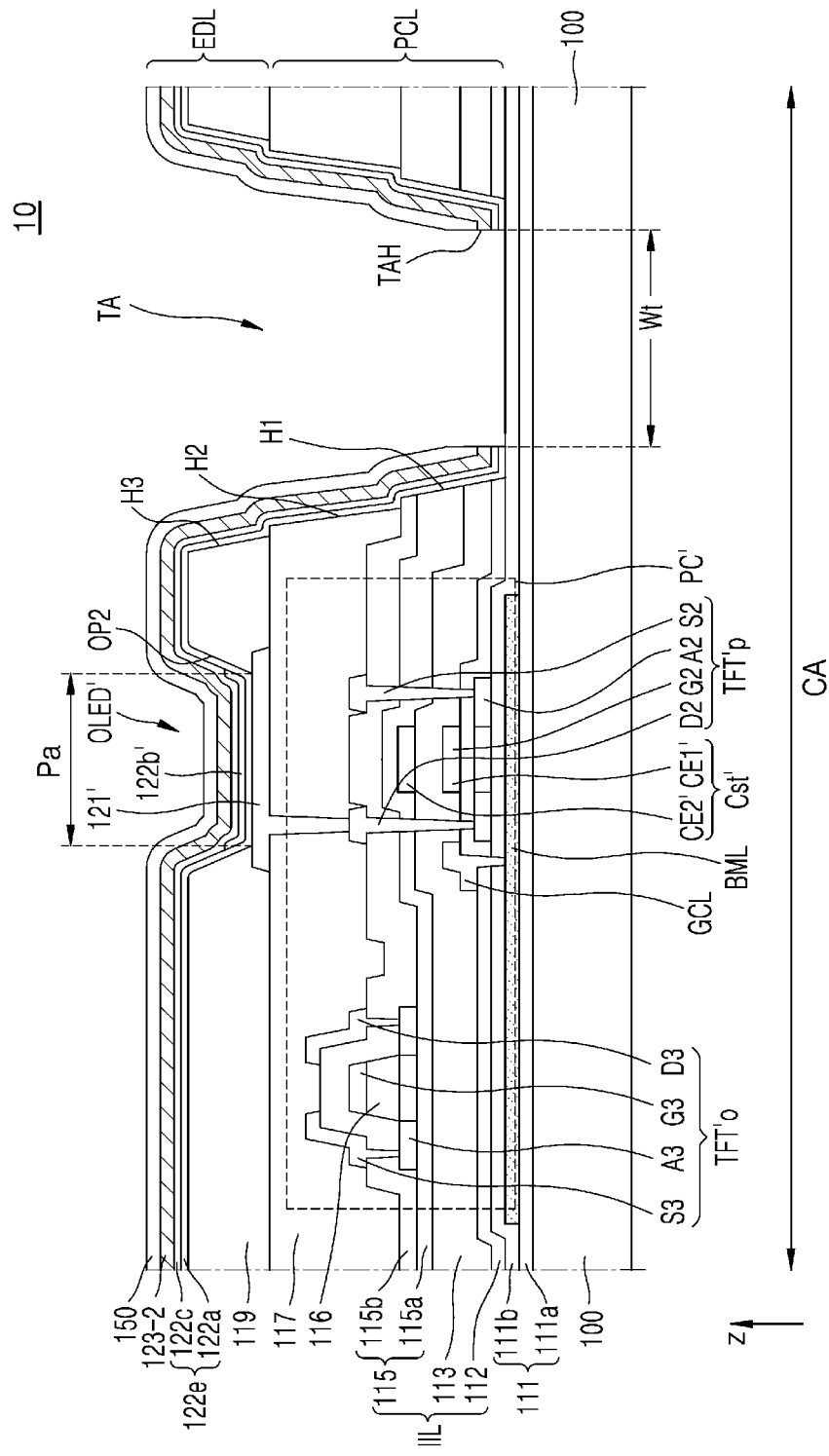
FIG. 13 is a schematic cross-sectional view of a portion of another embodiment of the display panel of FIG. 2.

FIG. 13 is a schematic cross-sectional view of a portion of another embodiment of the display panel 10 of FIG. 2.

The exemplary embodiment of FIG. 13 is different from that of FIG. 12 in that an auxiliary pixel circuit PC' of the display panel 10 includes a thin-film transistor including an oxide semiconductor and a thin-film transistor including polysilicon. Although FIG. 13 illustrates only the component area CA, the above-described structure of the auxiliary pixel circuit PC' of the component area CA may be equally applied to a main pixel circuit PC of the main display area MDA.

The pixel circuit PC' of the display panel 10 may include a first thin-film transistor TFTp' including a second semiconductor layer A2 including polycrystalline silicon, and a second thin-film transistor TFTo' including a third semiconductor layer A3 including an oxide semiconductor.

The first thin-film transistor TFTp' includes the second semiconductor layer A2, a second gate electrode G2, a second source electrode S2, and a second drain electrode D2. The first thin-film transistor TFTp' may be substantially the same as the auxiliary thin-film transistor TFT' described above with reference to FIG. 12, and the second semiconductor layer A2 of the first thin-film transistor TFTp' may include polycrystalline silicon.

A circuit layer PCL according to the illustrated exemplary embodiment is different from the circuit layer PCL of FIG. 12 in that an interlayer insulating layer 115 includes a first interlayer insulating layer 115a and a second interlayer insulating layer 115b.

The second thin-film transistor TFTo' may include the third semiconductor layer A3, a third gate electrode G3, a third source electrode S3, and a third drain electrode D3. The third semiconductor layer A3 may be on the first interlayer insulating layer 115a. In other words, the third semiconductor layer A3 and the second semiconductor layer A2 may be on different layers. The third semiconductor layer A3 may include a channel region, and a source region and a drain region respectively arranged on both sides of the channel region. According to some exemplary embodiments, the third semiconductor layer A3 may include an oxide semiconductor. For example, the third semiconductor layer A3 may include Zn oxide, In—Zn oxide, Ga—In—Zn oxide, or the like as a Zn oxide-based material. Alternatively, the third semiconductor layer A3 may include an In—Ga—Zn—O (IGZO), In—Sn—Zn—O (ITZO), or In—Ga—Sn—Zn—O (IGTZO) semiconductor containing a metal, such as In, Ga, or Sn, in ZnO.

The source region and the drain region of the third semiconductor layer A3 may be formed by making an oxide semiconductor be conductive by controlling the carrier concentration of an oxide semiconductor. For example, the source region and the drain region of the third semiconductor layer A3 may be formed by increasing the carrier concentration of an oxide semiconductor by performing plasma processing on the oxide semiconductor, the plasma processing using a hydrogen (H)-based gas, a fluorine (F)-based gas, or a combination thereof.

The third gate electrode G3 may overlap the channel region of the third semiconductor layer A3, and the third gate insulating layer 116 may be between the third semiconductor layer A3 and the third gate electrode G3. In other words, the third gate electrode G3 may be insulated from the third semiconductor layer A3 by the third gate insulating layer 116. The third gate insulating layer 116 may be patterned according to the shape of the third gate electrode G3.

The third gate insulating layer 116 may include an inorganic material including oxide or nitride. For example, the third gate insulating layer 116 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like. The third gate electrode G3 may be on the third gate insulating layer 116, may include molybdenum (Mo), copper (Cu), titanium (Ti), or the like, and may be a single layer or multiple layers.

The second interlayer insulating layer 115b may cover the third gate electrode G3 of the third thin-film transistor TFT3 and may be on the upper surface of the substrate 100. The third source electrode S3 and the third drain electrode D3 may be above the second interlayer insulating layer 115b.

The third source electrode S3 and the third drain electrode D3 may contact the source region and the drain region of the third semiconductor layer A3, respectively, via a contact hole that penetrates the second interlayer insulating layer 115b. Each of the third source electrode S3 and the third drain electrode D3 may include a conductive material including Mo, Al, Cu, Ti, etc., and may be a multi-layer or a single layer including the aforementioned materials.

Because a thin-film transistor including a semiconductor layer including polycrystalline silicon has high reliability, a high-quality display panel may be implemented by employing a driving thin-film transistor.

Because an oxide semiconductor has high carrier mobility and a low leakage current, a voltage drop is not high even when a driving time is long. In other words, because a change in the color of an image according to a voltage drop is not high even during low frequency driving, low frequency driving is possible. Because an oxide semiconductor has a low leakage current as described above, the oxide semiconductor may be used in at least one of the thin-film transistors other than the driving thin-film transistor, thereby preventing current leakage and also reducing power consumption.

Figure 14:
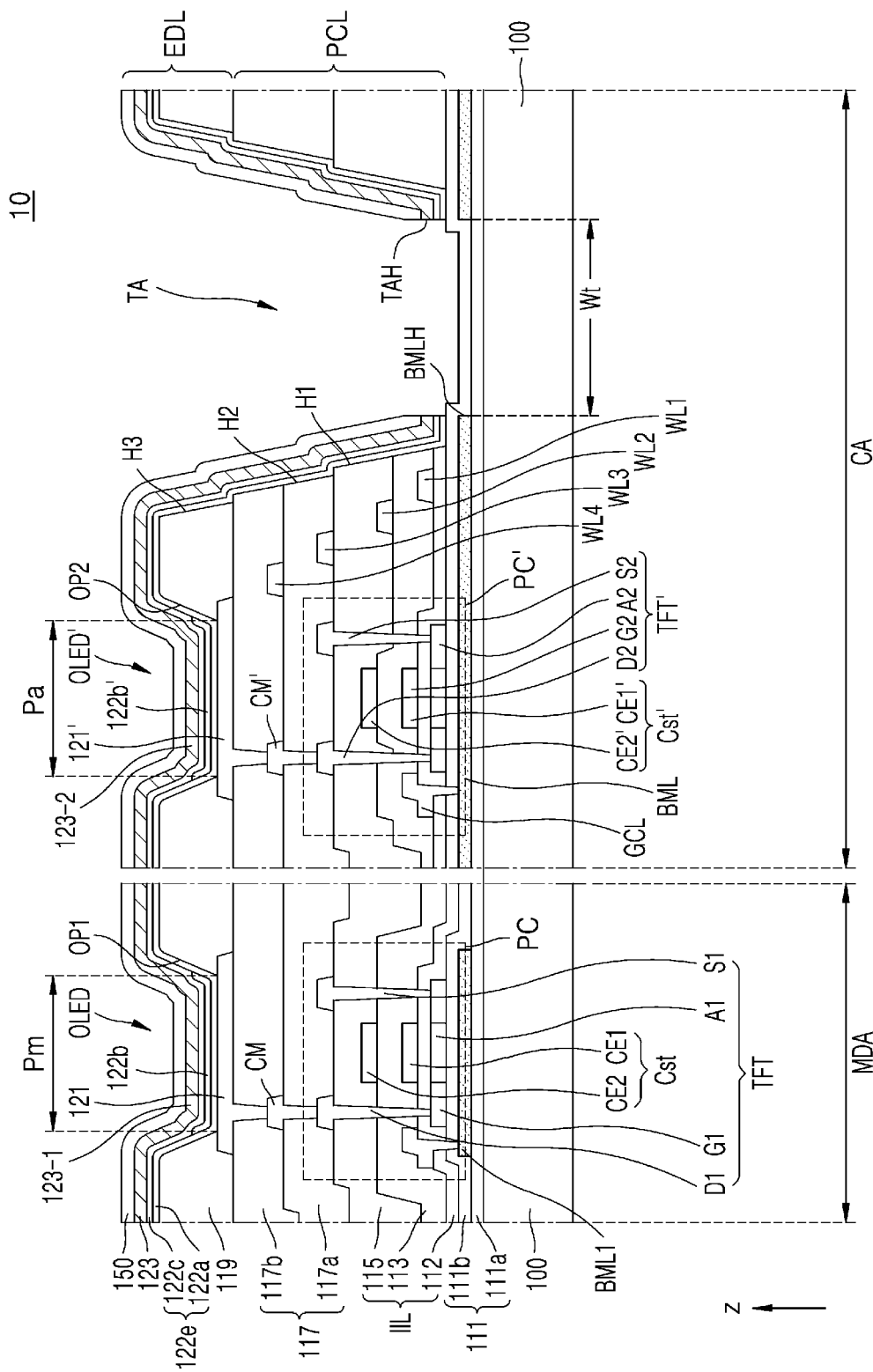
FIG. 14 is a schematic cross-sectional view of a portion of another embodiment of the display panel of FIG. 2.

FIG. 14 is a schematic cross-sectional view of a portion of another embodiment of the display panel 10 of FIG. 2. The same reference numerals in FIGS. 12 and 14 denote the same elements, and thus repeated descriptions thereof are omitted.

The exemplary embodiment of FIG. 14 is different from the exemplary embodiment of FIG. 12 in that a planarization layer 117 includes a first planarization layer 117a and a second planarization layer 117b, a first metal layer BML1 is arranged in the main display area MDA, and a transmission area TA is defined by the bottom hole BMLH of the bottom metal layer BML.

A circuit layer PCL of the display panel 10 may include the first planarization layer 117a and the second planarization layer 117b. Accordingly, a conductive pattern such as a wire may be provided between the first planarization layer 117a and the second planarization layer 117b, and thus may be favorable to high integration density of the display panel 10.

The first planarization layer 117a may cover the main and auxiliary pixel circuits PC and PC'. The second planarization layer 117b may be on the first planarization layer 117a and have a flat upper surface such that the first and second pixel electrodes 121 and 121' are formed in a flat shape. Each of the first and second planarization layers 117a and 117b may include an organic material or an inorganic material and may have a single layer structure or a multi-layer structure. Each of the first and second planarization layers 117a and 117b may include a commercial polymer such as benzocyclobutene (BCB), polyimide, hexamethyldisiloxane (HMDSO), PMMA, or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or the like. Each of the first and second planarization layers 117a and 117b may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). When the first and second planarization layers 117a and 117b are formed, a layer may be formed, and then chemical and mechanical polishing may be performed on the upper surface of the layer such that the upper surface of the layer is flat.

The main and auxiliary organic light-emitting diodes OLED and OLED' are on the second planarization layer 117b. The first and second pixel electrodes 121 and 121' of the main and auxiliary organic light-emitting diodes OLED and OLED' may be connected to the main and auxiliary pixel circuits PC and PC' via connecting electrodes CM and CM' arranged on the planarization layer 117.

The connecting electrodes CM and CM' may be between the first and second planarization layers 117a and 117b. The connecting electrodes CM and CM' may include a conductive material including Mo, Al, Cu, Ti, etc., and may be formed as a multi-layer or a single layer including the aforementioned materials. For example, each of the connecting electrodes CM and CM' may be a multi-layer of Ti/Al/Ti.

The display panel 10 may include the first metal layer BML1 arranged in the main display area MDA. The first metal layer BML1 may be arranged between the substrate 100 and the main pixel circuit PC to correspond to the main thin-film transistor TFT of the main display area MDA. According to an exemplary embodiment, the first metal layer BML1 may be arranged to correspond to a portion of the main display area MDA. Alternatively, the first metal layer BML1 may be arranged to correspond to the entire main display area MDA. Alternatively, the first metal layer BML1 may be integrated with the bottom metal layer BML of the component area CA. A static voltage or a signal may be applied to the first metal layer BML1, and thus damage to the main pixel circuit PC due to electrostatic discharge may be prevented.

The first metal layer BML1 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu). The first metal layer BML1 may be a single layer or a multi-layer including the aforementioned materials.

The bottom metal layer BML of the component area CA may correspond to the entire component area CA. In this case, the bottom metal layer BML may include the bottom-hole BMLH overlapping the transmission area TA. According to some exemplary embodiments, the shape and the size of the transmission area TA may be defined by the shape and the size of the bottom-hole BMLH.

The display panel 10 may include first, second, third, and fourth wires WL1, WL2, WL3, and WL4 arranged on different layers.

The first wire WL1 may be on the first gate insulating layer 112, which is on the same layer on which the first and second gate electrodes G1 and G2 are arranged, and may function as a scan line that transmits a scan signal to the main and auxiliary pixel circuits PC and PC'. Alternatively, the first wire WL1 may function as a light-emission control line.

The second wire WL2 may be on the second gate insulating layer 113, which is on the same layer on which the first and second upper electrodes CE2 and CE2' of the main and auxiliary storage capacitors Cst and Cst' are arranged, and may function as the scan line SL and/or the light-emission control line EL.

The third wire WL3 may be on the interlayer insulating layer 115 and may function as the data line DL for transmitting a data signal to the main and auxiliary pixel circuits PC and PC'. Alternatively, the third wire WL3 may function as a driving voltage line that transmits a driving voltage to the main and auxiliary pixel circuits PC and PC'.

The fourth wire WL4 may be on the planarization layer 117, which is on the same layer on which the connecting electrodes CM and CM' are arranged, and may function as the driving voltage line that transmits a driving voltage to the main and auxiliary pixel circuits PC and PC' or the data line DL for transmitting a data signal to the main and auxiliary pixel circuits PC and PC'.

Each of the first, second, third, and fourth wires WL1, WL2, WL3, and WL4 may include a conductive material including molybdenum (Mo), aluminum (Al), copper (Cu), and titanium (Ti), and may be a multi-layer or a single layer including the aforementioned materials. Alternatively, each of the first, second, third, and fourth wires WL1, WL2, WL3, and WL4 may include a transparent conductive material. The first, second, third, and fourth wires WL1, WL2, WL3, and WL4 may include the same material or may include different materials.

Figure 15:
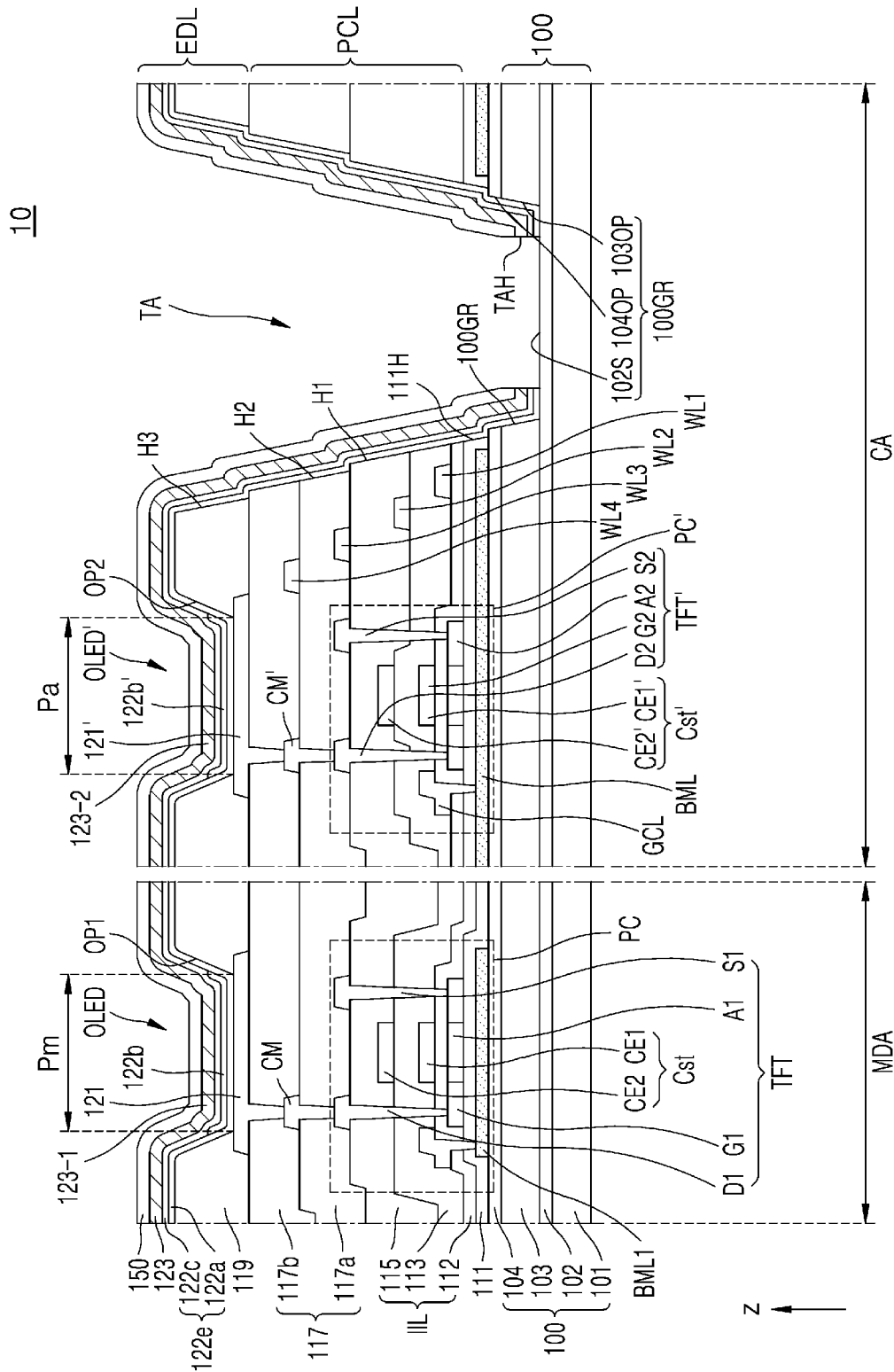
FIG. 15 is a schematic cross-sectional view of a portion of another embodiment of the display panel of FIG. 2.

FIG. 15 is a schematic cross-sectional view of a portion of another embodiment of the display panel 10 of FIG. 2.

Reference numerals in FIG. 15 that are the same as the reference numerals in FIG. 12 denote the same elements, and thus repeated descriptions thereof are omitted. The exemplary embodiment of FIG. 15 is different from that of FIG. 12 in that a substrate 100 has a groove 100GR corresponding to a transmission area TA.

The substrate 100 of the display panel 10 may include the first base layer 101, the first inorganic barrier layer 102, the second base layer 103, and the second inorganic barrier layer 104 which are sequentially stacked. Each of the first and second base layers 101 and 103 may include polymer resin as described above. Each of the first inorganic barrier layer 102 and the second inorganic barrier layer 104 prevents permeation of external impurities, and thus may include an inorganic material such as silicon oxide ($SiO_2$), silicon nitride ($SiN_x$), or silicon oxynitride (SiON) and may have a single layer structure or a multi-layer structure.

According to the illustrated exemplary embodiment, the substrate 100 may have the groove 100GR to correspond to the transmission area TA. The groove 100GR may mean an area in which a portion of the substrate 100 has been removed in a downward direction (e.g., −z direction) and a portion thereof remains. For example, the first base layer 101 and the first inorganic barrier layer 102 may continuously extend over the transmission area TA. The second base layer 103 and the second inorganic barrier layer 104 may have openings 103OP and 104OP, respectively, corresponding to the transmission area TA. Due to this shape, the substrate 100 may include the groove 100GR. In other words, the groove 100GR of the substrate 100 may include the opening 104OP of the second inorganic barrier layer 104, the opening 103OP of the second base layer 103, and an upper surface 102S of the first inorganic barrier layer 102 exposed through the openings 104OP and 103OP.

The substrate 100 may include the groove 100GR in various shapes. For example, a portion of the upper surface (e.g., +z direction) of the first inorganic barrier layer 102 may be removed, whereas a lower surface (e.g., −z direction) of the second base layer 103 may remain without being removed. Due to the groove 100GR of the substrate 100, a thickness of the substrate 100 in the transmission area TA may decrease, and accordingly, the light transmittance in the transmission area TA may be significantly increased. According to the illustrated exemplary embodiment, a buffer layer 111 may include a buffer hole 111H corresponding to the transmission area TA.

In the illustrated exemplary embodiments, in order to increase the light transmittance of the transmission area TA, the substrate 100 includes a groove, or the buffer layer 111, the inorganic insulating layer IIL, the planarization layer 117, and the pixel defining layer 119 respectively include the buffer hole 111H and the first, second, and third holes H1, H2, and H3 each corresponding to the transmission area TA. However, exemplary embodiments are not limited thereto.

Because the substrate 100, the buffer layer 111, the inorganic insulating layer IIL, the planarization layer 117, and the pixel defining layer 119 of the display panel 10 include a material having a high light transmittance, the buffer hole 111H and the first, second, and third holes H1, H2, and H3 may not be included according to the types of the components 40 of FIG. 2 arranged below the component area CA.

Figure 16A:
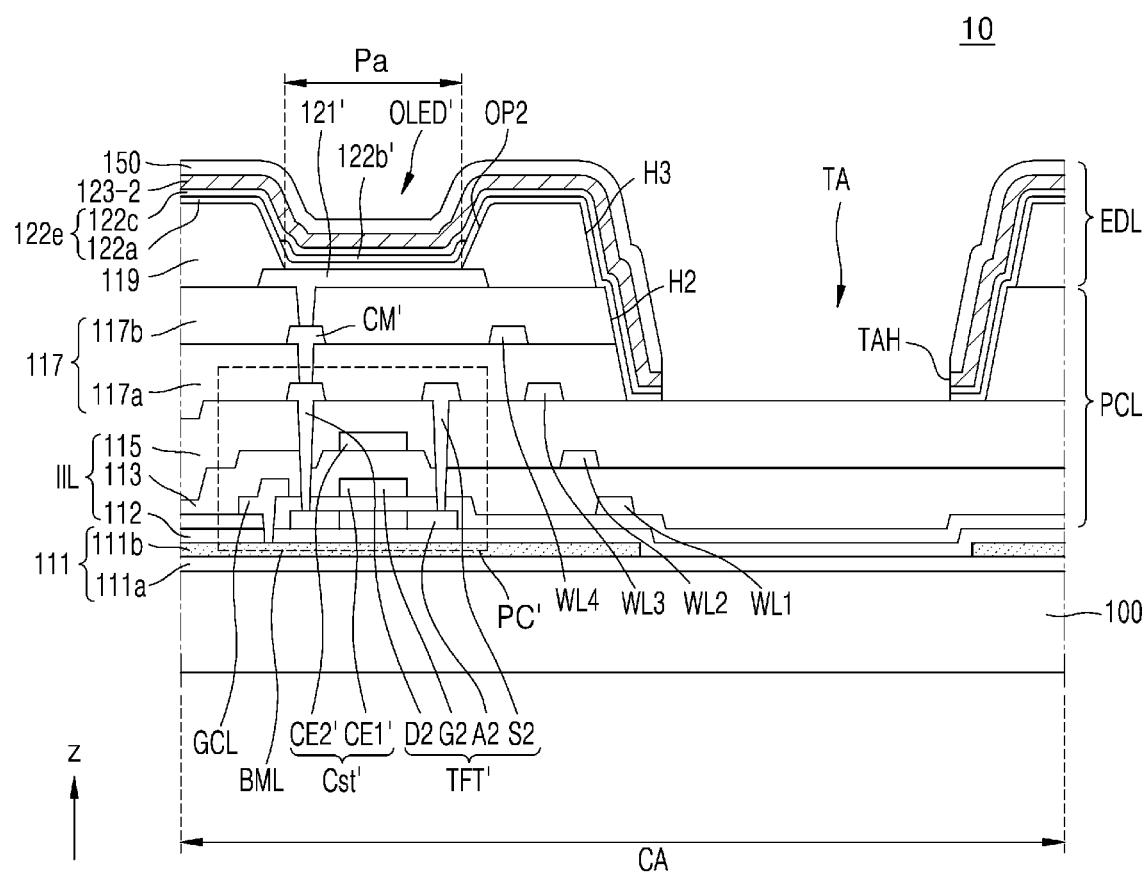
FIG. 16A is a schematic cross-sectional view of a portion of another embodiment of the display panel of FIG. 2.
Figure 16B:
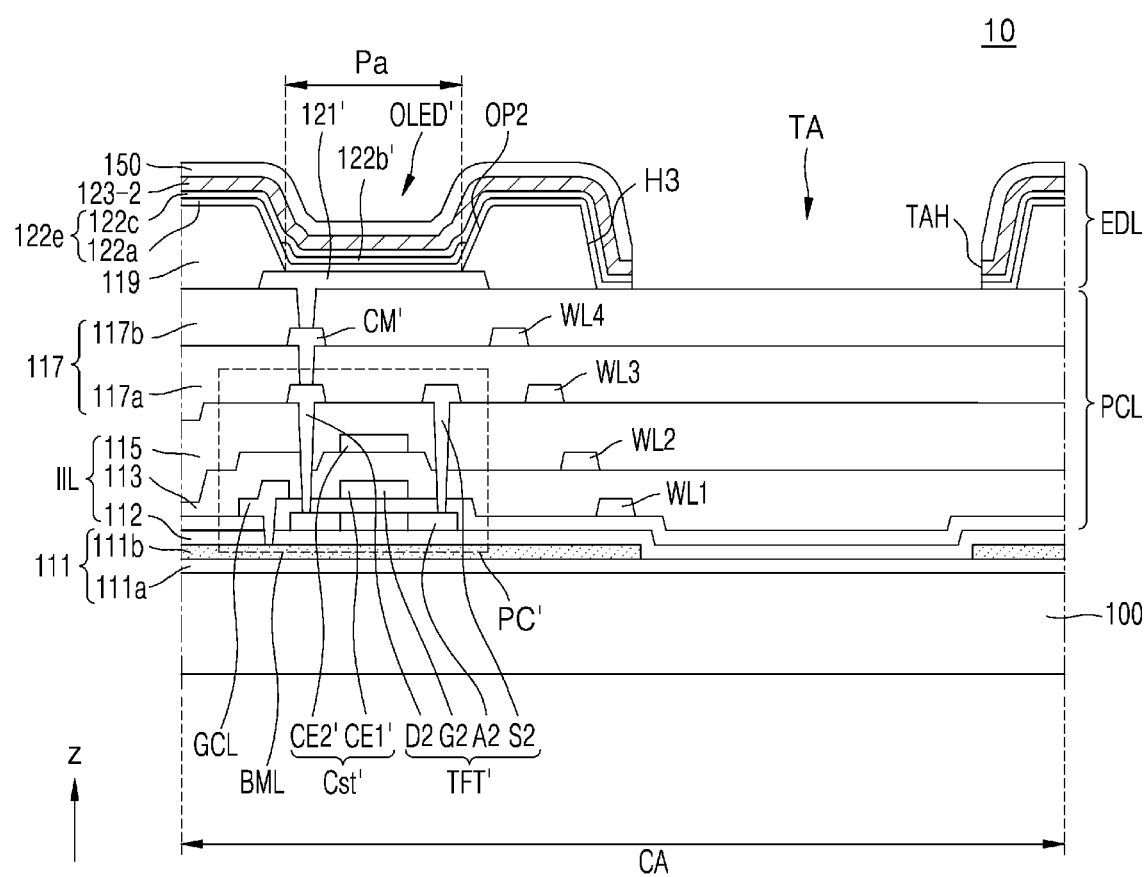
FIG. 16B is a schematic cross-sectional view of a portion of another embodiment of the display panel of FIG. 2.
Figure 16C:
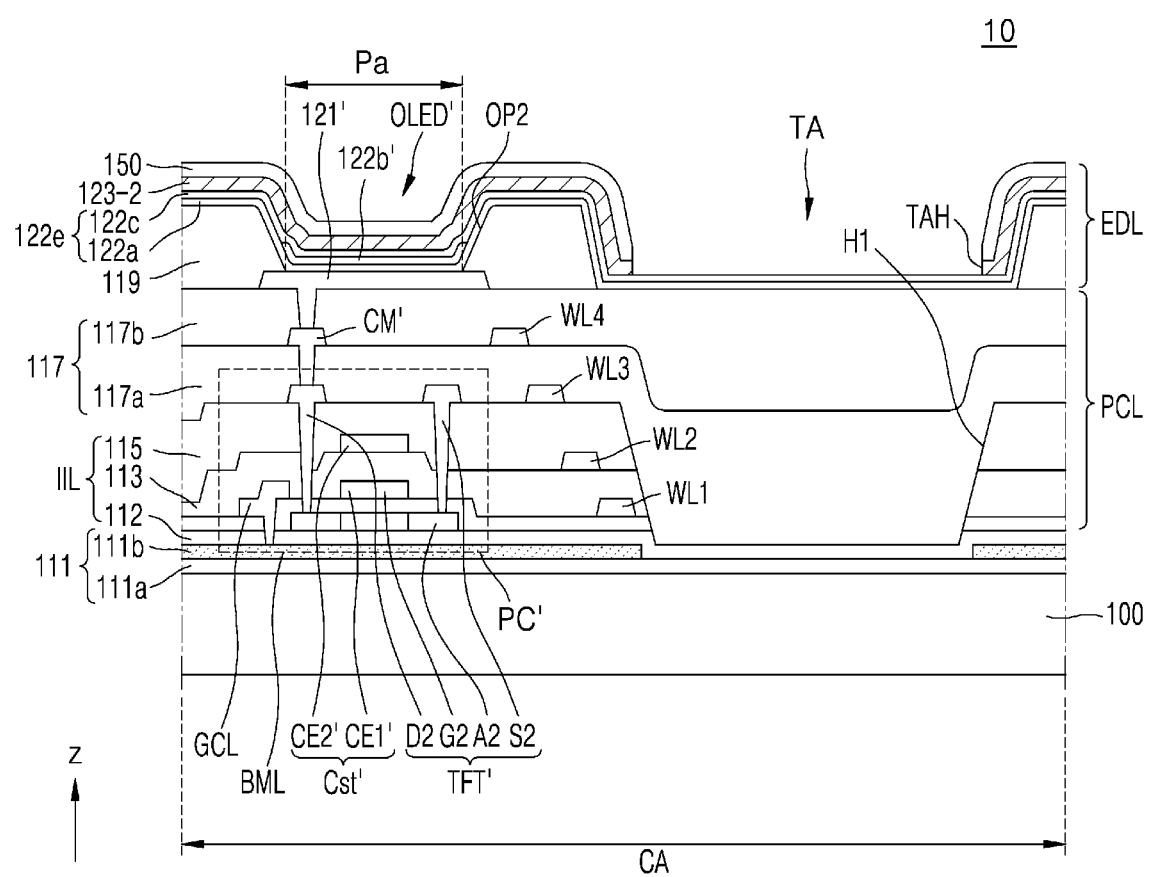
FIG. 16C is a schematic cross-sectional view of a portion of another embodiment of the display panel of FIG. 2.

FIG. 16A is a schematic cross-sectional view of a portion of another embodiment of the display panel 10 of FIG. 2. FIG. 16B is a schematic cross-sectional view of a portion of another embodiment of the display panel 10 of FIG. 2. FIG. 16C is a schematic cross-sectional view of a portion of the display panel 10 of FIG. 2. In detail, FIGS. 16A, 16B, and 16C illustrate respective portions of component areas CA of the display panels 10 according to various exemplary embodiments.

Referring to FIG. 16A, an inorganic insulating layer IIL may continuously extend to correspond to a transmission area TA. Alternatively, at least one of a first gate insulating layer 112, a second gate insulating layer 113, and an interlayer insulating layer 115 of the inorganic insulating layer IIL may continuously extend to correspond to the transmission area TA. A planarization layer 117 and a pixel defining layer 119 may respectively include a second hole H2 and a third hole H3 exposing the upper surface of the inorganic insulating layer IIL, to correspond to the transmission area TA.

Referring to FIG. 16B, the inorganic insulating layer IIL and the planarization layer 117 may continuously extend to correspond to the transmission area TA, and the pixel defining layer 119 may include the third hole H3 exposing the upper surface of the inorganic insulating layer IIL to correspond to the transmission area TA. The pixel defining layer 119 may also continuously extend to correspond to the transmission area TA.

Referring to FIG. 16C, an inorganic insulating layer IIL may include a first hole H1 corresponding to the transmission area TA, and a first planarization layer 117a and a second planarization layer 117b may fill the first hole H1. According to some exemplary embodiments, the first planarization layer 117a and the second planarization layer 117b may include a transparent organic material having a similar refractive index to the refractive indexes of the substrate 100 and the buffer layer 111. For example, the first planarization layer 117a and the second planarization layer 117b may include a siloxane-based organic material having a high light transmittance. Examples of the siloxane-based organic material may include hexamethyldisiloxane, octamethyltrisiloxane, decamethyltetrasiloxane, dodecamethylpentasiloxane, and polydimethylsiloxanes.

Due to the planarization layer 117, which has a similar refractive index to the refractive indexes of the substrate 100 and the buffer layer 111, being arranged to correspond to the transmission area TA, a loss of the light transmittance of the transmission area TA due to a difference between the refractive indexes may be reduced.

Figure 17:
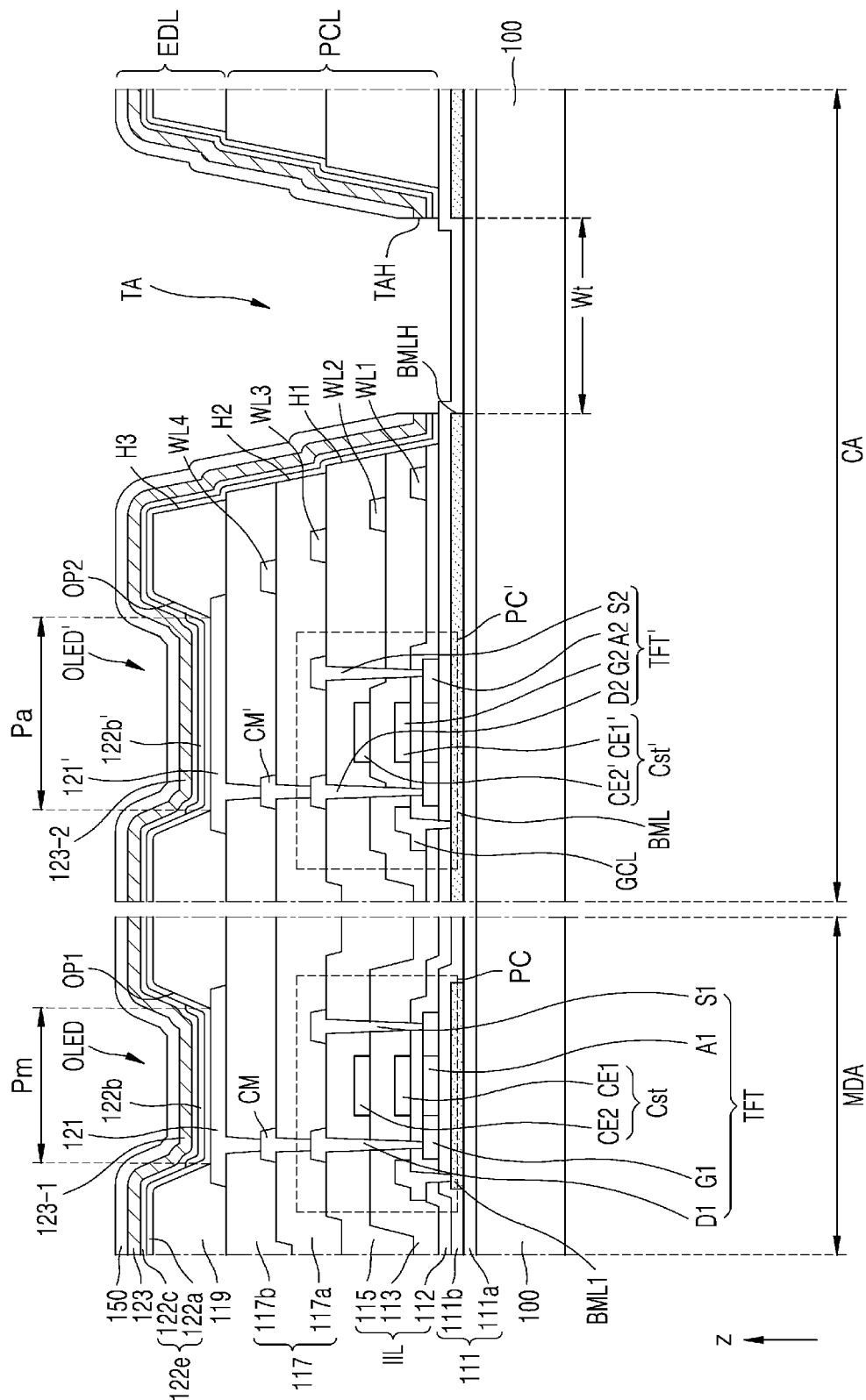
FIG. 17 is a schematic cross-sectional view of a portion of another embodiment of the display panel of FIG. 2.

FIG. 17 is a schematic cross-sectional view of a portion of another embodiment of the display panel of FIG. 2. The same reference numerals in FIGS. 12 and 17 denote the same elements, and thus repeated descriptions thereof are omitted for descriptive convenience.

Referring to FIG. 17, the size of an auxiliary subpixel Pa may be greater than that of a main subpixel Pm representing the same color as the auxiliary subpixel Pa. In other words, a second opening OP2 of the pixel defining layer 119 that defines the size of the auxiliary subpixel Pa may be larger than the first opening OP2 of the pixel defining layer 119 that defines the size of the main subpixel Pm.

Because the component area CA includes a transmission area TA, when the auxiliary subpixel Pa has the same size as the main subpixel Pm and the same current is applied to the main and auxiliary organic light-emitting diodes OLED and OLED' used in the main subpixel Pm and the auxiliary subpixel Pa, the brightness of the component area CA, taken as a whole, may be reduced. When more current is applied to the auxiliary organic light-emitting diode OLED' arranged in the component area CA in order to compensate for the brightness of the component area CA, the auxiliary organic light-emitting diode OLED' may be easily degraded.

According to the illustrated exemplary embodiment, the auxiliary subpixels Pa in the component area CA have greater sizes than the main subpixels Pm representing the same color as the auxiliary subpixels Pa, thereby preventing degradation of the auxiliary organic light-emitting diodes OLED' and also compensating for the brightness of the component area CA. To this end, the component area CA may employ a pixel arrangement structure in which auxiliary subpixels Pa having large sizes may be included.

Figure 18:
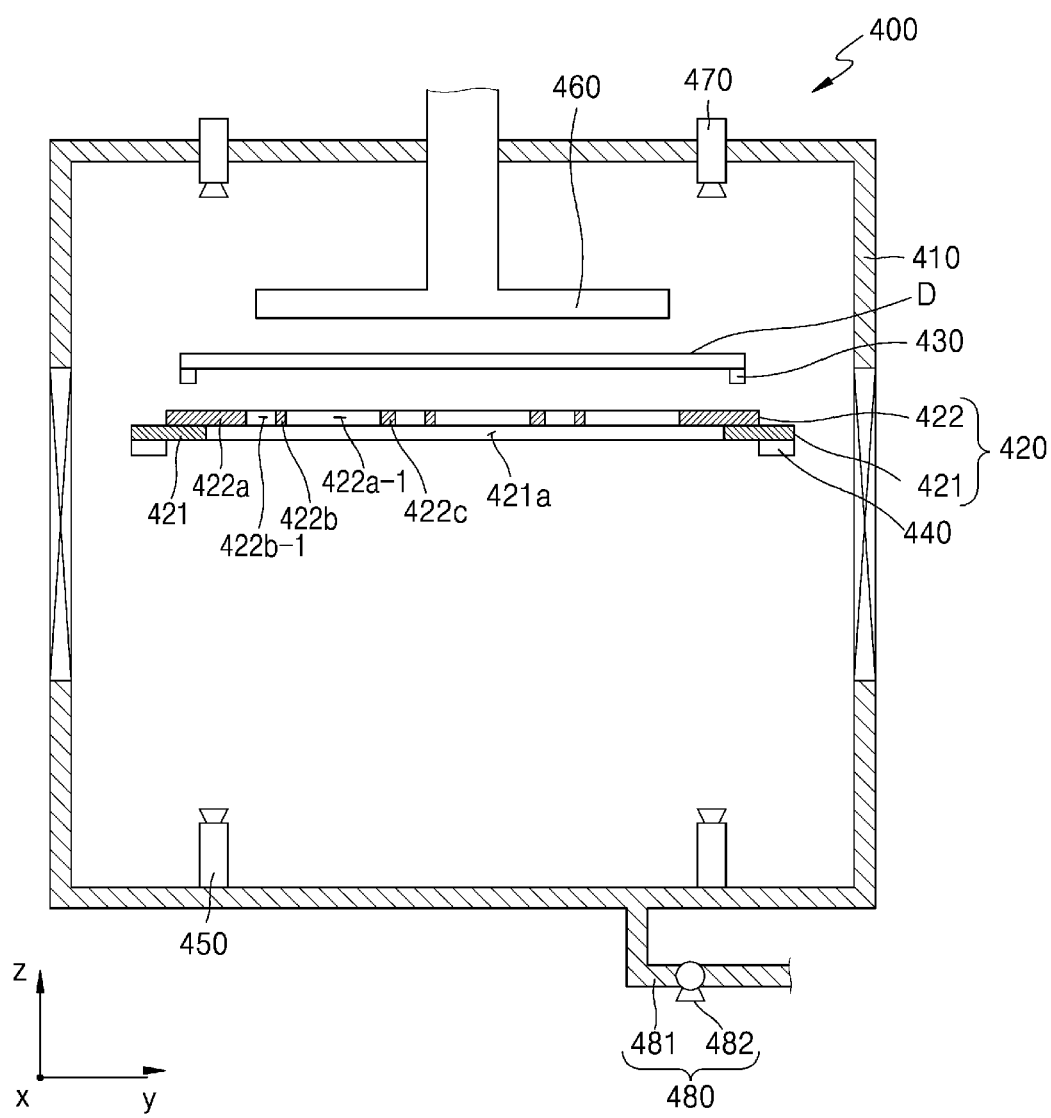
FIG. 18 is a cross-sectional view of an exemplary embodiment of an apparatus for manufacturing a display device.

FIG. 18 is a cross-sectional view of an exemplary embodiment of an apparatus 400 for manufacturing a display device.

Referring to FIG. 18, a display device may be manufactured by the apparatus 400 for manufacturing a display device.

The apparatus 400 may include a chamber 410, the mask assembly 420, a first support 430, a second support 440, a deposition source 450, a magnetic force generator 460, a vision unit 470, and a pressure adjuster 480.

The chamber 410 may have a space formed therein, and a portion thereof may be formed to have an opening. A gate valve 411 may be arranged in the opening of the chamber 410 to be opened or closed.

The mask assembly 420 may be optionally arranged within the chamber 410. The mask assembly 420 may include a mask frame 421 and a mask sheet 422.

The mask frame 421 may be formed by connecting a plurality of frames to each other, and may include an opening therein. In this case, the mask frame 421 may include one opening or a plurality of openings separated from each other. In this case, the mask frame 421 may have a lattice shape such as a window frame. For convenience of description, a case where the mask frame 421 includes a single opening will now be focused on and described in more detail.

The mask sheet 422 may be stretched by a tensile force and may be fixed to the mask frame 421. The mask sheet 422 may have an opening through which a deposition material passes. One mask sheet 422 or a plurality of mask sheets 422 may be included. When one mask sheet 422 is included, the mask sheet 422 may be arranged on the mask frame 421. According to another exemplary embodiment, when a plurality of mask sheets 422 are included, the plurality of mask sheets 422 may be arranged on the mask frame 421 to be adjacent to each other along one side of the mask frame 421. For example, the plurality of mask sheets 422 may be arranged adjacent to each other in an x direction or a y direction of FIG. 18. For convenience of description, a case where a single mask sheet 422 is included will now be focused on and described in more detail.

The mask assembly 420 may further include a support frame arranged on the mask frame 421, in addition to the mask frame 421 and the mask sheet 422. The support frame may be arranged in the opening of the mask frame 421. When a plurality of mask sheets 422 are included, the support frame may shield a gap between adjacent mask sheets 422 or may be arranged in a direction substantially perpendicular to a lengthwise direction of the mask sheets 422. According to another exemplary embodiment, when one mask sheet 422 is included, the support frame may support the mask frame 422 by being arranged to overlap a structure arranged within the mask frame 422. For convenience of description, a case where the mask frame 420 does not include support frames will now be focused on and described in detail.

The mask assembly 420 may be manufactured by coupling the mask sheet 422 onto the mask frame 421. The mask sheet 422 may be stretched by a tensile force and may be fixed to the mask frame 421 by welding.

The substrate 100 may be seated on the first support 430. In this case, the first support 430 may adjust a location of the substrate 100. For example, the first support 430 may include a UVW stage.

The mask assembly 420 may be seated on the second support 440. In this case, the second support 440 is able to adjust a location of the mask assembly 420, similar to the first support 430.

At least one of the first support 430 and the second support 440 may ascend or descend within the chamber 410. In this case, at least one of the first support 430 and the second support 440 may adjust a gap between a display substrate D and the mask frame 421.

The deposition material may be accommodated in the deposition source 450 and then vaporized or sublimed and provided to the chamber 410. The deposition source 450 may include a heater therein, and vaporize or sublime the deposition material by heating the deposition material within the deposition source 450 according to an operation of the heater. In this case, the deposition source 450 may be arranged at the center or the corner of the chamber 410. For convenience of description, a case where the deposition source 450 is arranged on a corner of the chamber 410 will now be focused on and described in detail.

The magnetic force generator 460 may be arranged within the chamber 410 and may make the substrate 100 and the mask assembly 420 closely contact each other. In this case, the magnetic force generator 460 may include, for example, an electromagnet or permanent magnet that generates a magnetic force.

The vision unit 470 may be arranged within the chamber 410 and may photograph respective locations of the mask assembly 420 and the substrate 100. The vision unit 470 may photograph an alignment mark and the like of at least one of the mask assembly 420 and the substrate 100.

The pressure adjuster 480 may be connected to the chamber 410 and may adjust an internal pressure of the chamber 410. The pressure adjuster 480 may include a connection pipe 481 connected to the chamber 410, and a pump 482 provided on the connection pipe 481.

In an operation of the apparatus 400 for manufacturing a display device, the display substrate D and the mask assembly 420 may be provided into the chamber 410. In this case, the display substrate D may be a stack of the buffer layer 111 to the organic functional layer 122*e* on the substrate 100 in the order as in FIGS. 12, 13, 14, 15, and 16.

Respective locations of the display substrate D and the mask assembly 420 are photographed by the vision unit 420. Based on a result of the photographing, a location of at least one of the display substrate D and the mask assembly 420 may be adjusted, and thus the display substrate D and the mask assembly 420 may be aligned. Thereafter, the magnetic force generator 460 may make the mask assembly 420 and the display substrate D adhere to each other.

When the deposition source 450 supplies a deposition material, the deposition material may be deposited on the display substrate D through the mask assembly 420. At this time, the deposition material deposited on the display substrate D may form a main subpixel opposite electrode and an auxiliary subpixel opposite electrode. In this case, the pressure adjuster 480 may discharge internal gas from the chamber 410.

When an auxiliary subpixel opposite electrode is arranged on the display substrate D as described above, the auxiliary subpixel opposite electrode may have a line shape or a stripe shape. In this case, a plurality of auxiliary subpixel opposite electrodes may be included, and the plurality of auxiliary subpixel opposite electrodes may be spaced apart from each other and may be connected to a main subpixel opposite electrode. In this case, each auxiliary subpixel opposite electrode may extend in one direction and may be connected to the main subpixel opposite electrode.

After each opposite electrode is formed as described above, an upper layer and an encapsulation member are sequentially arranged on the opposite electrode, and thus a display device may be manufactured.

Accordingly, the apparatus 400 for manufacturing a display device is able to form the auxiliary subpixel opposite electrode in a precise pattern on the display substrate D, by the mask assembly 420 having minimal modification.

Figure 19:
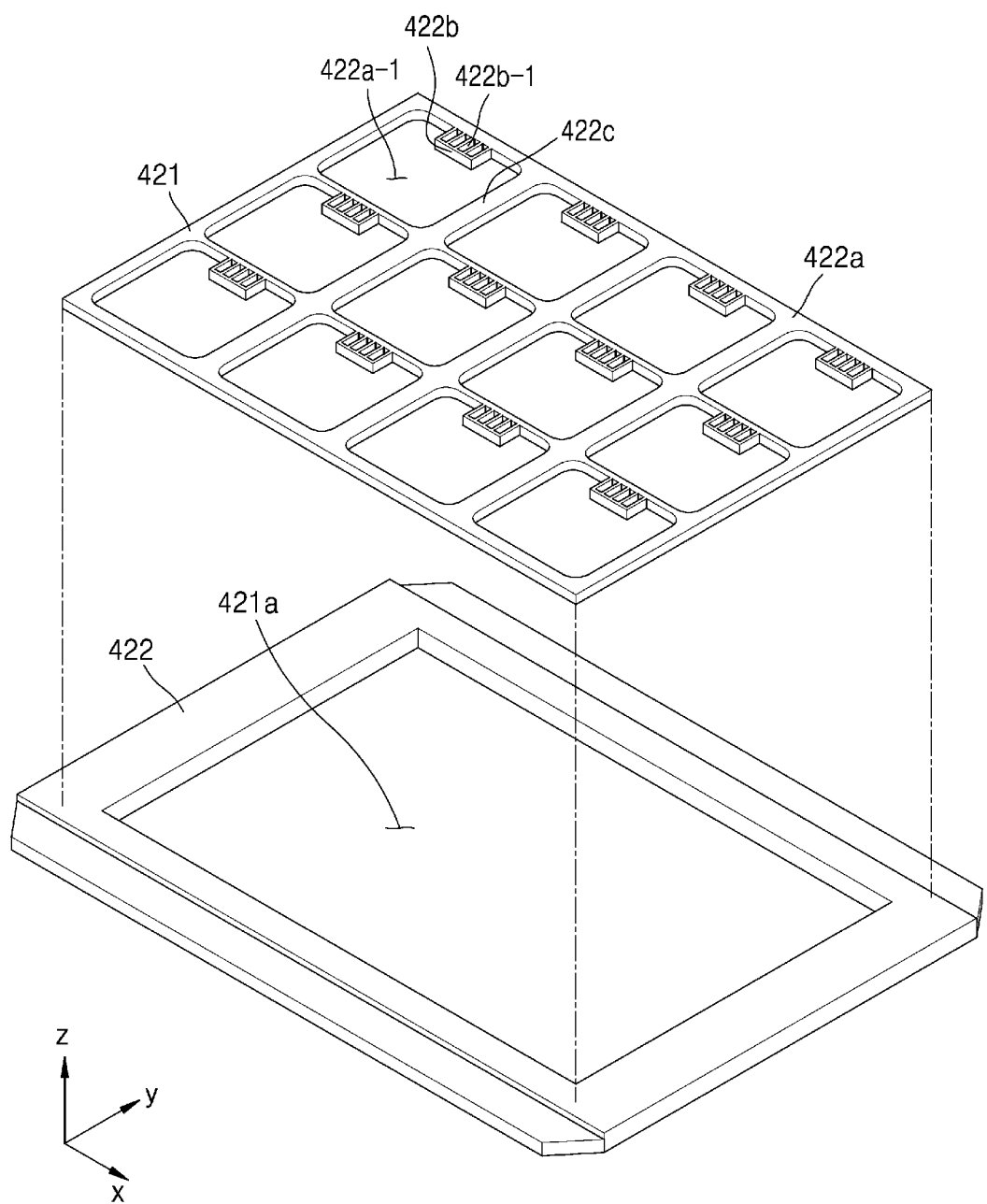
FIG. 19 is a perspective view of an exemplary embodiment of a mask assembly of the apparatus of FIG. 18.
Figure 20B:
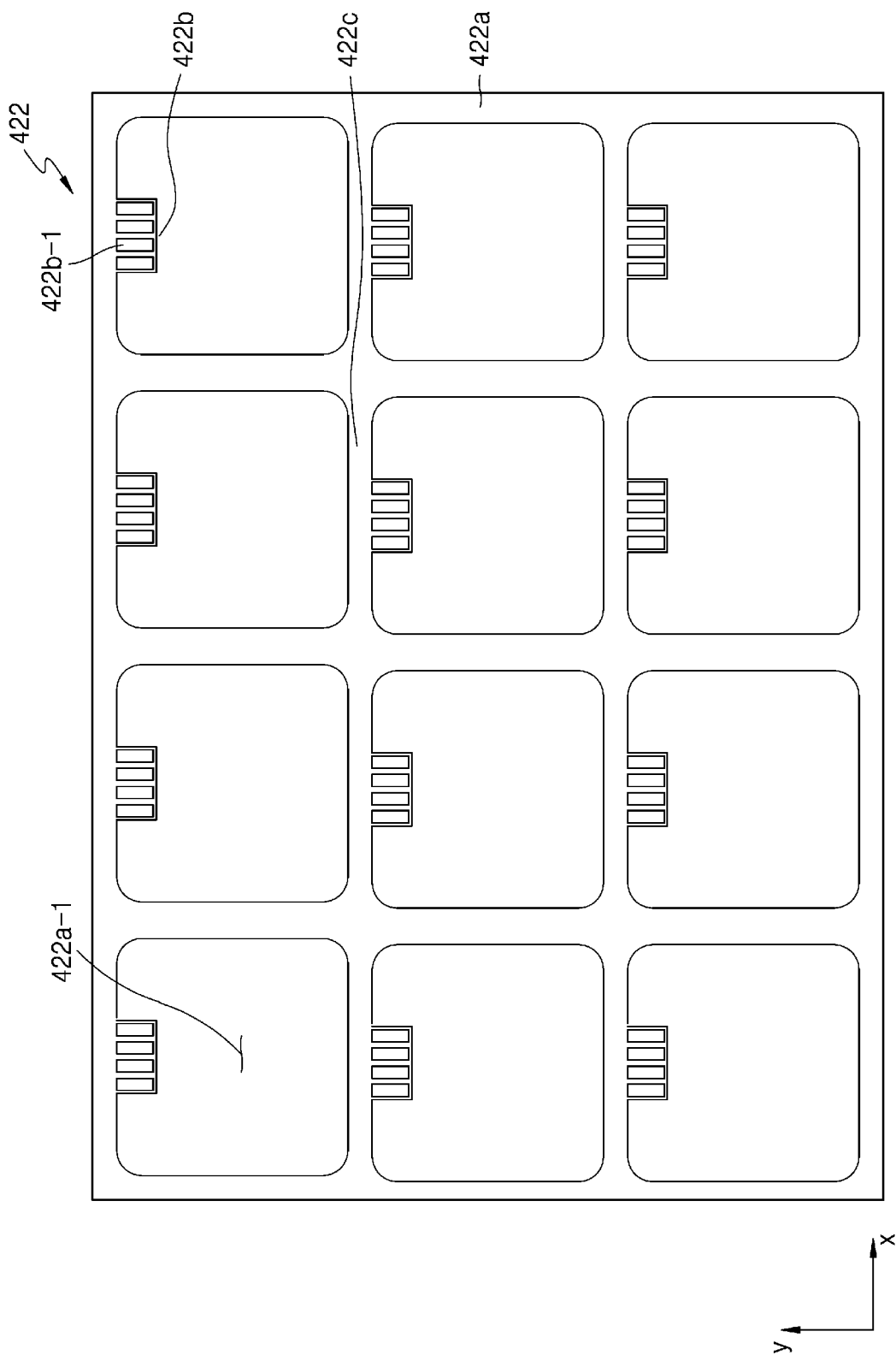
Figure 20C:
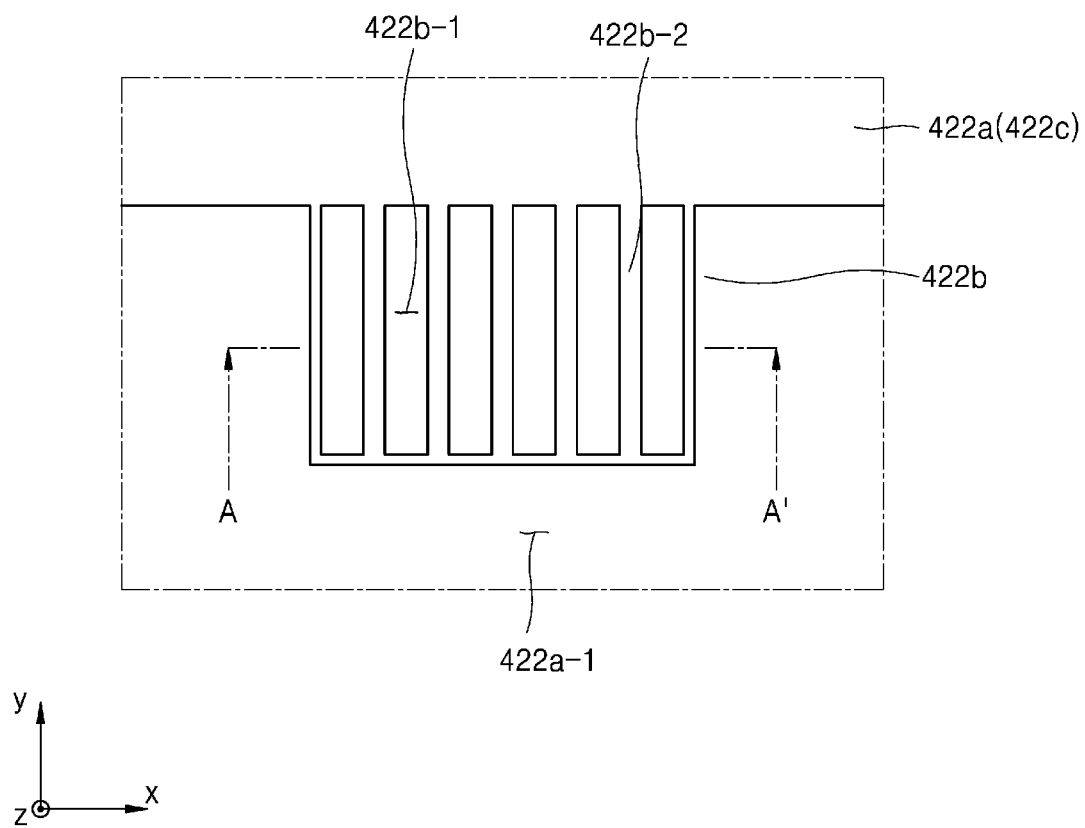
Figure 20D:
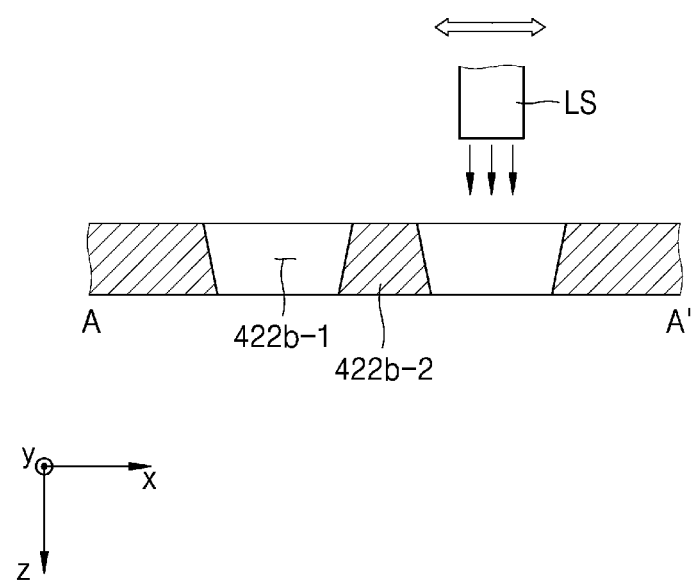
FIG. 20D is a cross-sectional view taken along line A-A' of FIG. 20C.

FIG. 19 is a perspective view of an exemplary embodiment of a mask assembly. FIGS. 20A, 20B, and 20C are plan views for describing a method of manufacturing the mask sheet 422 of FIG. 19. FIG. 20D is a cross-sectional view taken along line A-A' of FIG. 20C.

Referring to FIGS. 19, 20A, 20B, 20C, and 20D, the mask frame 421 may include, at the center thereof, a frame opening 421*a* through which a deposition material passes. The mask sheet 422 may be located on the mask frame 421, and may shield the frame opening 421*a* of the mask frame 421.

The mask sheet 422 may be located on the mask frame 421, and may include a sheet body portion 422*a* including one or more first openings 422*a*-1, and sheet shielding portions 422*b* that protrude toward the first openings 422*a*-1 and are connected to the sheet body portion 422*a*.

The sheet body portion 422*a* may have various shapes. For example, the sheet body portion 422*a* may have a shape in which one first opening 422*a*-1 is formed at the center thereof. According to another exemplary embodiment, the sheet body portion 422*a* may include a plurality of first openings 422*a*-1, and may have a shape such as a window frame. In this case, the sheet body portion 422*a* may include a sheet support rib 422*c* arranged between adjacent first openings 422*a*-1. The sheet support rib 422*c* may be between the first openings 422*a*-1, and may be connected to an outermost portion of the sheet body portion 422*a*.

Each sheet shielding portion 422*b* may include a second opening 422*b*-1 having a slit shape. In this case, a plurality of second openings 422*b*-1 may be included. Each second opening 422*b*-1 may extend in a first direction (e.g., a −y direction of FIG. 20B). The plurality of second openings 422*b*-1 may be spaced apart from each other in a second direction (e.g., an x direction of FIG. 20B).

The sheet shielding portions 422*b* may be arranged at any of various locations. For example, the sheet shielding portion 422*b* may protrude from the outermost portion of the sheet body portion 422*a* or from an outer surface of the sheet support rib 422*c*. In this case, the sheet shielding portion 422*b* may be connected to the sheet support rib 422*c* or the outermost portion of the sheet body portion 422*a*, which is arranged in the first direction or the second direction.

A width of each second opening 422*b*-1 may be greater than a gap (e.g., width) between adjacent second openings 422*b*-1. The width of the second opening 422*b*-1 and the gap (e.g., width) between adjacent second openings 422*b*-1 may be measured in the x direction, based on FIG. 20C. A sheet shielding rib 422*b*-2 may be between adjacent second openings 422*b*-1. In this case, a width of the sheet shielding rib 422*b*-2 may be smaller than that of the second opening 422*b*-1. A width of the sheet shielding rib 422*b*-2 may refer to a distance (e.g., width) between adjacent second openings 422b-1. In this case, the gap (e.g., width) between the second openings 422b-1 may be about 100 μm or less.

In a method of manufacturing the mask assembly 420, first, a base member MA having a plate shape may be prepared. Thereafter, the first openings 422a-1 may be formed by partially removing the base member MA. In this case, the first openings 422a-1 may be formed by a chemical etching method using photoresist arranged on the base member MA. The photoresist may be a positive or negative photoresist. According to another exemplary embodiment, the first openings 422a-1 may be formed by removing a portion of the base member MA by applying a laser to the base member MA.

When the first openings 422a-1 are formed in the base member MA as described above, the sheet body portion 422a, the sheet support rib 422c, and the sheet shielding portions 422b may be remained. The sheet shielding portions 422b may be arranged to protrude toward the inside of each first opening 422a-1 as described above.

When the sheet shielding portions 422b are arranged as described above, a laser radiator LS may be arranged on the sheet shielding portions 422b, and may radiate a laser by spraying the laser. In this case, the laser radiator LS may form the second openings 422b-1 on the sheet shielding portions 422b by radiating a laser onto the sheet shielding portions 422b. The second openings 422b-1 may be formed to each have a slit shape, as described above.

After the mask sheet 422 including the first openings 422a-1 and the second openings 422b-1 formed therein is stretched by a tensile force and arranged on the mask frame 421, the mask sheet 422 and the mask frame 421 may be aligned with each other. Then, the sheet body portion 422a may be brought into contact with the mask frame 421 and be fixed to the mask frame 421 by welding.

The mask assembly 420 may be used by the above-described apparatus 40 for manufacturing a display device. In this case, even when the mask assembly 420 forms a gap between adjacent second openings 422b-1 to be about 100 μm or less, the pattern of the second openings 422b-1 may be precisely formed. Moreover, even when the mask assembly 420 forms the gap between adjacent second openings 422b-1 to be about 100 μm or less, the adjacent second openings 422b-1 may be completely separated from each other, and second openings 422b-1 having accurate shapes may be formed.

When an opposite electrode is formed using the mask assembly 420, a rim portion of each sheet shielding portion 422b may be formed to be sufficiently thin, and thus an auxiliary subpixel opposite electrode formed on a display substrate through a second opening 422b-1 located at the outermost edge of the sheet shielding portion 422b may be connected to a main subpixel opposite electrode formed on the display substrate through the first opening 422a-1. In other words, when the deposition material moves from the deposition source 470 to the mask assembly 420, a portion of the deposition material may be deposited on the display substrate arranged on the back surface of the rim portion of the sheet shielding portion 422b, and thus a deposition material deposited on the display substrate through the first opening 422a-1 may be connected to a deposition material deposited on the display substrate through the second opening 422b-1. In particular, in such a case, a width of the rim portion of the sheet shielding portion 422b may be smaller than that of each sheet shielding rib 422b-2. In this case, a width of a lower rim portion of the sheet shielding portion 422b in FIG. 20C may be measured in the y direction, and respective widths of left and right rim portions of the sheet shielding portion 422b in FIG. 20C may be measured in the x direction. In particular, the width of the rim portion of the sheet shielding portion 422b may be a straight line distance from the outermost edge of the sheet shielding portion 422b to a second opening 422b-1.

Figure 21:
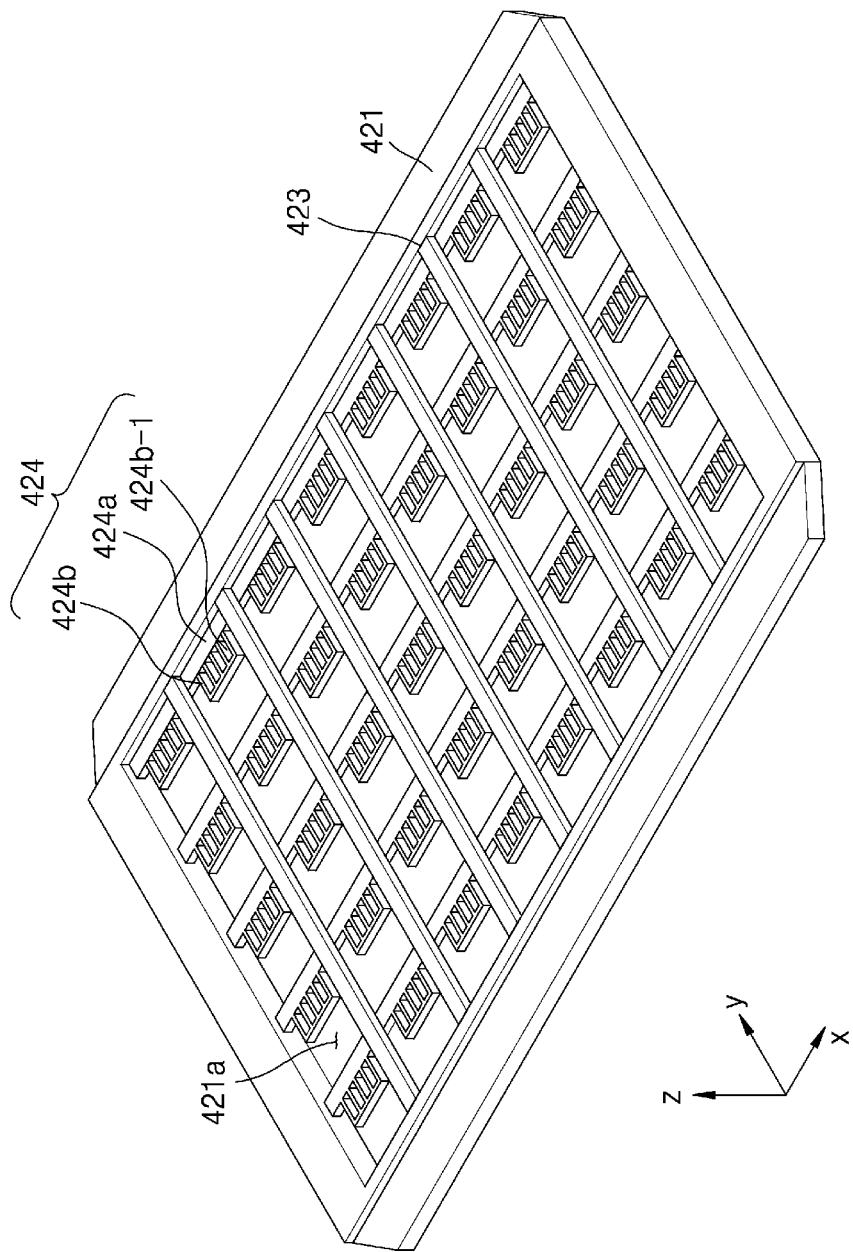
FIG. 21 is a perspective view of another exemplary embodiment of the mask assembly of the apparatus of FIG. 18.
Figure 22A:
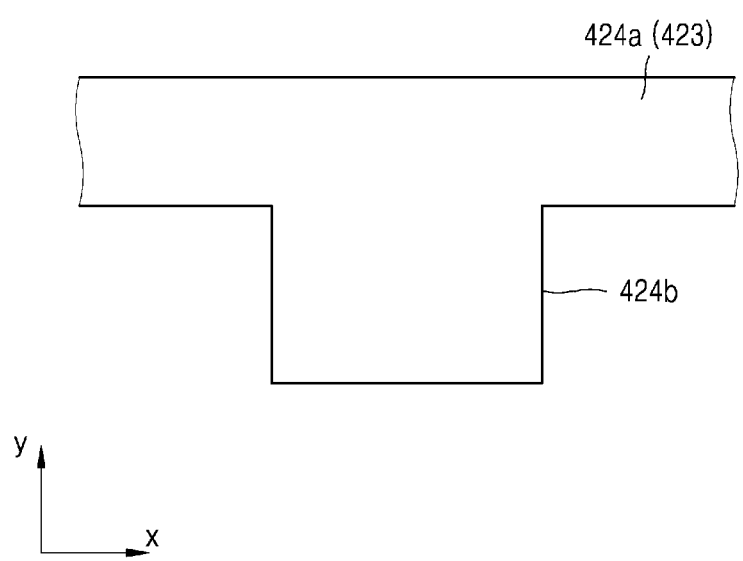
FIGS. 22A and 22B are plan views illustrating a method of manufacturing a stick of FIG. 21.
Figure 22B:
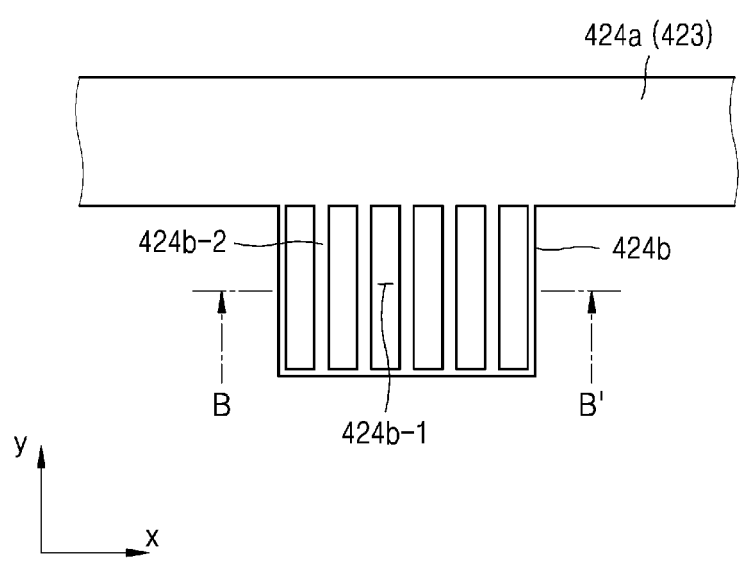
Figure 22C:
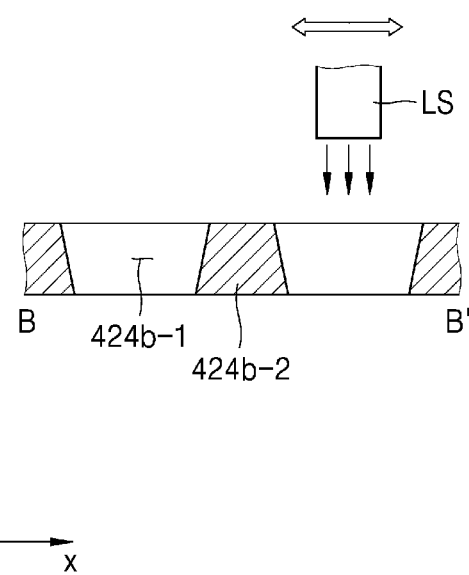
FIG. 22C is a cross-sectional view taken along line B-B' of FIG. 22B.

FIG. 21 is a perspective view of another exemplary embodiment of the mask assembly of the apparatus of FIG. 18. FIGS. 22A and 22B are plan views illustrating a method of manufacturing a stick of FIG. 21. FIG. 22C is a cross-sectional view taken along line B-B' of FIG. 22B.

Referring to FIGS. 21, 22A, 22B, and 22C, a mask assembly 420 may not include mask sheets. In detail, the mask assembly 420 may include a mask frame 421 and sticks 423 and 424.

The mask frame 421 may include a frame opening 421a at the center thereof. In this case, a hole may be formed at the center of the mask frame 421, and a plurality of frames may be connected to each other to form a closed loop.

The sticks 423 and 424 may be connected to the mask frame 421, and thus the frame opening 421a may be split into at least two portions. In this case, the sticks 423 and 424 may be arranged in the first direction and/or the second direction. In detail, the sticks 423 and 424 may be arranged in the first direction (e.g., one of the x direction or the y direction in FIG. 21). The sticks 423 and 424 may be arranged in the second direction (e.g., the other of the x direction or the y direction in FIG. 21). For example, the sticks 423 and 424 may include first sticks 424 arranged in the first direction and second sticks 423 arranged in the second direction. The first sticks 424 and the second sticks 423 may have the same shapes or similar shapes. For convenience of description, the first sticks 424 will now be focused on and described in detail.

Each first stick 424 may include a first stick body portion 424a, and a first stick shielding portion 424b protruding from the first stick body portion 424a. The first stick body portion 424a may have a plate shape and may be arranged on the mask frame 421. In this case, the first stick body portion 424a may be stretched by a tensile force and be fixed to the mask frame 421.

The first stick shielding portion 424b may protrude from the first stick body portion 424a. The first stick shielding portion 424b may protrude toward the inside of the frame opening 421a defined by adjacent first stick body portions 424a or by a first stick body portion 424a and the mask frame 421 that are adjacent to each other. The first stick shielding portion 424b may include first stick openings 424b-1. Each of the first stick openings 424b-1 may be formed to have a slit shape, similar to FIG. 20C. According to another exemplary embodiment, the first stick opening 424b-1 may have various other shapes, such as a quadrangle, a rhombus, rectangle, a square, a polygon, a circle, and an oval. However, for convenience of description, a case where each first stick opening 424b-1 has a slit shape will now be focused on and described in detail.

When each first stick opening 424b-1 has a slit shape as described above, a distance (e.g., width) between adjacent first stick openings 424b-1 may be about 100 μm or less. In particular, when the first stick opening 424b-1 has a slit shape, a first stick shielding rib 424b-2 may be arranged between adjacent first stick openings 424b-1. In this case, a width of the first stick shielding rib 424b-2 may be smaller than that of the first stick opening 424b-1. The width of the first stick shielding rib 424b-2 may be a distance (e.g., width) between adjacent first stick openings 424b-1.

In a method of manufacturing the mask assembly 420, firstly, the mask assembly 420 may be manufactured. The mask assembly 420 may be manufactured to have the frame openings 421a at the center thereof by connecting or welding a plurality of frames to each other.

Thereafter, the first sticks 424 and the second sticks 423 may be stretched by a tensile force and arranged on the mask assembly 420, and may be fixed to the mask frame 421 by welding. In this case, the first sticks 424 may be arranged in the first direction as described above, and the second sticks 423 may be arranged in the second direction such that at least two frame openings 421a may be defined.

The first sticks 424 may be manufactured in the shape of FIG. 21 and may be fixed to the mask frame 421. In detail, a member including the first stick body portion 424a and the first stick shielding portion 424b may be separated from the base member MA of FIG. 20A in a plate shape. The first stick body portion 424a and the first stick shielding portion 424b may be separated from the base member MA by pressing, chemical etching, laser cutting, or the like.

When such a process is completed, the first stick openings 424b-1 may be formed by radiating a laser to the first stick shielding portion 424b using a laser radiator LS.

When the first stick openings 424b-1 are formed using a laser as described above, the first stick openings 424b-1 having a precise shape may be formed. Due to the formation of the first stick openings 424b-1 by a laser, even when a distance (e.g., width) between adjacent first stick openings 424b-1 is formed to be about 100 μm or less, a defect such as connection of adjacent first stick openings 424b-1 may not be generated.

The second sticks 423 may be separated from the base member MA by a laser, pressing, etching, or the like. The second sticks 423 may each have a plate shape.

The shape of an opening area defined by the outer surfaces of the first sticks 424 and the second sticks 423 may be formed to correspond to the rim of the above-described main display area MDA. Alternatively, the shape of an opening area defined by the first sticks 424, the second sticks 423, and the mask frame 421 may be formed to correspond to the rim of the above-described main display area MDA.

The first stick body portion 424b may be formed in the same or similar manner as or to the sheet shielding portion 422b described above with reference to FIGS. 19, 20A, 20B, and 20C. Accordingly, when an opposite electrode is formed by depositing a deposition material on a display substrate, an auxiliary subpixel opposite electrode formed on the display substrate through the first stick opening 424b-1 may be connected to a main subpixel opposite electrode formed on a main display area.

Figure 23A:
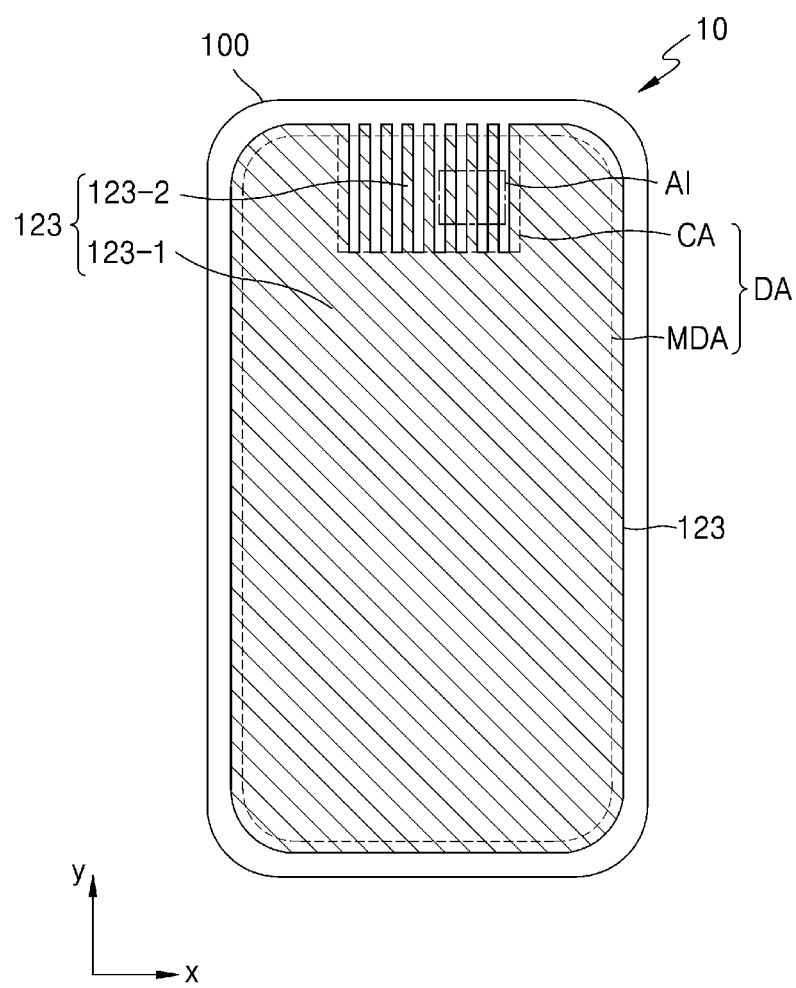
FIG. 23A is a schematic plan view illustrating a method of patterning an opposite electrode of the display device.
Figure 23B:
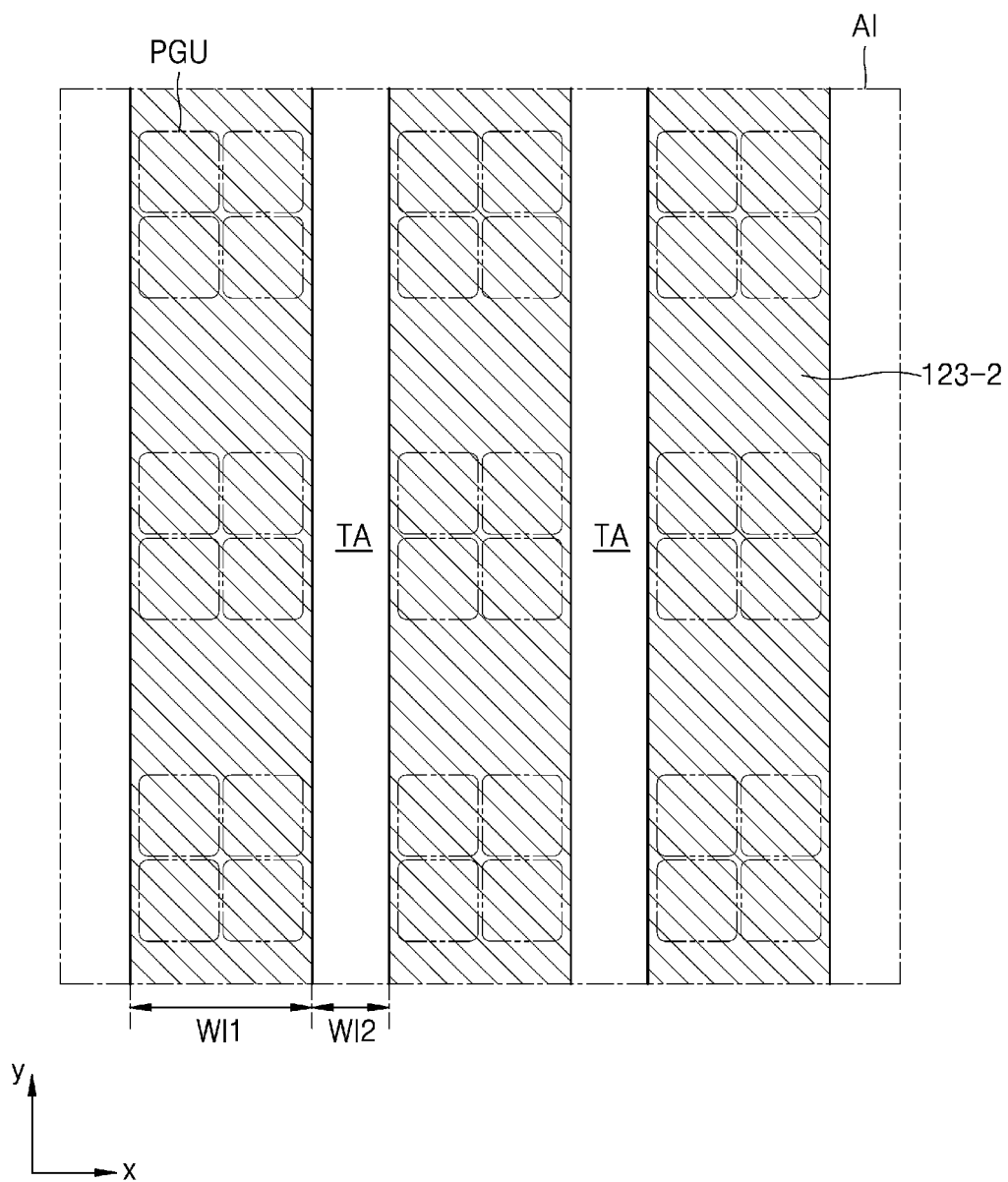
FIG. 23B is a magnified plan view of portion AI of FIG. 23A.

FIG. 23A is a schematic plan view illustrating a method of patterning an opposite electrode of the display device. FIG. 23B is a magnified plan view of a portion AI of FIG. 23A.

Referring to FIGS. 23A and 23B, the opposite electrode 123 may be formed through the mask assembly of FIG. 19 or 21. For example, the opposite electrode 123 may be formed by arranging a display substrate including layers from the substrate 100 to the organic functional layer 122e of FIGS. 12, 13, 14, 15, and 16 in the apparatus 400 of FIG. 18 for manufacturing a display device and depositing a deposition material on the display substrate. The opposite electrode 123 may be formed on the entire surface of the main display area MDA by the mask assembly 420 of FIG. 19 or the mask assembly 420 of FIG. 21, and may be formed on only a portion of the component area CA.

In detail, the opposite electrode 123 may be formed by deposition to cover the main display area MDA and cover a portion of the component area CA. At this time, the main subpixel opposite electrode 123-1 may be arranged to cover the entire surface of the main display area MDA.

A plurality of auxiliary subpixel opposite electrodes 123-2 may be arranged apart from each other in the component area CA, e.g., in the x direction. In this case, the auxiliary subpixel opposite electrodes 123-2 may be formed to each have a line shape or a stripe shape, as shown in FIG. 23A. For example, the auxiliary subpixel opposite electrodes 123-2 extend in the y direction to have a line shape or a stripe shape. The auxiliary subpixel opposite electrodes 123-2 may be arranged above adjacent auxiliary subpixels. In particular, the auxiliary subpixel opposite electrodes 123-2 may be arranged to cover the auxiliary pixel groups PGU of FIGS. 11A, 11B, and 11C. The auxiliary subpixel opposite electrodes 123-2 may not be arranged on the transmission area TA of FIGS. 11A, 11B, and 11C. At this time, the auxiliary subpixel opposite electrodes 123-2 may cover auxiliary subpixel intermediate layers of the auxiliary subpixels of the auxiliary pixel group PGU. In this case, the auxiliary subpixel opposite electrodes 123-2 may be arranged on two or more auxiliary subpixel intermediate layers. For example, auxiliary subpixel pixel electrodes of the auxiliary subpixels of the auxiliary pixel group PGU may be spaced apart from each other in the y direction, e.g., a lengthwise direction of the each auxiliary subpixel opposite electrode. The auxiliary subpixel intermediate layers may be spaced apart from each other in the y direction, e.g., in the lengthwise direction of each auxiliary subpixel opposite electrode.

The auxiliary subpixel opposite electrodes 123-2 may be arranged to cover a plurality of auxiliary pixel groups PGU. In this case, a width WI1 of each auxiliary subpixel opposite electrode 123-2 may be greater than a distance (e.g., width WI2) between adjacent auxiliary subpixel opposite electrodes 123-2. The widths WI1 and WI2 may be measured in the x direction, based on FIG. 23B.

In this case, auxiliary subpixel opposite electrodes 123-2 may not be arranged in the transmission area TA of the component area CA. The auxiliary subpixel opposite electrodes 123-2 may be arranged in a stripe configuration.

Thus, the display device may generate an auxiliary image while sufficiently having the transmission area TA in the component area CA.

Figure 24:
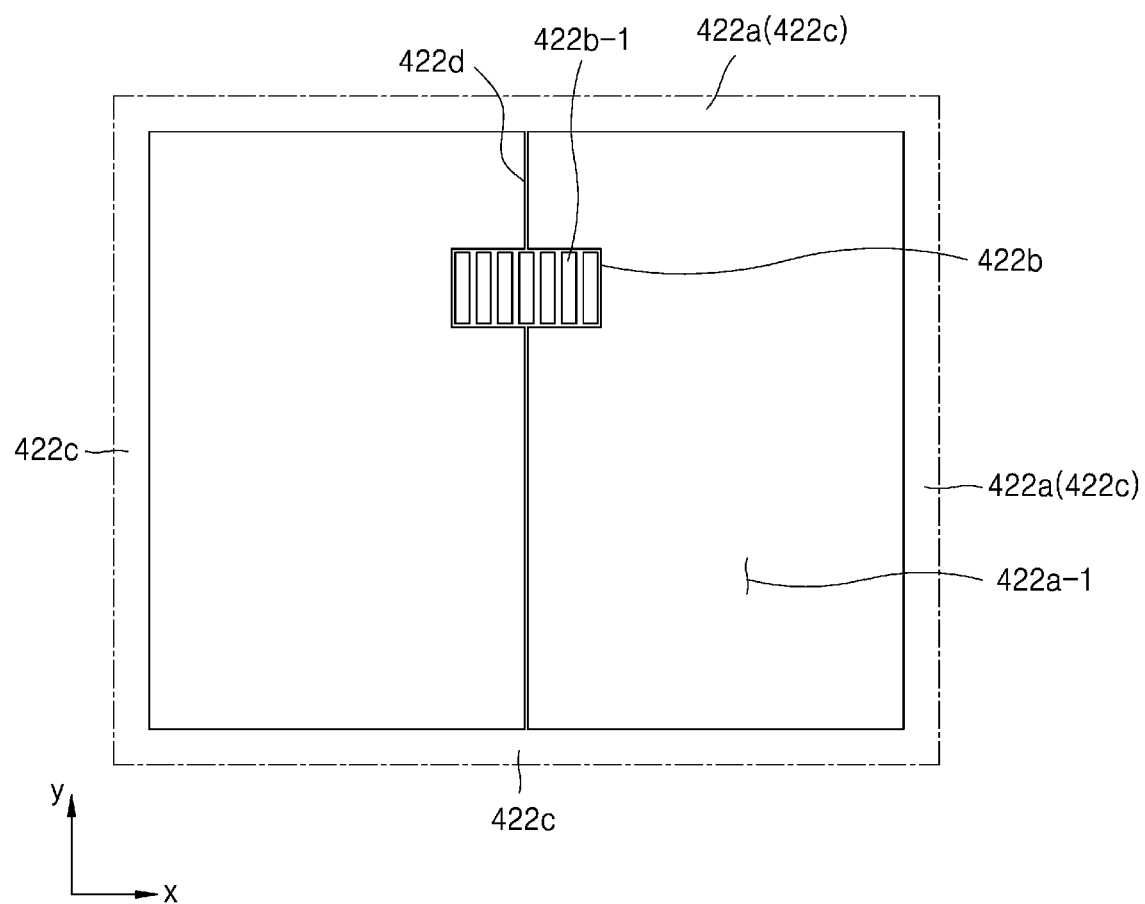
FIG. 24 is a perspective view of a sheet shielding portion of the mask assembly of FIG. 18.

FIG. 24 is a perspective view of a sheet shielding portion 422b of the mask assembly of FIG. 18.

Referring to FIG. 24, the sheet shielding portion 422b may be arranged to be completely inserted into a first opening 422a-1. In this case, the sheet shielding portion 422b may be connected to the mask sheet 422 through a special sheet connection member 422d from the rim of the first opening 422a-1. A width of the sheet connection member 422d may be smaller than a width between adjacent second openings 422b-1. In particular, the width of the sheet connection member 422d may be so small that a deposition material may be transferred to the back surface of the sheet connection member 422d when being supplied by a deposition source. In this case, the deposition material may reach a member arranged on the lower surface of the sheet connection member 422d and may be deposited thereon in a direction where the deposition material is released.

A method of manufacturing the mask sheet 422 in such a case may be similar to that described above with reference to FIGS. 20A, 20B, 20C, and 20D. In other words, while a first opening is being formed on a base member, the sheet connection member 422d and the sheet shielding portion 422b may be formed. In this case, within the first opening, the sheet connection member 422d may be arranged to connect the sheet shielding portion 422b to the sheet body portion 422a. Thereafter, second openings 422b-1 may be formed on the sheet shielding portion 422b by a laser.

Figure 25:
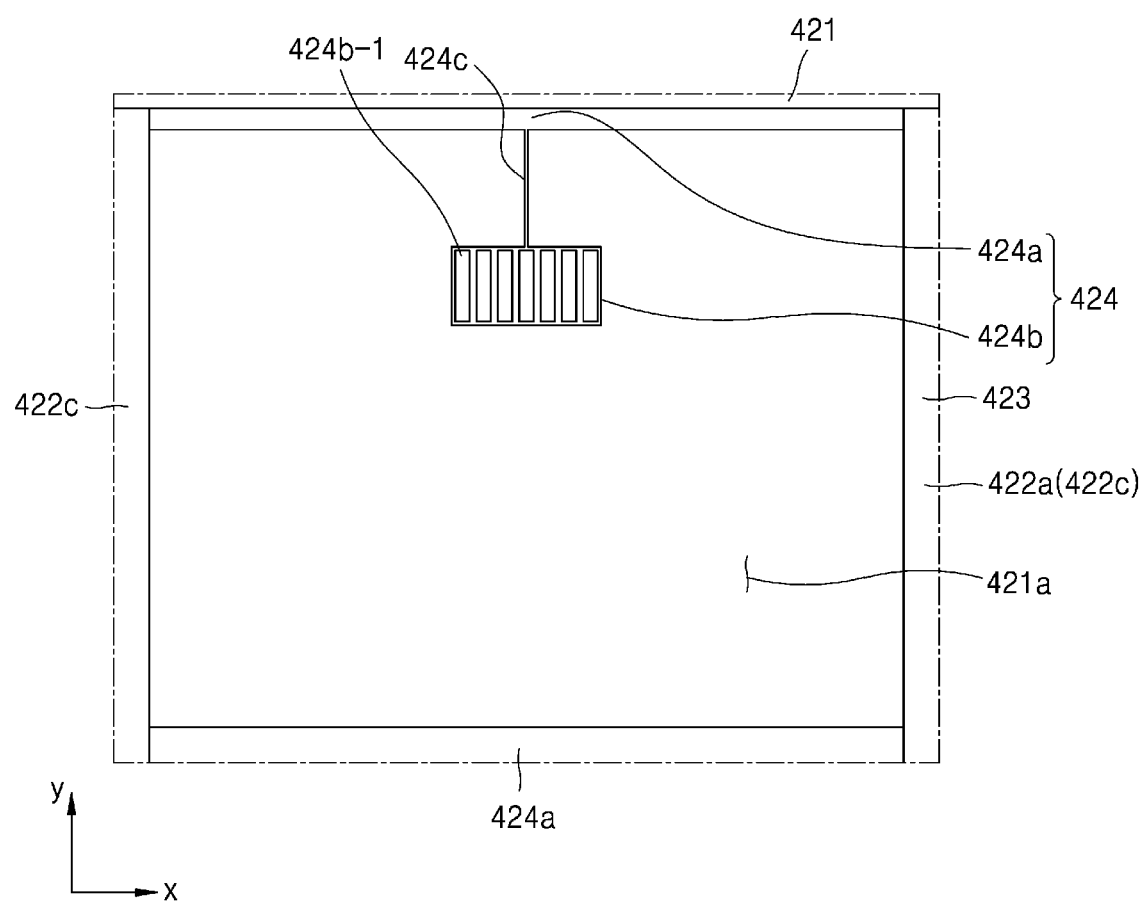
FIG. 25 is a plan view of a stick shielding portion of the mask assembly of FIG. 18.

FIG. 25 is a plan view of a stick shielding portion of the mask assembly of FIG. 18.

Referring to FIG. 25, a mask assembly may include a mask frame and sticks. The sticks may include a first stick and a second stick. A stick shielding portion may be included in the first stick and/or the second stick. However, for convenience of description, a case where the stick shielding portion is included in the first stick will now be focused on and described in detail.

A first stick shielding portion 424b may be connected to a first stick body portion 424a through a first stick connection member 424c. In this case, the first stick connection member 424c may be arranged in a cantilever shape from the first stick body portion 424a. A width (e.g., as measured in the x direction of FIG. 25) of the first stick connection member 424c may be so small that the deposition material supplied by the deposition source may move to the back surface of the first stick connection member 424c. In particular, in this case, when the deposition material supplied by the deposition source moves to the mask assembly, a portion of the deposition material not interfering with the first stick connection member 424c may move to the back surface of the first stick connection member 424c.

In this case, the first stick shielding portion 424b may be arranged within the frame opening 421a defined by the first stick shielding portion 424b, and thus a component area may be formed within a main display area.

In this case, the first stick may be manufactured in a similar manner to that described above with reference to FIGS. 22A, 22B, and 22C. For example, the first stick body portion 424a, the first stick connection member 424c, and the first stick shielding portion 424b may be separated from a base member. Thereafter, first stick openings 424b-1 may be formed in the first stick shielding portion 424b by a laser.

Figure 26:
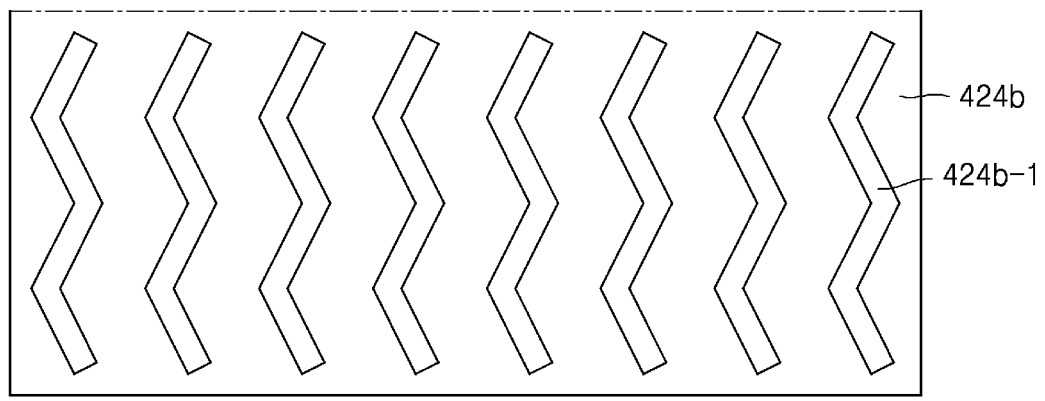
FIG. 26 is a plan view of an exemplary embodiment of a first stick shielding portion of the mask assembly of FIG. 18.

FIG. 26 is a plan view of an exemplary embodiment of a first stick shielding portion 424b of the mask assembly of FIG. 18.

Referring to FIG. 26, the first stick shielding portion 424b may include first stick openings 424b-1. Each first stick opening 424b-1 may have a serpentine shape. In this case, an auxiliary subpixel opposite electrode formed on a display substrate through the first stick openings 424b-1 may be arranged on the display substrate to have a serpentine shape. In this case, an auxiliary subpixel may be arranged in a serpentine shape. According to another exemplary embodiment, the auxiliary pixel group of FIGS. 11A, 11B, and 11C may be arranged in a serpentine shape.

The first stick opening 424b-1 may be formed by a laser, as described above.

Thus, the mask assembly is able to manufacture a display device including the component area having a precise pattern.

Figure 27:
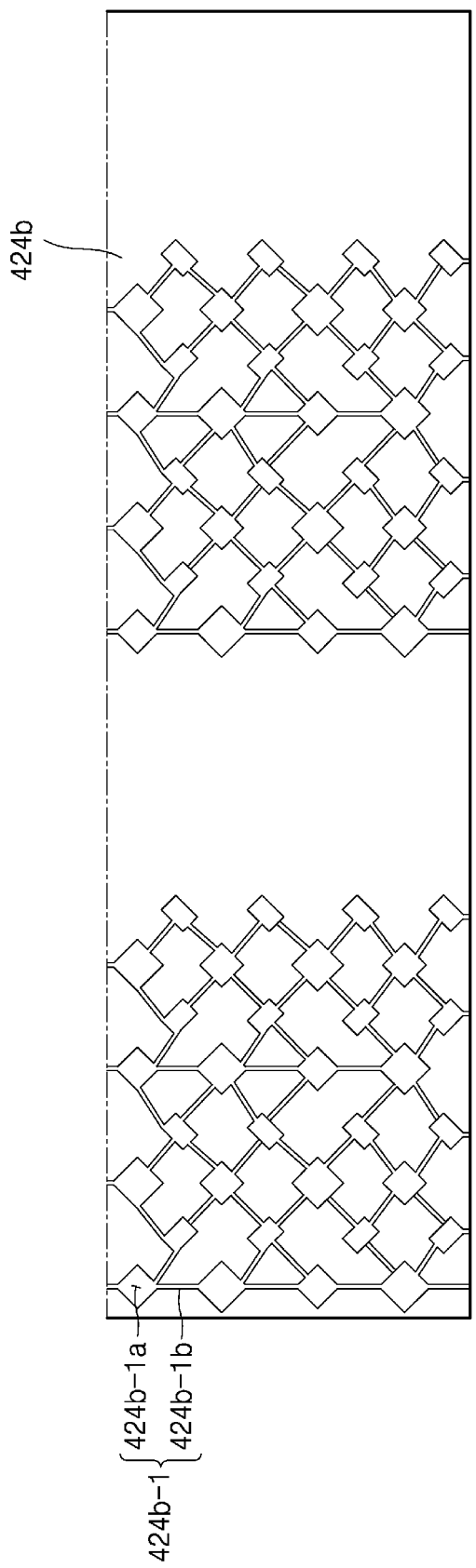
FIG. 27 is a plan view of another exemplary embodiments of the first stick shielding portion of the mask assembly of FIG. 18.

FIG. 27 is a plan view of another exemplary embodiments of the first stick shielding portion 424b of the mask assembly of FIG. 18.

Referring to FIG. 27, the first stick shielding portion 424b may include a first stick opening 424b-1. The first stick opening 424b-1 may include a first subpixel opening 424b-1a corresponding to each auxiliary subpixel, and a first connection opening 424b-1b connecting first subpixel openings 424b-1a to each other. A plurality of first subpixel openings 424b-1a may be included, and the plurality of first subpixel openings 424b-1a may correspond to the shapes of the auxiliary subpixels of FIGS. 11A and 11B. In this case, some of the plurality of first subpixel openings 424b-1a, others of the plurality of first subpixel openings 424b-1a, and the rest of the plurality of first subpixel openings 424b-1a may have different shapes and different sizes. The first connection opening 424b-1b may be arranged between the plurality of first subpixel openings 424b-1a to connect the first subpixel openings 424b-1a to each other. In this case, the first connection opening 424b-1b may be arranged between adjacent first subpixel openings 424b-1a. The first connection opening 424b-1b may be connected to a frame opening as well as connecting the first subpixel openings 424b-1a to each other.

In this case, when an auxiliary subpixel opposite electrode and a main subpixel opposite electrode are formed on a display substrate, the auxiliary subpixel opposite electrode may be arranged to correspond to a location of the auxiliary subpixels arranged in a component area, and also the auxiliary subpixel opposite electrode may be connected to the main subpixel opposite electrode.

Thus, the mask assembly is able to manufacture a display device including the component area having a precise pattern.

Display devices according to exemplary embodiments may realize high resolution. The display devices according to exemplary embodiments may display an image even on an area where an electronic component is arranged.

Mask assembles according to exemplary embodiments may form a precise pattern during deposition.

In apparatuses and methods of manufacturing a display device, according to exemplary embodiments, a display device having a precise pattern may be manufactured.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
   a substrate having a component area, a main display area, and a peripheral area, the peripheral area surrounding the component area and the main display area;
   an auxiliary pixel group disposed in the component area and comprising an auxiliary subpixel pixel electrode, an auxiliary subpixel intermediate layer, and an auxiliary subpixel opposite electrode; and
   a main pixel group disposed in the main display area and comprising a main subpixel pixel electrode, a main subpixel intermediate layer, and a main subpixel opposite electrode,
   wherein the auxiliary subpixel opposite electrode extends in the component area to have a stripe shape and is connected to the main subpixel opposite electrode in the main display area.

2. The display device of claim 1, wherein the auxiliary subpixel pixel electrode comprises a plurality of auxiliary subpixel opposite electrodes in the component area, and
   wherein the plurality of auxiliary subpixel opposite electrodes are spaced apart from each other in a first direction and extend in a second direction intersecting the first direction.

3. The display device of claim 1, wherein the auxiliary subpixel pixel electrode comprises a plurality of auxiliary subpixel pixel electrodes, and the auxiliary subpixel intermediate layer comprises a plurality of auxiliary subpixel intermediate layers, and wherein:
- the plurality of auxiliary subpixel pixel electrodes are spaced apart from each other in a lengthwise direction of the auxiliary subpixel opposite electrode, and
- the plurality of auxiliary subpixel intermediate layers are spaced apart from each other in the lengthwise direction of the auxiliary subpixel opposite electrode.

4. The display device of claim 1, wherein:
- the component area is surrounded by the main display area and the peripheral area, and
- the auxiliary subpixel opposite electrode extends in a direction from the peripheral area to the main display area.

5. The display device of claim 1, wherein:
- the component area comprises a transmission area, and
- the auxiliary subpixel opposite electrode exposes the transmission area.

6. The display device of claim 1, wherein:
- the auxiliary subpixel pixel electrode comprises a plurality of auxiliary subpixel opposite electrodes in the component area, and
- a width of each of the plurality of auxiliary subpixel opposite electrodes is greater than a gap between adjacent auxiliary subpixel opposite electrodes.

\* \* \* \* \*